US007183038B2

(12) United States Patent
Yamasaki et al.

(10) Patent No.: US 7,183,038 B2
(45) Date of Patent: Feb. 27, 2007

(54) LITHOGRAPHIC PRINTING PLATE PRECURSOR AND LITHOGRAPHIC PRINTING METHOD

(75) Inventors: Sumiaki Yamasaki, Shizuoka (JP); Naonori Makino, Shizuoka (JP); Toshifumi Inno, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/896,070

(22) Filed: Jul. 22, 2004

(65) Prior Publication Data

US 2005/0048398 A1 Mar. 3, 2005

(30) Foreign Application Priority Data

| | | | |
|---|---|---|---|
| Jul. 22, 2003 | (JP) | .......................... | P.2003-277448 |
| Jan. 5, 2004 | (JP) | .......................... | P.2004-000652 |
| Jan. 26, 2004 | (JP) | .......................... | P.2004-017599 |
| Jul. 22, 2004 | (JP) | .......................... | P.2004-214190 |

(51) Int. Cl.

| | |
|---|---|
| *G03C 1/77* | (2006.01) |
| *G03C 1/91* | (2006.01) |
| *G03F 7/028* | (2006.01) |
| *G03F 7/038* | (2006.01) |
| *G03F 7/09* | (2006.01) |

(52) U.S. Cl. .............................. 430/271.1; 430/281.1; 430/278.1; 430/302; 430/325; 430/944; 101/467; 101/456; 101/457; 101/459

(58) Field of Classification Search ............ 430/271.1, 430/270.1, 281.1, 302, 944, 278.1, 325
See application file for complete search history.

(56) References Cited

U.S. PATENT DOCUMENTS 4,612,384 A * 9/1986 Omura et al. ............... 558/198
5,262,278 A 11/1993 Lauke et al.
6,558,875 B1 * 5/2003 Toshimitsu et al. ......... 430/302
2004/0197701 A1 * 10/2004 Mitsumoto et al. ...... 430/270.1
2005/0008971 A1 1/2005 Mitsumoto et al.

FOREIGN PATENT DOCUMENTS

| | | | |
|---|---|---|---|
| EP | 0 793 145 | A1 | 3/1997 |
| EP | 0 851 299 | A1 | 7/1998 |
| EP | 1 091 251 | A2 | 4/2001 |
| EP | 1 276 013 | A2 | 1/2003 |
| EP | 1 439 423 | A2 | 7/2004 |
| EP | 1 459 888 | A2 | 9/2004 |
| EP | 1 464 486 | A2 | 10/2004 |
| EP | 1 495 866 | A2 | 1/2005 |
| JP | 10 260 536 | A | 9/1998 |
| JP | 11 030 858 | A | 2/1999 |
| JP | 2938397 | B2 | 6/1999 |
| JP | 2001-277740 | A | 10/2001 |
| JP | 2001-277742 | A | 10/2001 |
| JP | 2002-69110 | * | 3/2002 |
| JP | 2002-287334 | A | 10/2002 |
| JP | 2004-117893 | * | 4/2004 |
| WO | WO 2004/049068 | A1 | 6/2004 |

OTHER PUBLICATIONS

DERWENT abstract 2004-520187—English abstract for JP 2004-117893.*
Machine-assisted English translation for JP 2004-117893, provided by JPO.*
Machine-Assisted English translation of JP 2002-69110, provided by JPO.*

* cited by examiner

*Primary Examiner*—Sin Lee
(74) *Attorney, Agent, or Firm*—Birch Stewart Kolasch & Birch, LLP

(57) ABSTRACT

A lithographic printing plate precursor comprises an image-forming layer containing a polymerization initiator and a polymerizable compound, and a hydrophilic support,
wherein the lithographic printing plate precursor comprises a compound containing at least one functional group having an interaction with a surface of the hydrophilic support.

9 Claims, No Drawings

LITHOGRAPHIC PRINTING PLATE PRECURSOR AND LITHOGRAPHIC PRINTING METHOD

This Non-provisional application claims priority under 35 U.S.C. § 119(a) on Patent Application No(s). 2003-277448; 2004-000652; 2004-017599; 2004-214190 filed in Japan on Jul. 22, 2003; Jan. 5, 2004; Jan. 26, 2004; and Jul. 22, 2004, respectively, the entire contents of which are hereby incorporated by reference.

BACKGROUND OF THE INVENTION

1. Field of the Invention

The present invention relates to a lithographic printing plate precursor and a lithographic printing method thereof.

2. Description of the Related Art

A lithographic printing plate comprises an oleophilic image area which receives an oil-based ink at the printing step and a hydrophilic non-image area (non-ink-receptive area) which receives a fountain solution at the printing step. Lithographic printing is a printing method utilizing the repulsion between water and oil-based ink. The surface of the lithographic printing plate is made different in ink affinity from area to area. An ink is then attached to the image area alone. The ink is then transferred to printing material (e.g., paper) to effect printing.

In order to prepare lithographic printing plates, a lithographic printing plate precursor (PS plate) comprising an oleophilic photo sensitive resin layer (image-forming layer) provided on a hydrophilic support has heretofore been widely used. The lithographic printing plate precursor is exposed to light through an original (e.g., lithographic film). The image-forming layer on the non-image area is then dissolved away with an alkaline developer or organic solvent with the image-forming layer on the image area left undissolved. In this manner, the surface of the hydrophilic support is exposed to obtain a lithographic printing plate.

The related art process for the production of a lithographic printing plate precursor requires a step of dissolving the non-image area away with a developer after exposure. The recent technical assignment in the art is to eliminate or simplify a wet process which is additionally conducted as in the development step. In recent years, the disposal of waste liquid discharged from the wet process has become a great concern to the entire industry taking into account the global environment. With such an environmental problem, the demand for elimination of wet process has been growing more and more.

As a simple plate-making method there has been proposed a method called on-the-machine development, method which comprises removing the non-image area from the exposed lithographic printing plate precursor on the printing machine to obtain a lithographic printing plate. This method involves the use of an image-forming layer that allows the removal of the non-image area from the lithographic printing plate precursor at an ordinary printing step.

Specific examples of the on-the-machine development method include a method involving the use of a lithographic printing plate precursor comprising an image-forming layer capable of being dissolved or dispersed in a fountain solution, ink solvent or an emulsion of fountain solution and ink, a method involving the dynamic removal of an image-forming layer by contact with the rollers or blanket cylinder of the printing machine, and a method involving the dynamic removal of an image-forming layer by contact with the rollers or blanket cylinder of the printing machine after the reduction of the cohesive force of the image-forming layer or the adhesion between the image-forming layer and the support by the penetration of fountain solution, ink solvent, etc.

The term "development step" as used herein is meant to indicate a step of allowing the lithographic printing plate precursor to come in contact with a liquid (normally an alkaline developer) in an apparatus other than printing machine (normally an automatic developing machine) to remove the area unexposed to infrared laser beam from the lithographic printing plate precursor so that the surface of the hydrophilic support is exposed. The term "on-the-machine development" as used herein is meant to indicate a method and step of allowing the lithographic printing plate precursor to come in contact with a liquid (normally a printing ink and/or fountain solution) in a printing machine to remove the area unexposed to infrared laser beam from the lithographic printing plate precursor so that the surface of the hydrophilic support is exposed.

In recent years, on the other hand, a digitization technique involving electronic processing, storage and output of image data using computer has been widely spread. Various new image output methods that cope with this digitization technique have been put to practical use. With this technical trend, a computer-to-plate technique has been noted which comprises tracing a lithographic printing plate precursor with a highly convergent radiation such as laser beam having digitized image data carried thereon to produce a lithographic printing plate directly without lithographic film. Accordingly, one of important technical assignments is to obtain a lithographic printing plate precursor adapted for such a technique.

As a lithographic printing plate precursor capable of being exposed by tracing, one comprising a hydrophilic support and an oleophilic photosensitive resin layer which is provided on the hydrophilic support and containing a photosensitive compound capable of generating an active species such as a radical or a Brensted acid when exposed to a laser light is proposed and already introduced in the market. A nega-type lithographic printing plate is obtained by tracing such a lithographic printing plate precursor with laser using digital information to generate an active species, by the action of which a physical or chemical change is triggered in the photosensitive layer to cause insolubilization of the layer, and successively subjecting the exposed predursor to development processing. In particular, a lithographic printing plate precursor comprising a hydrophilic support, a photopolymerizable photosensitive layer provided thereon and containing a photopolymerization initiator excellent in photosensitive speed, an addition-polymerizable ethylenically unsaturated compound and an alkaline developer-soluble binder polymer, and, if necessary, an oxygen-blocking protective layer exhibits desirable printing performance since it has many advantageous features such as excellent productivity, simple development process, and preferable resolution as well as ink adhesion.

As an on-the-machine developable lithographic printing plate, Japanese Patent 2,938,397 describes a lithographic printing plate precursor comprising a hydrophilic support and an image-forming layer provided thereon and containing hydrophobic thermoplastic polymer particles dispersed in a hydrophilic binder. This Japanese Patent 2,938,397states that the above-described lithographic printing plate precursor can be on-press developed with a printing ink and/or a fountain solution after it is exposed to an infrared laser whereby an image is formed due to the thermal fusion of the hydrophobic thermoplastic polymer particles, and then mounted on a cylinder of a press machine.

The method of forming an image only by simple thermal fusion of fine particles as described above has disadvantage of insufficient printing durability due to an extremely low image strength (poor adhesion to the support) in spite of good on-press developability.

Further, a lithographic printing plate precursor comprising microcapsules having a polymerizable compound encapsulated therein incorporated in a hydrophilic support has been proposed (see, e.g., JP-A-2001-277740 and JP-A-2001-277742).

Moreover, a lithographic printing plate precursor comprising a photosensitive layer containing an infrared absorbent, a radical polymerization initiator and a polymerizable compound provided on a support has been proposed (see, e.g., JP-A-2002-287334).

Thus, the method involving the use of polymerization reaction provides an image area having a higher chemical bond density and hence a relatively higher image strength than that formed by heat fusion of polymer particles but leaves something to be desired all in on-the-machine developability, press and polymerization efficiency (sensitivity) from the practical standpoint of view and thus has not yet been practically used.

SUMMARY OF THE INVENTION

An aim of the invention is to provide a lithographic printing plate precursor capable of recording an image upon exposure to laser beam.

Another aim of the invention is to provide a lithographic printing method of recording an image on a lithographic printing plate precursor directly from digital data and a lithographic printing method developing the lithographic printing plate precursor on the printing machine without passing through a development step.

A further aim of the invention is to provide a lithographic printing method capable of giving a large number of sheets of good printed matter using a lithographic printing plate prepared with a practical amount of energy.

The invention will be further described hereinafter.

(1). A lithographic printing plate precursor comprising an image-forming layer containing a polymerization initiator and a polymerizable compound, and a hydrophilic support, wherein the lithographic printing plate precursor comprises a compound containing at least one functional group having an interaction with a surface of the hydrophilic support.

(2). The lithographic printing plate precursor according to item (1), wherein the compound containing the at least one functional group having an interaction with the surface of the hydrophilic support is one of a phosphonic acid represented by the following formula (I) and a phosphoric acid amide represented by the following formula (II):

(I)

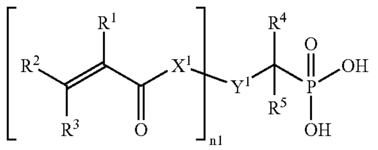

-continued (II)

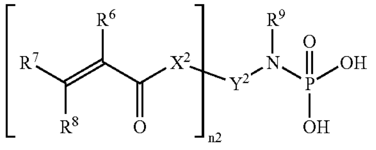

wherein $R^1$, $R^2$, $R^3$, $R^4$, $R^5$, $R^6$, $R^7$, $R^8$ and $R^9$ each independently represents a hydrogen atom, a halogen atom or an alkyl group;

$X^1$ and $X^2$ each independently represents an oxygen atom, a sulfur atom or an imino; $Y^1$ represents a connecting group having a valence of (n1+1); $Y^2$ represents a connecting group having a valence of (n2+1); and n1 and n2 each independently represents a number of 1, 2 or 3.

(3). The lithographic printing plate precursor according to item (1), wherein the compound containing the at least one functional group having an interaction with the surface of the hydrophilic support is a compound represented by the following formula (III):

(III)

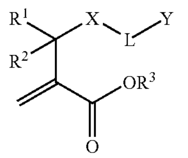

wherein $R^1$, $R^2$ and $R^3$ each independently represents a hydrogen atom, a halogen atom or an alkyl group; X represents an oxygen atom, a sulfur atom or an imino; L represents a divalent connecting group; and Y represents a support-adsorbing group.

(4). The lithographic printing plate precursor according to item (1), wherein the lithographic printing plate precursor further comprises a subbing layer between the image-forming layer and the hydrophilic support, and the subbing layer comprises the compound containing the at least one functional group having an interaction with the surface of the hydrophilic support.

(5). The lithographic printing plate precursor according to item (1), wherein the image-forming layer further contains an infrared absorbent.

(6). The lithographic printing plate precursor according to item (1), wherein the image-forming layer is capable of being removed with at least one of a printing ink and a fountain solution.

(7). The lithographic printing plate precursor according to item (1), wherein the hydrophilic support is an aluminum support.

(8). The lithographic printing plate precursor according to item (1), wherein the hydrophilic support is a silicate-treated aluminum support; the image-forming layer contains the polymerization initiator and the polymerizable compound; the lithographic printing plate precursor needs no alkaline development; and the polymerizable compound comprises a compound containing at least one functional group having an interaction with a surface of the silicate-treated aluminum support.

(9). The lithographic printing plate precursor according to item (8), wherein the polymerizable compound is encapsulated in a microcapsule.

(10). The lithographic printing plate precursor according to item (8), wherein the polymerizable compound has at least two polymerizable groups in a molecule.

(11). A printing method which comprises the steps of:

mounting on a printing machine a lithographic printing plate precursor comprising: an image-forming layer containing a polymerization initiator and a polymerizable compound; and a hydrophilic support, the printing plate precursor comprising a compound which contains at least one functional group having an interaction with a surface of the hydrophilic support, and performing an imagewise exposure on the mounted lithographic printing plate precursor with a laser, or performing an imagewise exposure on the lithographic printing plate precursor with a laser, and mounting the exposed lithographic printing plate precursor on the printing machine;

supplying at least one of a printing ink and a fountain solution to the lithographic printing plate precursor;

removing an unexposed area of the image-forming layer with the one of the printing ink and the fountain solution; and printing.

(12). The lithographic printing method according to item (11), wherein the compound containing the at least one functional group having an interaction with the surface of the hydrophilic support is one of a phosphonic acid represented by the following formula (I) and a phosphoric acid amide represented by the following formula (II):

(I)

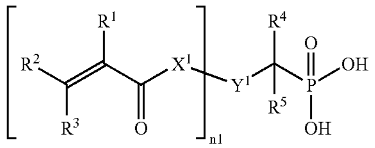

(II)

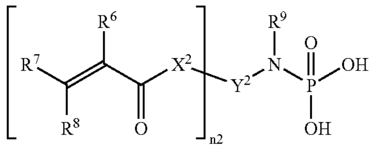

wherein $R^1$, $R^2$, $R^3$, $R^4$, $R^5$, $R^6$, $R^7$, $R^8$ and $R^9$ each independently represents a hydrogen atom, a halogen atom or an alkyl group;

$X^1$ and $X^2$ each independently represents an oxygen atom, a sulfur atom or an imino; $Y^1$ represents a connecting group having a valence of (n1+1); $Y^2$ represents a connecting group having a valence of (n2+1); and n1 and n2 each independently represents a number of 1, 2 or 3.

(13). The lithographic printing method according to item (11), wherein the compound containing the at least one functional group having an interaction with the surface of the hydrophilic support is a compound represented by the following formula (III):

(III)

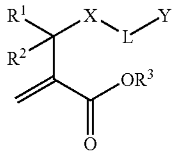

wherein $R^1$, $R^2$ and $R^3$ each independently represents a hydrogen atom, a halogen atom or an alkyl group; X represents an oxygen atom, a sulfur atom or an imino; L represents a divalent connecting group; and Y represents a support-adsorbing group.

(14). The lithographic printing method according to item (11), wherein the lithographic support further comprises a subbing layer between the image-forming layer and the hydrophilic support, and the subbing layer comprises the compound containing the at least one functional group having an interaction with the surface of the hydrophilic support.

In accordance with the invention, the image-forming layer or an optionally provided layer comprises a compound containing at least one functional group having an interaction with the surface of the hydrophilic support, making it possible to provide a large number of sheets of good printed matters using a lithographic printing plate prepared by a practical amount of energy.

For example, a phosphonic acid represented by the foregoing formula (I) or a phosphoric acid amide represented by the foregoing formula (II) has an ethylenically unsaturated polymerizable group and thus hardens together with a polymerizable compound. The phosphonic acid group or phosphoric acid amide group has an affinity for the hydrophilic group in the hydrophilic support. The printing plate prepared from the lithographic printing plate precursor of the invention comes in close contact with the hydrophilic support at the hardened area thereof and thus exhibits an excellent press life.

The compound represented by the foregoing formula (III) has an ethylenically unsaturated polymerizable group and thus hardens together with a polymerizable compound. The compound represented by the formula (III) has a group capable of adsorbing a hydrophilic support. The printing plate prepared from the lithographic printing plate precursor of the invention comes in close contact with the hydrophilic support at the hardened area thereof and thus exhibits an excellent press life.

JP-A-11-30858 proposes a phosphoric acid ester as an additive for lithographic printing plate precursor. However, the phosphonic acid represented by the formula (I) or the phosphoric acid amide represented by the formula (II) is characterized by a better storage stability than phosphoric acid ester. Further, the phosphoric acid ester differs from the compound represented by the formula (III) in the form of connection of phosphoric acid ester group to polymerizable group Moreover, JP-A-10-260536 discloses a reactive undercoating agent capable of adsorbing support, but examples of the undercoating agent don't include the compound represented by the formula (III) Further, JP-A-2002-264554 discloses a microcapsuled on-the-machine printing plate containing an α-methacrylate structure monomer, but this α-methacrylate structure monomer has no group capable of adsorbing support.

DETAILED DESCRIPTION OF THE INVENTION

The invention is characterized in that the image-forming layer or an optionally provided layer comprises a compound containing at least one functional group having an interaction with the surface of the hydrophilic support. Such a compound will be further described with reference to the phosphonic acid represented by the formula (I) or the phosphoric acid amide represented by the formula (II) and the compound represented by the formula (III) by way of example.

The term "interaction" as used herein is meant an interaction such as covalent bond, hydrogen bond, polar-interaction, and van der Waals binding, between a polymerizable compound contained in an image-forming layer and $Al^{3+}$, Si—OH, S—$O^-$ and the like, which is provided on the surface of a hydrophilic support, specifically an aluminum support or a silicate-treated aluminum support.

[Phosphonic Acid and Phosphoric Acid Amide]

In a preferred embodiment of the lithographic printing plate precursor of the invention, the image-forming layer or an optionally provided layer comprises a phosphonic acid represented by the following formula (I) or a phosphoric acid amide represented by the following formula (II):

(I)

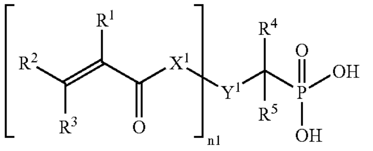

In the formula (I), $R^1$, $R^2$, $R^3$, $R^4$ and $R^5$ each independently represents a hydrogen atom, halogen atom or alkyl group. $R^1$, $R^2$, $R^3$, $R^4$ and $R^5$ preferably each independently represents a hydrogen atom or alkyl group, more preferably a hydrogen atom or an alkyl group having from 1 to 6 carbon atoms, most preferably a hydrogen atom or methyl. It is particularly preferred that $R^2$, $R^3$, $R^4$ and $R^5$ each are a hydrogen atom.

In the formula (I), $X^1$ represents an oxygen atom (—O—), sulfur atom (—O—) or imino (—NH—). $X^1$ is preferably an oxygen atom or imino, more preferably an oxygen atom.

In the formula (I), $Y^1$ represents a connecting group having a valence of (n1+1) (divalent, trivalent or tetravalent). In the formula (I), n1 represents a number of 1, 2 or 3.

$Y^1$ preferably represents a divalent to tetravalent aliphatic group, divalent to tetravalent aromatic group or divalent to tetravalent heterocyclic group optionally combined with an oxygen atom (—O—), sulfur atom (—S—), imino (—NH—) or carbonyl (—CO—).

The aliphatic group may have an annular structure or branched structure. The number of carbon atoms in the aliphatic group is preferably from 1 to 20, more preferably from 1 to 15, most preferably from 1 to 10. The aliphatic group is preferably saturated to unsaturated. The aliphatic group may have substituents. Examples of these substituents include halogen atom, hydroxyl, aromatic group, and heterocyclic group.

The number of carbon atoms in the aromatic group is preferably from 6 to 20, more preferably from 6 to 15, most preferably from 6 to 10. The aromatic group may have substituents. Examples of these substituents include halogen atom, hydroxyl, aliphatic group, aromatic group, and heterocyclic group.

The heterocyclic group preferably has a 5- or 6-membered ring as a heterocyclic ring. The heterocyclic ring may be condensed with other heterocyclic rings, aliphatic rings or aromatic rings. The heterocyclic group may have substituents. Examples of these substituents include halogen atom, hydroxyl, oxo (═O), thio (═S), imino (═NH, ═N—R in which R represents an aliphatic group, aromatic group or heterocyclic group), aliphatic group, aromatic group, and heterocyclic group.

(II)

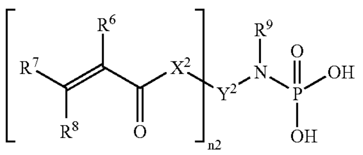

In the formula (II), $R^6$, $R^7$, $R^8$ and $R^9$ each independently represent a hydrogen atom, halogen atom or alkyl group. $R^6$, $R^7$, $R^8$ and $R^9$ preferably each independently are a hydrogen atom or alkyl group, more preferably a hydrogen atom or an alkyl group having from 1 to 6 carbon atoms, most preferably a hydrogen atom or methyl. It is particularly preferred that $R^7$, $R^8$ and $R^9$ each be a hydrogen atom.

In the formula (II), $X^2$ is an oxygen atom (—O—), sulfur atom (—S—) or imino (—NH—). $X^2$ is preferably an oxygen atom or imino, more preferably an oxygen atom.

In the formula (II), $Y^2$ is a connecting group having a valence of (n2+1) (divalent, trivalent or tetravalent). In the formula (II), n2 is a number of 1, 2 or 3.

The details and examples of $Y^2$ are the same as those described with reference to $Y^1$.

Examples of the phosphonic acid represented by the formula (I) and the phosphoric acid amide represented by the formula (II) will be given below.

(1)

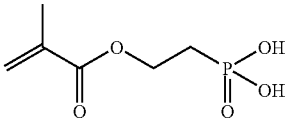

(2)

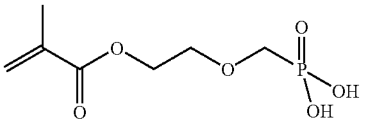

(3)

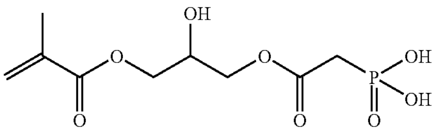

-continued
(4)
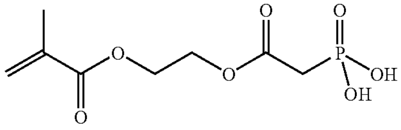
(5)
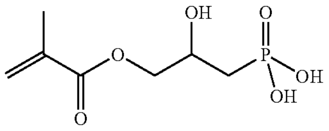
(6)
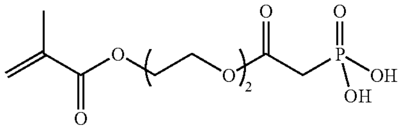
(7)
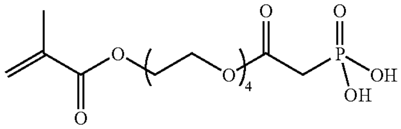
(8)
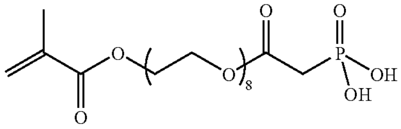
(9)
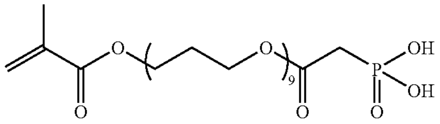
(10)
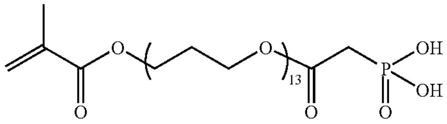
(11)
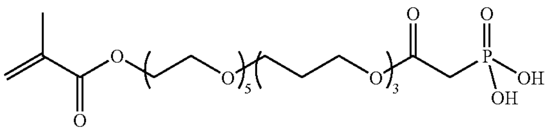
(12)
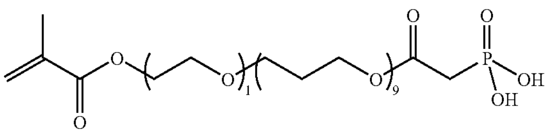
(13)
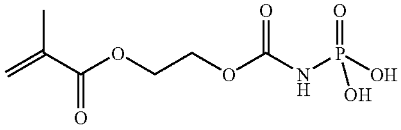
(14)
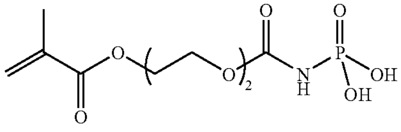
-continued
(15)
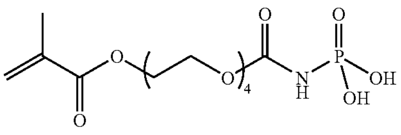
(16)
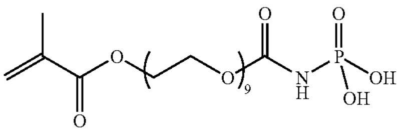
(17)
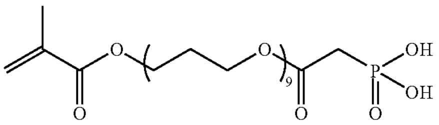
(18)
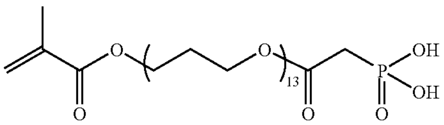
(19)
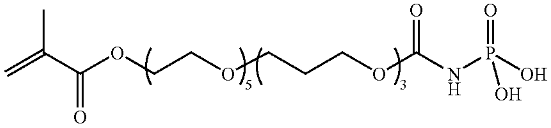
(20)
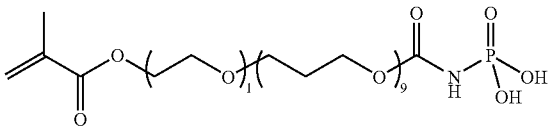
(21)
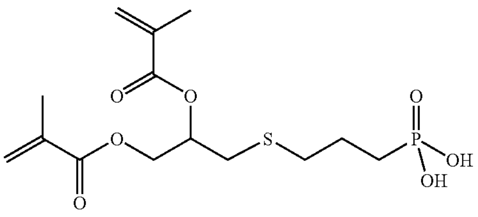
(22)
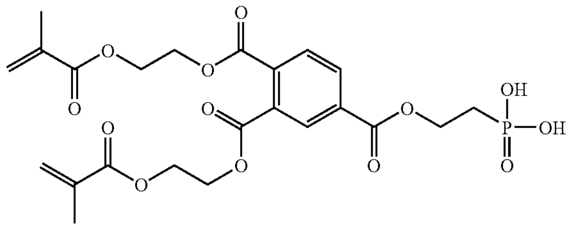

-continued
(23)
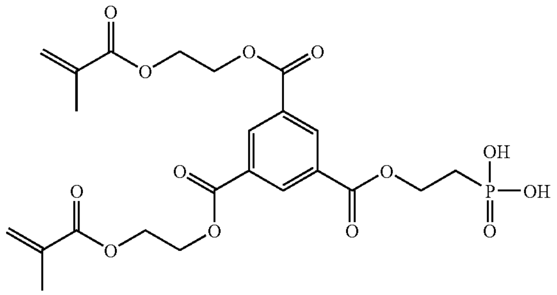
(24)
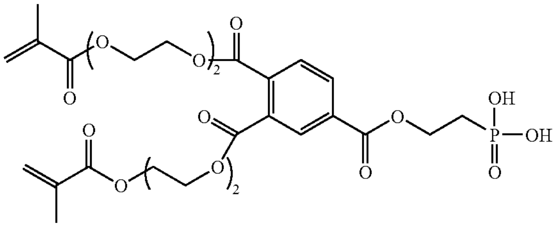
(25)
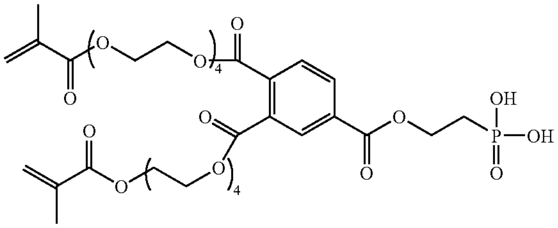
(26)
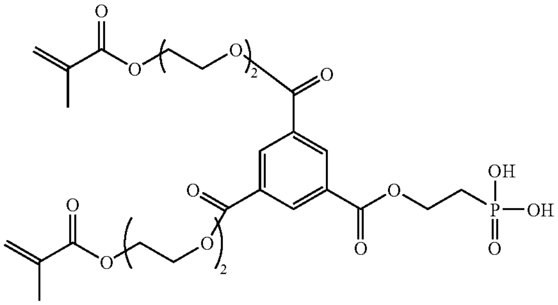
(27)
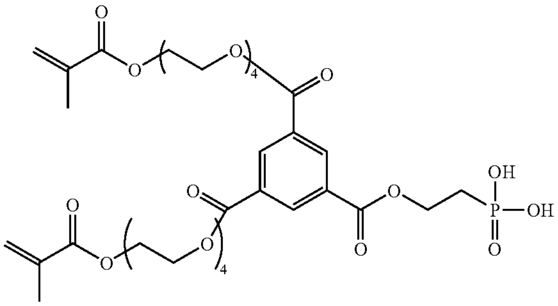
(28)
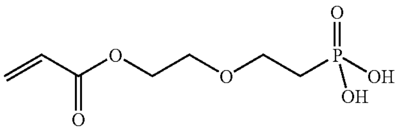
-continued
(29)
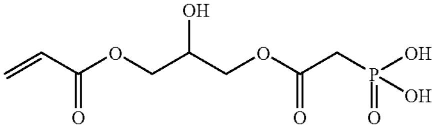
(30)
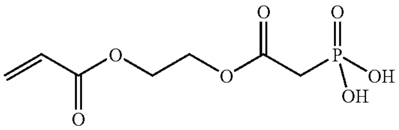
(31)
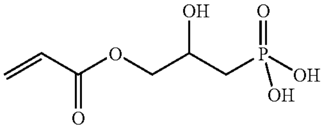
(32)
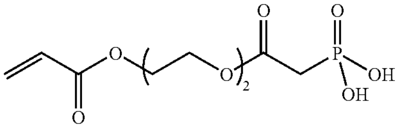
(33)
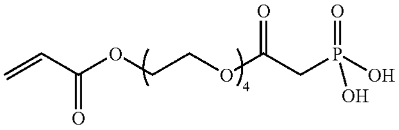
(34)
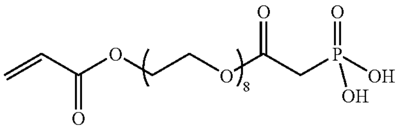
(35)
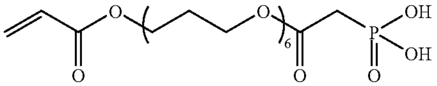
(36)
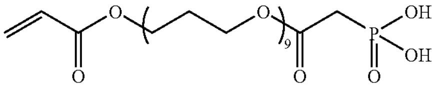
(37)
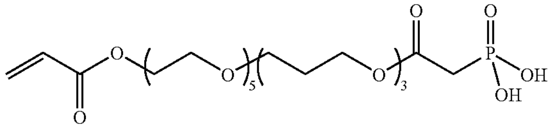
(38)
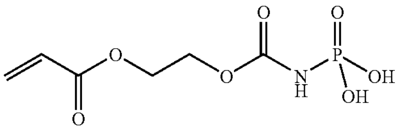
(39)
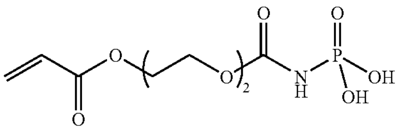
(40)
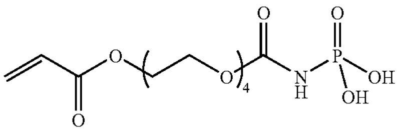

-continued (41)

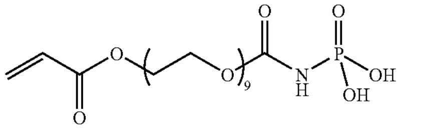

(42)

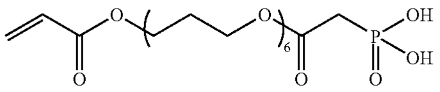

(43)

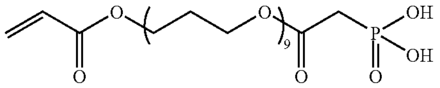

(44)

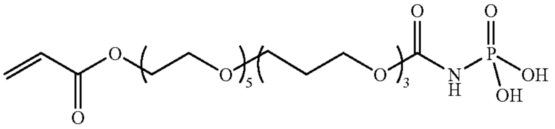

(45)

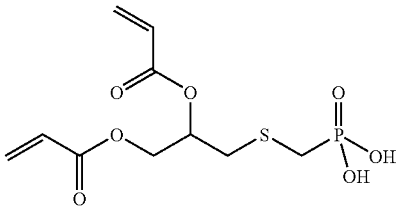

(46)

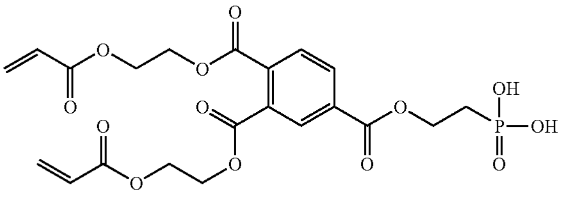

(47)

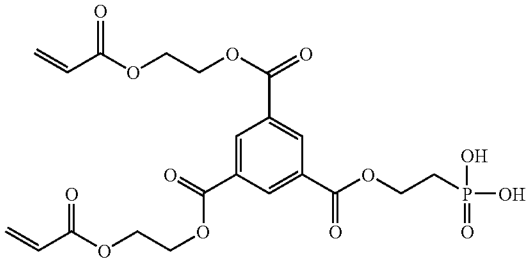

(48)

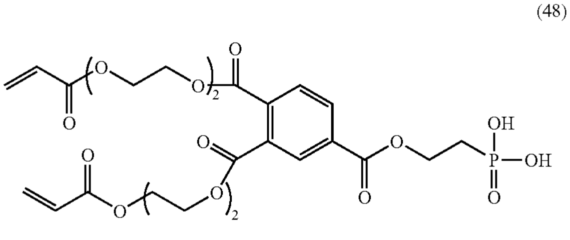

-continued (49)

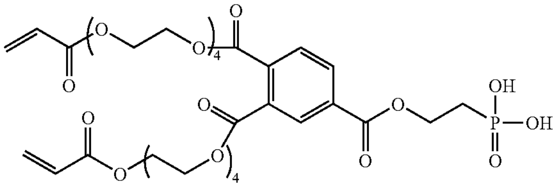

(50)

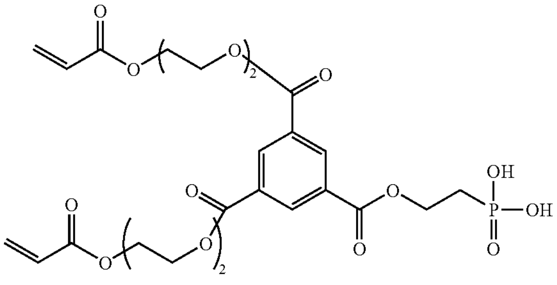

(51)

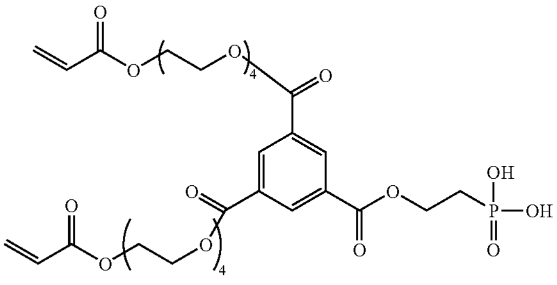

Two or more phosphonic acids or phosphoric acid amides may be used in combination.

[Compound Represented by the Formula (III)]

In a preferred embodiment of the lithographic printing plate precursor of the invention, the image-forming layer or optionally provided layer comprises a compound represented by the following formula (III):

(III)

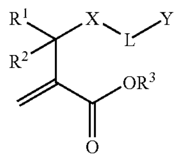

In the formula (III), $R^1$, $R^2$ and $R^3$ each independently is a hydrogen atom, halogen atom or alkyl group. $R^1$, $R^2$ and $R^3$ preferably each independently is a hydrogen atom or alkyl group, more preferably a hydrogen atom or an alkyl group having from 1 to 6 carbon atoms, most preferably a hydrogen atom or methyl.

In the formula (III), X is an oxygen atom (—O—), sulfur atom (—S—) or imino (—NH—). X is preferably an oxygen atom or imino, more preferably an oxygen atom.

In the formula (III), L is a divalent connecting group. L is preferably a divalent aliphatic group, divalent aromatic group, divalent heterocyclic group or a combination thereof with an oxygen atom (—O—), sulfur atom (—S—), imino (—NH—) or carbonyl (—CO—).

The aliphatic group may have an annular structure or branched structure. The number of carbon atoms in the aliphatic group is preferably from 1 to 20, more preferably from 1 to 15, most preferably from 1 to 10. The aliphatic group is preferably saturated to unsaturated. The aliphatic group may have substituents. Examples of these substituents include halogen atom, hydroxyl, aromatic group, and heterocyclic group.

The number of carbon atoms in the aromatic group is preferably from 6 to 20, more preferably from 6 to 15, most preferably from 6 to 10. The aromatic group may have substituents. Examples of these substituents include halogen atom, hydroxyl, aliphatic group, aromatic group, and heterocyclic group.

The heterocyclic group preferably has a 5- or 6-membered ring as a heterocyclic ring. The heterocyclic ring may be condensed with other heterocyclic rings, aliphatic rings or aromatic rings. The heterocyclic ring may have substituents. Examples of these substituents include halogen atom, hydroxyl, oxo (═O), thio (═S), imino (═NH, ═N—R in which R represents an aliphatic group, aromatic group or heterocyclic group), aliphatic group, aromatic group, and heterocyclic group.

L is preferably an alkylene oxy group or polyalkylene oxy group, more preferably a polyethylene oxy group or polypropylene oxy group, most preferably a polyethylene oxy group. The number of repetition of alkylene oxy units in the polyalkylene oxy group is preferably from 2 to 20, more preferably from 2 to 10.

In the formula (III), Y is a support-adsorbing group.

The support-adsorbing group is a group that undergoes connection to metal, metal oxide, hydroxyl group or other groups present in a anodized or hydrophilicized support by ionic bonding, hydrogen bonding, coordinate bonding or intermolecular bonding. The support-adsorbing group preferably has an acid group or onium group in its molecule. As the acid group, a group having an acid dissociation constant (pKa) of 7 or less is desirable. Specific examples of such a group include phenolic hydroxyl group, carboxyl group, $—SO_3H$, $—OSO_3H$, $—PO_3H_2$, $—OPO_3H_2$, $—CONHSO_2—$, $—SO_2NHSO_2—$, and $—COCH_2COCH_3$. Particularly preferred among these acid groups are $—OPO_3H_2$ and $—PO_3H_2$. The onium group is preferably an onium group formed by atoms belonging to the group 5B (group 15) or 6B (group 16) in the periodic table, more preferably an onium group formed by nitrogen atom, phosphor atom or sulfur atom, particularly an onium group formed by nitrogen atom.

Examples of the compound represented by the formula (III) will be given below.

(1)

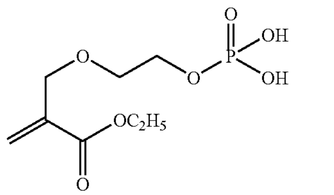

(2)

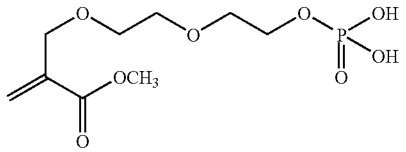

(3)

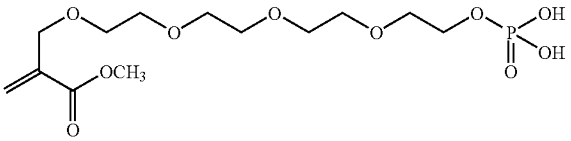

(4)

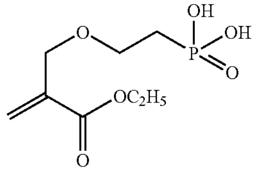

(5)

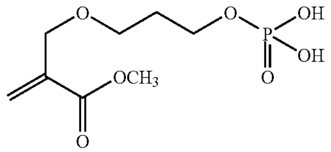

(6)

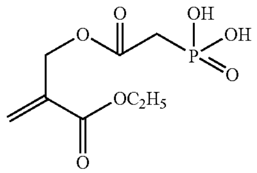

(7)

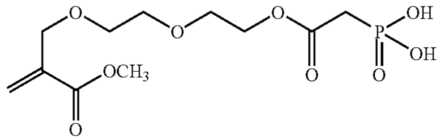

(8)

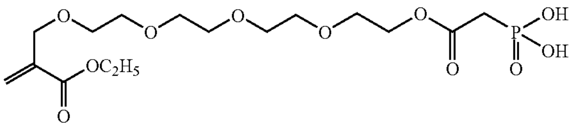

(9)

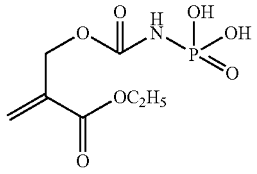

-continued (10)

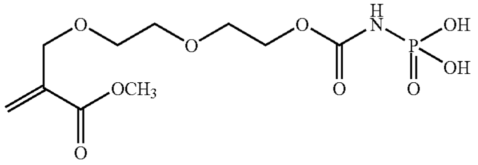

(11)

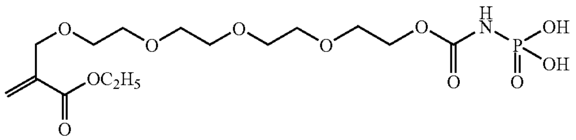

(12)

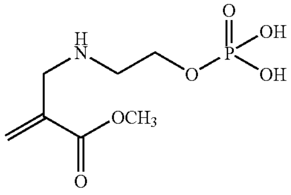

(13)

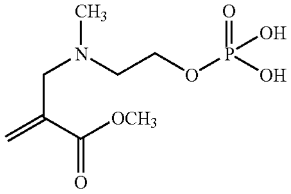

(14)

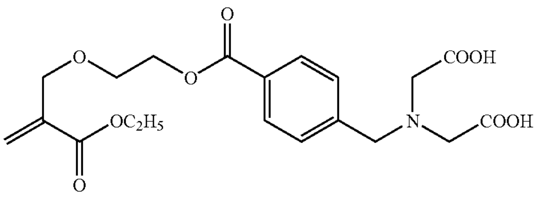

(15)

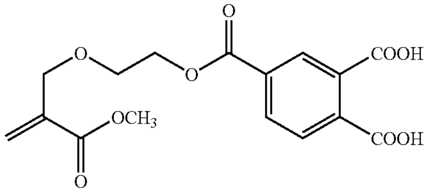

(16)

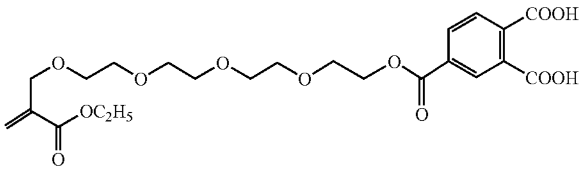

(17)

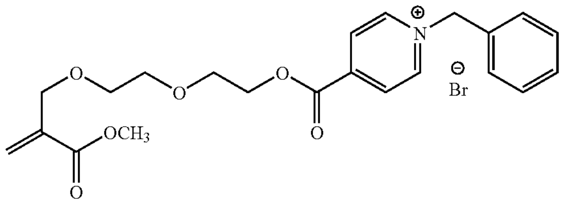

-continued (18)

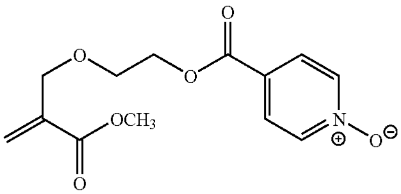

(19)

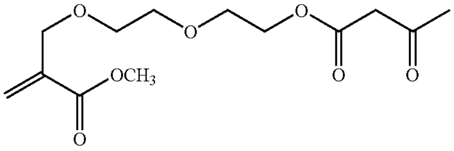

(20)

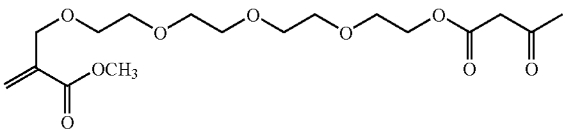

(21)

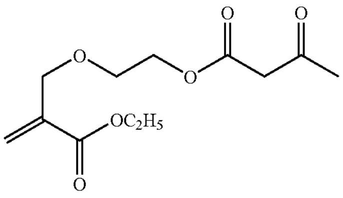

(22)

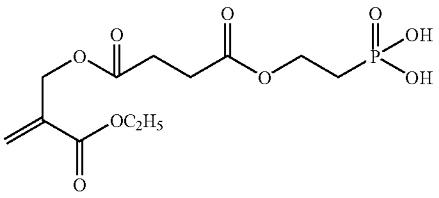

Two or more of the compounds represented by the formula (III) may be used in combination.

The lithographic printing plate precursor preferably comprises any of the compounds represented by the formulae (I) to (III) incorporated in the image-forming layer or optionally provided layer. The layer comprising these compounds incorporated therein is preferably a layer provided interposed between the image-forming layer and the hydrophilic support, more preferably a subbing layer.

The compounds represented by the formulae (I) to (III) are preferably used in an amount of from 0.01 to 100% by weight, more preferably from 0.1 to 50% by weight based on the weight of the polymerizable compound.

[Infrared Absorbent]

In the case where the lithographic printing plate precursor of the present invention is performed an imagewise exposure with laser beam from a laser which emits infrared rays having a wavelength of, such as from 760 nm to 1,200 nm as a light source to from an image, it is preferred that an image forming layer contains an infrared absorbent therein. An infrared absorbent acts to convert infrared rays absorbed to heat. The heat thus generated causes a polymerization initiator (radical generator) described later to undergo ther mal decomposition resulting in the generation of radicals. As the infrared absorbent, a dye or pigment having an absorption maximum in a wavelength range of from 760 nm to 1,200 nm may be used.

As the dye as used herein as infrared absorbent, there may be used any of commercially available dyes such as known dyes described in references such as "Senryo Binran (Handbook of Dyes)", compiled by the Society of Synthetic Organic Chemistry, Japan, 1970. Specific examples of these dyes include azo dyes, metal complex azo dyes, pyrazolones azo dyes, naphthoquinone dyes, anthraquinone dyes, phthalocyanine dyes, carbonium dyes, quinonimine dyes, methine dyes, cyanine dyes, squarilium dyes, pyrilium salts, and metal thiolate complexes.

Preferred examples of these dyes include cyanine dyes as disclosed in JP-A-58-125246, JP-A-59-84356 and JP-A-60-78787, methine dyes as disclosed in JP-A-58-173696, JP-A-58-181690 and JP-A-58-194595, naphthoquinone dyes as disclosed in JP-A-58-112793, JP-A-58-224793, JP-A-59-48187, JP-A-59-73996, JP-A-60-52940 and JP-A-60-63744, squarilium dyes as disclosed in JP-A-58-112792, and cyanine dyes as disclosed in British Patent 434,875.

Near infrared-absorbing sensitizers disclosed in U.S. Pat. No. 5,156,938, too, are preferably used. Further, substituted arylbenzo(thio)pyrilium salts disclosed in U.S. Pat. No. 3,881,924, trimethine thiapyrilium salts disclosed in JP-A-57-142645 (U.S. Pat. No. 4,327,169), pyrilium-based compounds disclosed in JP-A-58-181051, JP-A-58-220143, JP-A-59-41363, JP-A-59-84248, JP-A-59-84249, JP-A-59-146063 and JP-A-59-146061, cyanine dyes disclosed in JP-A-59-216146, pentamethine thiopyrilium salts disclosed in U.S. Pat. No. 4,283,475, and pyrilium compounds disclosed in JP-B-5-13514 and JP-B-5-19702. Further preferred examples of dyes employable herein include near infrared-absorbing dyes described as compounds of the formulae (I) and (II) in U.S. Pat. No. 4,756,993.

Further preferred examples of the infrared absorbent of the invention include the following specific indoleine cyanine dyes disclosed in JP-A-2002-278057.

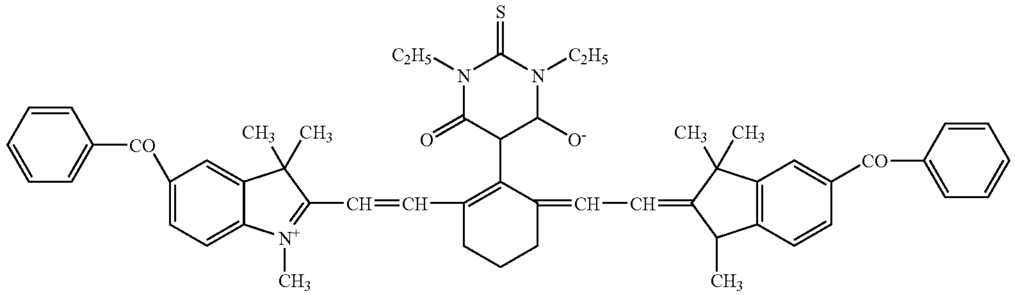

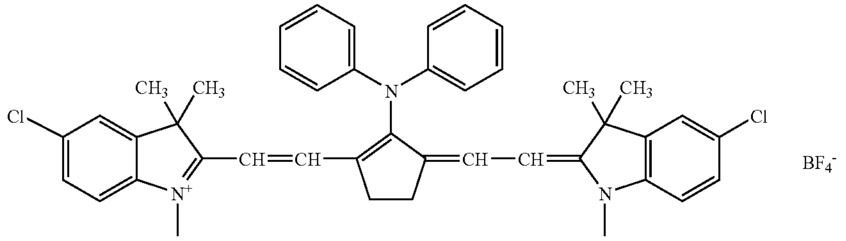

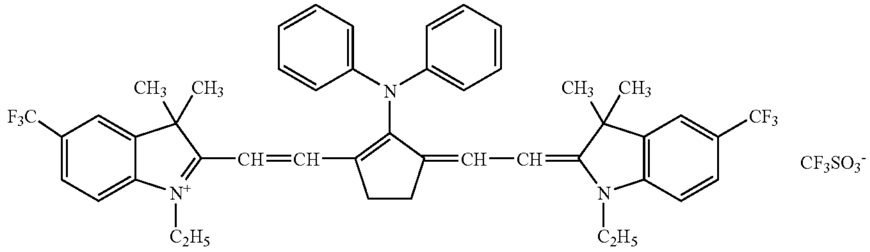

Particularly preferred among these dyes are cyanine dyes, squarilium dyes, pyrilium dyes, nickel thiolate complexes, and indolenine cyanine dyes. Even more desirable among these dyes are cyanine dyes and indolenine cyanine dyes. A particularly preferred example of these dyes is a cyanine dye represented by the following formula (i).

formula (i)

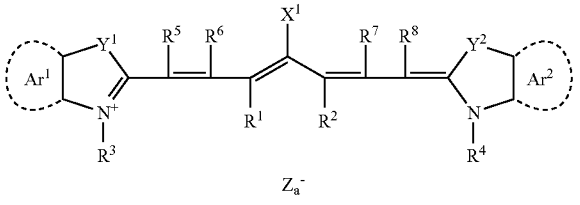

In the formula (i), $X^1$ represents a hydrogen atom, halogen atom, —$NPh_2$, $X^2$-$L^1$ or a group shown below. $X^2$ represents an oxygen atom, nitrogen atom or sulfur atom and $L^1$ represents a hydrocarbon group having from 1 to 12 carbon atoms, an aromatic ring having hetero atoms or a $C_1$–$C_{12}$ hydrocarbon group containing hetero atoms. The hetero atom indicates, N, S, O, halogen atom or Se. $Xa^-$ has the same meaning as $Za^-$ described later. $R^3$ represents a substituent selected from the group consisting of hydrogen atom, alkyl group, aryl group, substituted or unsubstituted amino group and halogen atom.

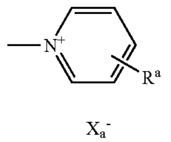

$R^1$ and $R^2$ each independently represent a $C_1$–$C_{12}$hydrocarbon group. From the standpoint of storage stability of recording layer-coating solution, $R^1$ and $R^2$ each are a hydrocarbon group having two or more carbon atoms. It is particularly preferred that $R^1$ and $R^2$ be connected to each other to form a 5- or 6-membered ring.

$Ar^1$ and $Ar^2$ may be the same or different and each represent an aromatic hydrocarbon group which may have substituents. Preferred examples of the aromatic hydrocarbon group include benzene ring and naphthalene ring. Preferred examples of the substituents include hydrocarbon group having 12 or less carbon atoms, halogen atom, and alkoxy group having 12 or less carbon atoms. $Y^1$ and $Y^2$ may be the same or different and each represent a sulfur atom or a dialkyl methylene group having 12 or less carbon atoms. $R^3$ and $R^4$ may be the same or different and each represent a hydrocarbon group having 20 or less carbon atoms which may have substituents. Preferred examples of the substituents include alkoxy group having 12 or less carbon atoms, carboxyl group and sulfo group. $R^5$, $R^6$, $R^7$ and $R^8$ may be the same or different and each represent a hydrogen atom or a hydrocarbon group having 12 or less carbon atoms, preferably a hydrogen atom from the standpoint of availability of starting material. $Za^-$ represents a counter anion. However, when the cyanine dye represented by the formula (i) has anionic substituents in its structure, eliminating the necessity of neutralizing electric charge, $Za^-$ is not needed. From the standpoint of storage stability of recording layer-coating solution, $Za^-$ is preferably a halogen ion, perchlorate ion, tetrafluoroborate ion, hexafluorophosphate ion or sulfonate ion, particularly a perchlorate ion, hexafluorophosphate ion or arylsulfonate ion.

Specific examples of the cyanine dye represented by the formula (i) which can be used to advantage in the invention include those described in JP-A-2001-133969, paragraph [0017]–[0019].

Particularly preferred examples of the cyanine dye include specific indolenine cyanine dyes described in JP-A-278057. As the pigment of the invention there may be used any of commercial available pigments and pigments disclosed in Handbook of Color Index (C. I.), "Saishin Ganryo Binran (Handbook of Modern Pigments)", Japan Association of Pigment Technology, 1977, "Saishin Ganryo Oyo Gijutsu (Modern Pigment Application Technology)", CMC, 1986, and "Insatsu Inki Gijutsu (Printing Ink Technology)", CMC, 1984.

Examples of the pigment employable herein include black pigments, yellow pigments, orange pigments, brown pigments, red pigments, purple pigments, blue pigments, green pigments, fluorescent pigments, metal powder pigments, and polymer-bonded dyes. Specific examples of these pigments include insoluble azo pigments, azo lake pigments, condensed azo pigments, chelate azo pigments, phthalocyanine-based pigments, anthraqinone-based pigments, perylene-based pigments, perinone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments, and carbon black. Preferred among these pigments is carbon black.

These pigments may or may not be subjected to surface treatment before use. Examples of the surface treatment method include a method which comprises coating the surface of the pigment with a resin or wax, a method which comprises attaching a surface active agent to the pigment, and a method which comprises bonding a reactive material (e.g., silane coupling agent, epoxy compound, polyisocyanate) to the surface of the pigment. For the details of the aforementioned surface treatment method, reference can be made to "Kinzoku Sekken no Seishitsu to Oyo (Properties and Application of Metal Soaps)", Saiwai Shobo, "Insatsu Inki Gijutsu (Printing Ink Technology)", CMC, 1984, and "Saishin Ganryo Oyo Gijutsu (Modern Pigment Application Technology)", CMC, 1986.

The particle diameter of the pigment is preferably from 0.01 μm to 10 μm, more preferably from 0.05 μm to 1 μm, particularly from 0.1 μm to 1 μm. When the particle diameter of the pigment falls within the above defined range, a good stability of the pigment dispersion in the image-forming layer coating solution and a good uniformity of the image-forming layer can be obtained.

As the method for dispersing the pigment there may be used any known dispersing technique for use in the production of ink or toner. Examples of the dispersing machine employable herein include ultrasonic dispersing machine, sand mill, attritor, pearl mill, super mill, ball mill, impeller, disperser, KD mill, colloid mill, dynatron, three-roll mill, and pressure kneader. For the details of the dispersing technique, reference can be made to "Saishin Ganryo Oyo Gijutsu (Modern Pigment Application Technology)", CMC, 1986.

These infrared absorbents may be incorporated in the same layer with other components or in a layer provided separately of other components. These infrared absorbents are incorporated in such an arrangement that the resulting negative-working lithographic printing plate precursor comprises an image-forming layer having an absorbance of from 0.3 to 1.2, preferably from 0.4 to 1.1 as determined by a reflection method at an absorption maximum wavelength in a range of from 760 nm to 1,200 nm. When the absorbance of the image-forming layer falls within the above defined range, the polymerization reaction can proceed uniformly along the depth of the image-forming layer, making it possible to provide the image area with a good film strength and a good adhesion to the support.

The absorbance of the image-forming layer can be properly adjusted by the amount of the infrared absorbent to be incorporated in the image-forming layer and the thickness of the image-forming layer. The measurement of absorbance can be conducted by any ordinary method. Examples of the method of measuring absorbance employable herein include a method which comprises forming an image-forming layer on a reflective support such as aluminum sheet in such an arrangement that the dried spread gives a thickness properly determined within a range required for lithographic printing plate, and then measuring the reflection density of the image-forming layer thus formed using an optical densitometer, and a method involving the measurement by means of a spectrophotometer employing a reflection method using an integrating sphere.

[Polymerization Initiator]

As the polymerization initiator used in the invention, a variety of photopolymerization initiators well known in patent as well as literature may be used depending on the wavelength for the light source to be adopted. In addition, two or more photopolymerization initiators (photopolymerization initiation system) may be appropriately combined.

In case where a blue semiconductor laser, an Ar laser, the second harmonic wave of an infrared semiconductor laser or an SHG-YAG laser is used for the light source, various photopolymerization initiators (or initiation systems) have been proposed, including, for example, a certain kind of photo-reducible dye such as rose bengale, eosin and erythrosin as described in U.S. Pat. No. 2,850,445, a system comprising the combination of a dye with an initiator, a complex initiating system comprising a dye with an amine (Japanese Patent Publication No. 20189/1969), a system comprising a hexaarylbiimidazole, a radical generator and a dye (Japanese Patent Publication No. 37377/1970), a system of a hexaarylbiimidazole and a p-dialkylaminobenzylidene ketone (Japanese Patent Publication No. 2528/1972, and Japanese Patent Laid-open No. 155292/1979), a system comprising a cyclic cis-α-dicarbonyl compound and a dye (Japanese Patent Laid-open No. 84183/1973), a system comprising a cyclic triazine and a merocyanine dye (Japanese Patent Laid-open No. 151024/1979), a system comprising 3-ketocoumarin and a surfactant (Japanese Patent Laid-open Nos. 112681/1977 and 15503/1983), a system comprising biimidazole, a styrene derivative and a thiol (Japanese Patent Laid-open No. 140203/1984), a system of an organic peroxide and a dye (Japanese Patent Laid-open Nos. 1504/1984, 140203/1984, 189340/1984 and174203/1987, Japanese Patent Publication No. 1641/1987 and U.S. Pat. No. 4,766,055), a system of a dye and an active halogen compound (for example, Japanese Patent Laid-open Nos. 1718105/1988, 258903/1988 and 264771/1991), a system of a dye and a borate compound (for example, Japanese Patent Laid-open Nos. 143044/1987, 150242/1987, 13140/1989, 13141/1989, 13142/1989, 13143/1989, 13144/1989, 17048/1989, 229003/1989, 298348/1989 and 138204/1989), a system of a dye containing a rhodanine ring and a radical generator (Japanese Patent Laid-open No. 179643/1990 and 244050/1990), a system of a tinanocene and 3-ketocoumarin dye (Japanese Patent Laid-open No. 221110/1988), a system comprising a titanocene, a xanthene dye and an addition-polymerizable ethylenically unsaturated compound containing an amino group or a urethane group (Japanese Patent Laid-open Nos. 221958/1992 and 219756/1992), a system of a titanocene and a specified merocyanine dye (Japanese Patent Laid-open No. 295061/1994), and a system of a titanocene and a dye having a benzopyran ring (Japanese Patent Laid-open No. 334897/1996).

The photopolymerization initiator (initiation system) which is particularly preferable for the photosensitive layer of the lithographic printing plate precursor according to the invention contains at least one titanocene. In the invention, as the titanocene compound used for the photopolymerization initiator (initiating system), those which can generate an active radical when it is irradiated with light in the presence of another sensitizing dye may be arbitrarily used including those described in the following patent specifications; Japanese Patent Laid-open Nos. 152396/1984, 151197/1986, 41483/1988, 41484/1988, 249/1990, 291/1990, 27393/1991, 12403/1991 and 41170/1994.

More specifically, there are mentioned, for example, di-cyclopentadienyl-Ti-dichloride, di-cyclopentadienyl-Ti-bis-phenyl, di-cyclopentadienyl-Ti-bis-2,3,4,5,6-pentafluorophen-1-yl (hereinafter referred to also as "T-1) di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-difluorophen-1-yl, di-cyclopentadienyl-Ti-bis-2,4-difluorophen-1-yl, dimethylcyclopentadienyl-Ti-bis-2,3,4,5,6-pentafluoropheny-1-yl, dimethylcyclopentadienyl-Ti-bis-2,3,5,6-tetrafluoropheny-1-yl, dimethylcyclopentadienyl-Ti-bis-2,4-difluorophen-1-yl, bis(cyclopentadienyl)-bis(2,6-difluoro-3-(pyr-1-yl)phenyl) titanium (hereinafter referred to also as "T-2).

These titanocene compounds may further be subjected to a variety of chemical modification to improve the characteristics of the photosensitive layer. For example, bonding of a sensitizing dye or a radical-generating part such as an addition polymerizable unsaturated compound and the like, introduction of a hydrophilic moiety, introduction of a substituent for the purposes of compatibility enhancement, suppression of crystal segregation and adhesion enhancement, and polymerization can be adopted.

The method of using these titanocene compounds may also be established appropriately and arbitrarily depending on the performance designing of the lithographic printing plate precursor as in the case of the aforementioned addition polymerizable compound. For example, two or more kinds of titanocene compounds may be used in combination whereby the compatibility in the photosensitive layer is enhanced. A larger use amount of the photopolymerization initiator such as the aforementioned titanocene compound is advantageous as regards photo-sensitivity, and by using the initiator in the range of 0.5 to 80 parts by weight, preferably 1 to 50 parts by weight per 100 parts by weight of the non-volatile component of the photosensitive layer, a sufficient level of photo-sensitivity can be attained. On the other hand, for the handling of the plate precursor under a yellow or white light, it is preferred to use a small amount of the titanocene compound from the viewpoint of fogging due to a light around 500 nm wavelength. By combining other sensitizing dyes, a sufficient level of photosensitivity can be secured with a reduced use amount of the titanocene compound of 6 parts by weight or less, further 1.9 parts by weight or less, or still further 1.4 parts by weight or less.

As the thermal polymerization initiator used in the invention in order to initiate and proceed the cross-linking reaction of the aforementioned addition-polymerizable compound, a radical generator of thermal decomposition type that generates radical upon decomposition by heat is useful such a radical generator generates radical when used in combination with the aforementioned infrared absorbing agent, since the infrared absorbing agent generates heat when irradiated with an infrared laser light whereby the generated heat acts to generate radical. Thus, with such a combination, image recording becomes possible.

As the radical generator, an onium salt, a triazine compound having a trihalomethyl group, a peroxide, an azo-based polymerization initiator, an azide compound, quinonediazide, an oxime ester compound, and a triarylmonoalkyl borate compounds are mentioned. Among these, onium salts or oxime ester compounds are preferred due to their high sensitivities. In the following, the onium salts which can be preferably used as the polymerization initiator in the invention are explained. The preferable onium salt includes iodonium salts, diazonium salts and sulfonium salts. In the invention, these onium salts do not function as an acid generator but as a radical polymerization initiator. The preferable onium salts for the invention are those represented by the following formulae (A) to (C).

$$Ar^{11}—I^{+}—Ar^{12}(Z^{11})^{-}$$ Formula (A)

$$Ar^{21}—N^{+}\equiv N(Z^{21})^{-}$$ Formula (B)

$$(R^{31})(R^{32})—S^{+}—R^{33}(Z^{31})^{-}$$ Formula (C)

In formula (A), $Ar^{11}$ and $Ar^{12}$ each independently represent an aryl group with 20 or less carbon atoms which may be substituted. When the aryl group has a substituent, the substituent is preferably a halogen atom, a nitro group, an alkyl group with 12 carbon atoms or less, an alkoxy group with 12 carbon atoms or less, or an aryloxy group with 12 carbon atoms or less. $Z^{11}$ represents a counter ion selected from the group consisting of a halogen ion, perchlorate ion, tetrafluoroborate ion, carboxylate ion and sulfonic acid ion, and preferably represents perchlorate ion, hexafluorophosphate ion, carboxylate ion and an arylsulfonic acid ion.

In formula (B), $Ar^{21}$ represents an aryl group with 20 or less carbon atoms which may be substituted. The substituent is preferably a halogen atom, a nitro group, an alkyl group with 12 carbon atoms or less, an alkoxy group with 12 carbon atoms or less, an aryloxy group with 12 carbon atoms or less, an alkylamino group with 12 carbon atoms or less, a dialkylamino group with 12 carbon atoms or less, an arylamino group with 12 carbon atoms or less, and a diarylamino group with 12 carbon atoms or less. $Z^{21}$ represents a counter ion similar to $Z^{11}$.

In formula. (C), $R^{31}$, $R^{32}$ and $R^{33}$, which may be the same of different from each other, each represent a hydrocarbon group with 20 carbon atoms or less. The preferable substituent includes a halogen atom, a nitro group, an alkyl group with 12 carbon atoms or less, an alkoxy group with 12 carbon atoms or less, and an aryloxy group with 12 carbon atoms or less. $Z^{31}$ represents a counter ion similar to $Z^{11}$.

As the specific example of the onium salt preferably used in the invention as the polymerization initiator (radical generator), those described in Japanese Patent Laid-open No. 2002-133696 are mentioned. In the following, onium salts ([OI-1] to [OI-10]) represented by formula (A), onium salts ([ON-1] to [ON-10]) represented by formula (B), and onium salts ([OS-1] to [OS-7]) are enumerated. But, the scope of the invention should not be construed as limited to these compounds.

[OI-1]

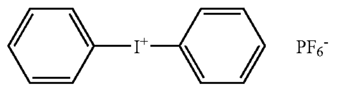

[OI-2]

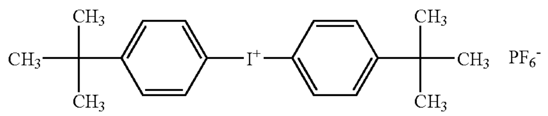

[OI-3]

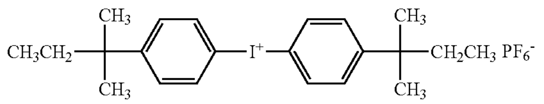

[OI-4]

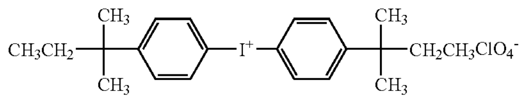

[OI-5]

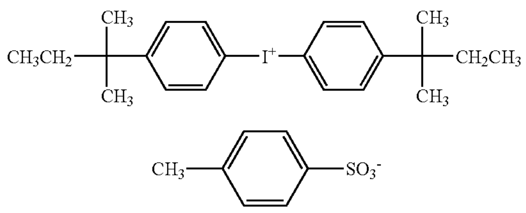

[OI-6]

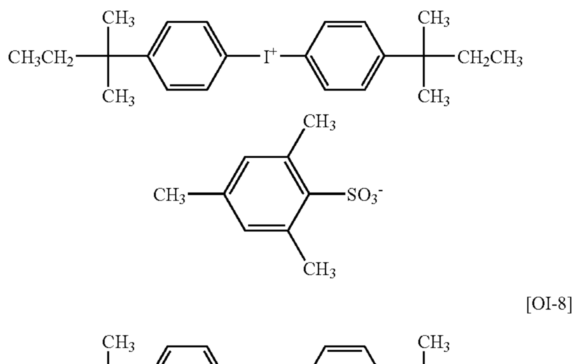

[OI-7]

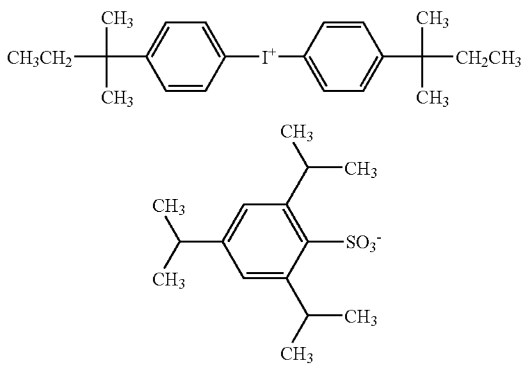

[OI-8]

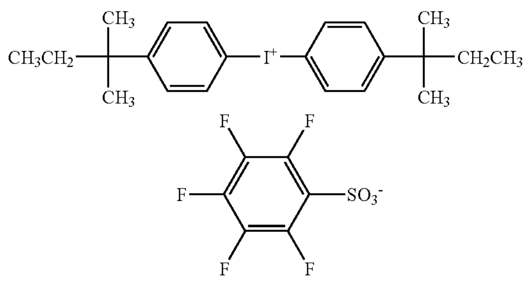

-continued
[OI-9]
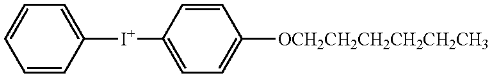
[OI-10]
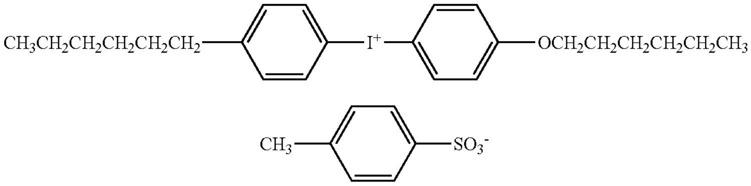
[ON-1]
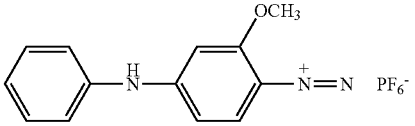
[ON-2]
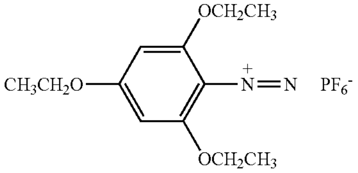
[ON-3]
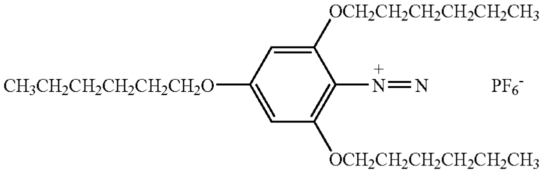
[ON-4
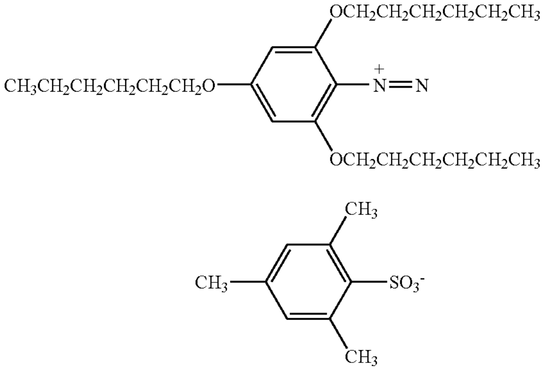
[ON-5]
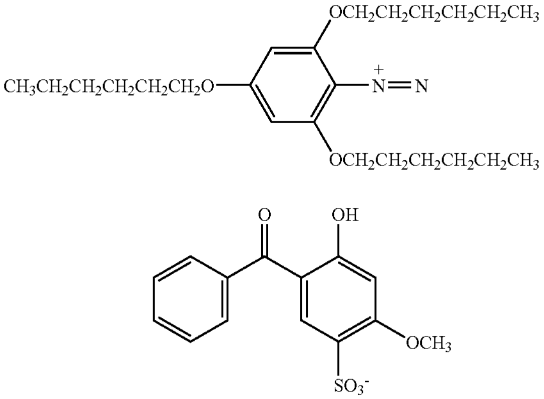
[OS-1]
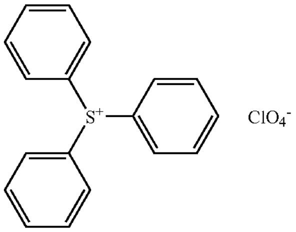
[OS-2]
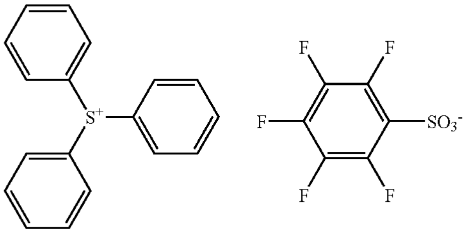
[OS-3]
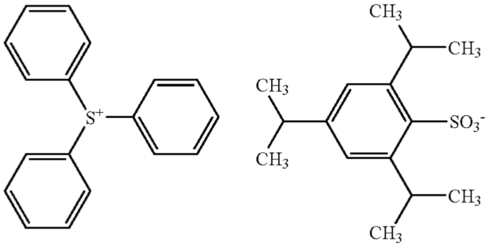

-continued

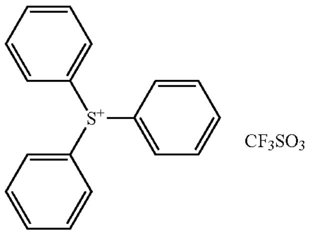

[OS-4]

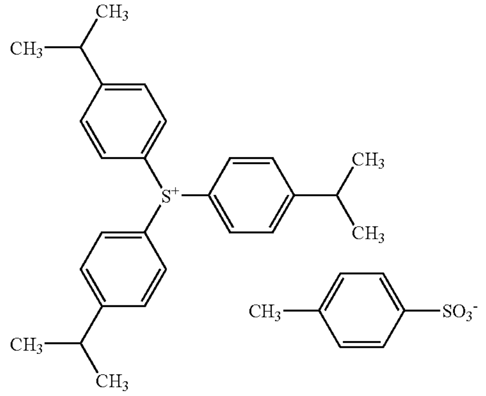

[OS-5]

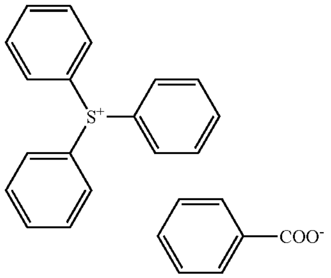

[OS-6]

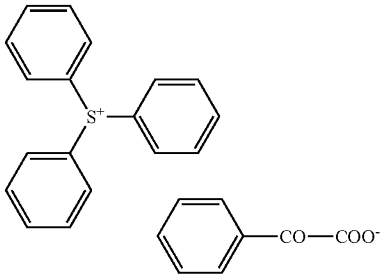

[OS-7]

It is desirable that the polymerization initiators for use in the invention haven an absorption maximum wavelength of 400 nm or less, more preferably 360 nm or less. Using the compounds that have an absorption wavelength in the UV range makes it possible to handle the lithographic printing plate precursor of the invention under white light.

Other preferred polymerization initiators for use herein are specific aromatic sulfonium salts described in Japanese Patent Application Nos. 2000-266797, 2001-177150, 2000-160323, 2000-184603. Their typical examples are mentioned below.

In addition, typical examples of still other preferred polymerization initiators usable in the invention are also mentioned below.

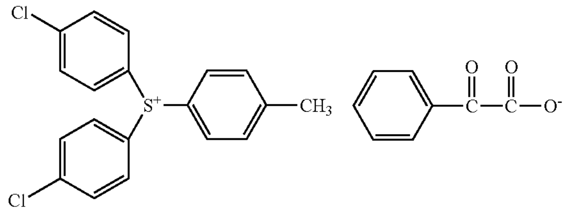

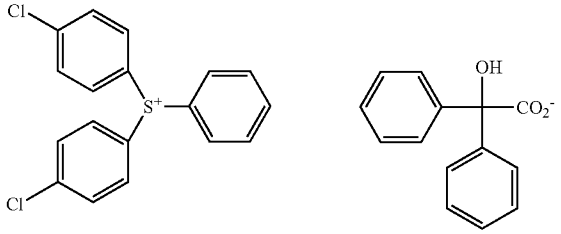

-continued

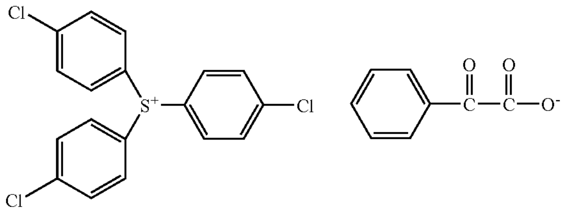

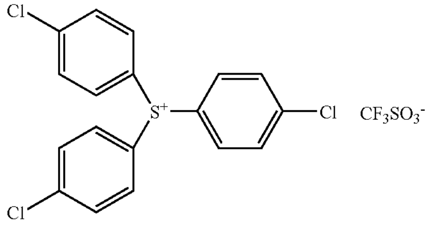

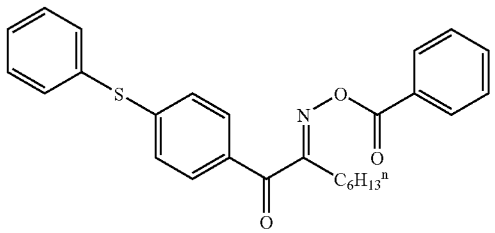

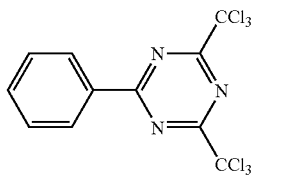

-continued

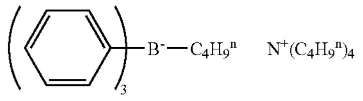

Oxime ester compounds preferred for the polymerization initiators for use in the invention are described. Preferred examples of oxime ester compounds for use herein are represented by the following formula (D):

(D)

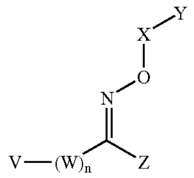

In formula (D), X represents a carbonyl group, a sulfone group, or a sulfoxide group; Y represents a cyclic or straight chain alkyl, alkenyl or alkynyl group having from 1 to 12 carbon atoms, an aryl group having from 6 to 18 carbon atoms, or a heterocyclic group. The aryl group includes aromatic hydrocarbon compounds such as a benzene ring, a naphthalene ring, an anthracene ring, a phenanthrene ring, a pyrene group, and a triphenylene group. The heterocyclic group includes aromatic compounds having at least one hetero atom of nitrogen, sulfur and oxygen atoms in the cyclic structure thereof, for example, a pyrrole group, a furan group, a thiophene group, a selenophene group, a pyrazole group, an imidazole group, a triazole group, a tetrazole group, an oxazole group, a thiazole group, an indole group, a benzofuran group, a benzimidazole group, a benzoxazole group, a benzothiazole group, a pyridine group, a pyrimidine group, a pyrazine group, a triazine group, a quinoline group, a carbazole group, an acridine group, a phenoxazine group, and a phenothiazine group. These substituents for Y may be further substituted with any of a halogen atom, a hydroxyl group, a nitrile group, a nitro group, a carboxyl group, an aldehyde group, an alkyl group, a thiol group, an aryl group, an alkenyl group, an alkynyl group, an ether group, an ester group, an urea group, an amino group, an amido group, a sulfido group, a disulfido group, a sulfoxide group, a sulfo group, a sulfone group, a hydrazine group, a carbonyl group, an imino group, a halogen atom, a hydroxyl group, a nitrile group, a nitro group, a carboxyl group, a carbonyl group, an urethane group, an alkyl group, a thiol group, an aryl group, a phosphoroso group, a phospho group, or a carbonyl-ether group.

In formula (D), Z has the same meaning as Y, representing a nitrile group, a halogen atom, a hydrogen atom or an amino group. These substituents for Z may be further substituted with any of a halogen atom, a hydroxyl group, a nitrile group, a nitro group, a carboxyl group, an aldehyde group, an alkyl group, a thiol group, an aryl group, an alkenyl group, an alkynyl group, an ether group, an ester group, an urea group, an amino group, an amido group, a sulfido group, a disulfido group, a sulfoxide group, a sulfo group, a sulfone group, a hydrazine group, a carbonyl group, an imino group, a halogen atom, a hydroxyl group, a nitrile group, a nitro group, a carboxyl group, a carbonyl group, an urethane group, an alkyl group, a thiol group, an aryl group, a phosphoroso group, a phospho group, or a carbonyl-ether group.

In formula (D), W represents a divalent organic group, for example, a methylene group, a carbonyl group, a sulfoxide group, a sulfone group, or an imino group. The methylene group and the imino group may be substituted with any of an alkyl group, an aryl group, an ester group, a nitrile group, a carbonyl-ether group, a sulfo group, a sulfo-ether group, or an ether group, n indicates an integer of 0 or 1.

In formula (D), V represents a cyclic or straight chain alkyl, alkenyl or alkynyl group having from 1 to 12 carbon atoms, an aryl group having from 6 to 18 carbon atoms, an alkoxy group, or an aryloxy group. The aryl group includes aromatic hydrocarbon compounds such as a benzene ring, a naphthalene ring, an anthracene ring, a phenanthrene ring, a pyrene group, and a triphenylene group; and hetero atom-containing aromatic compounds such as a pyrrole group, a furan group, a thiophene group, a selenophene group, a pyrazole group, an imidazole group, a triazole group, a tetrazole group, an oxazole group, a thiazole group, an indole group, a benzofuran group, a benzimidazole group, a benzoxazole group, a benzothiazole group, a pyridine group, a pyrimidine group, a pyrazine group, a triazine group, a quinoline group, a carbazole group, an acridine group, a phenoxazine group, and a phenothiazine group. These substituents for V may be further substituted with any of a halogen atom, a hydroxyl group, a nitrile group, a nitro group, a carboxyl group, an aldehyde group, an alkyl group, a thiol group, an aryl group, an alkenyl group, an alkynyl group, an ether group, an ester group, an urea group, an amino group, an amido group, a sulfido group, a disulfido group, a sulfoxide group, a sulfo group, a sulfone group, a hydrazine group, a carbonyl group, an imino group, a halogen atom, a hydroxyl group, a nitrile group, a nitro group, a carboxyl group, a carbonyl group, an urethane group, an alkyl group, a thiol group, an aryl group, a phosphoroso group, a phospho group, or a carbonyl-ether group.

V and Z may bond to each other to form a ring.

In the oxime ester compounds of formula (D), it is desirable that X is a carbonyl group, Y is an aryl or benzoyl group, Z is an alkyl or aryl group, W is a carbonyl group, and V is an aryl group in view of the sensitivity of the compounds. More preferably, the aryl group for V has a thioether substituent.

Regarding the structure thereof, the N—O bond in formula (D) may form either an E-form or a Z-form.

Other oxime ester compounds favorable for use in the invention are described in *Progress in Organic Coatings,* 13 (1985), 123–150; *J. C. S. Perkin II* (1979), 1653–1660; *Journal of Photopolymer Science and Technology* (1995), 205–232; *J. C. S. Perkin II* (1979), 156–162; JP-A 2000-66385; and JP-A 2000-80068.

Specific examples of oxime ether compounds favorable for the invention are mentioned below, to which, however, the invention should not be limited.

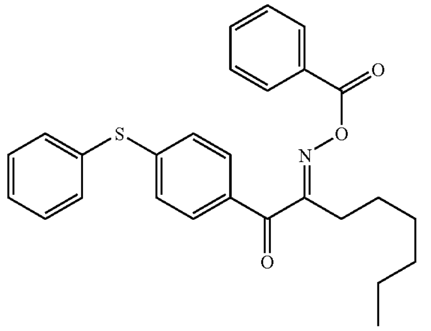
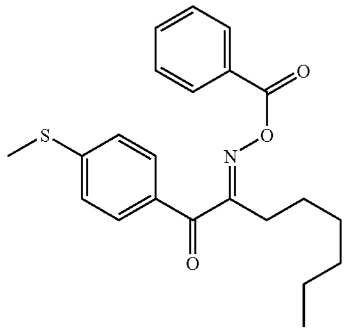
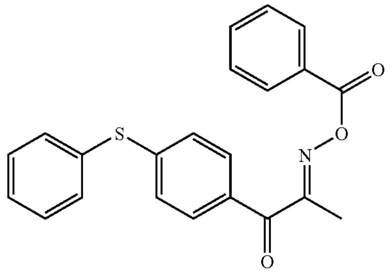
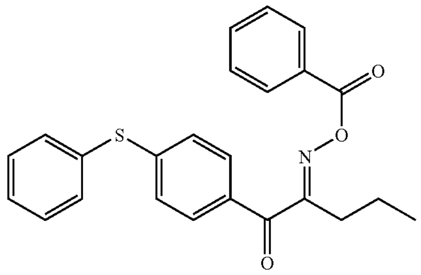
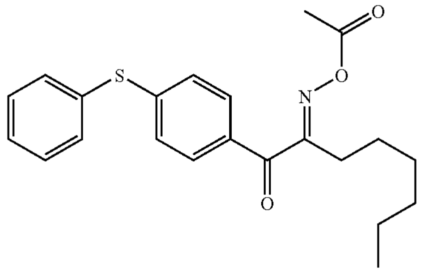
-continued
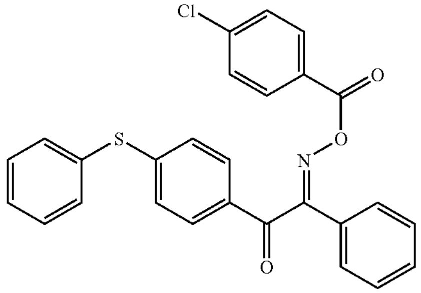
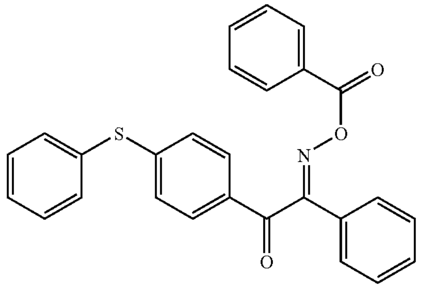
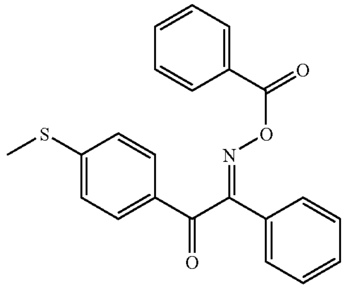
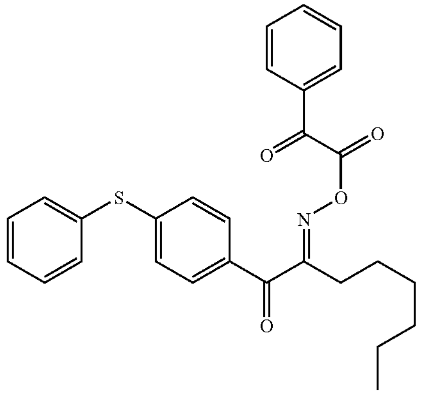
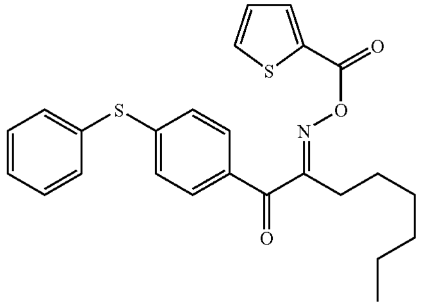

-continued
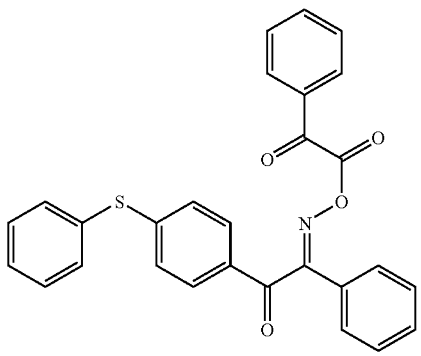
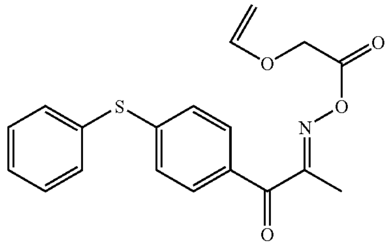
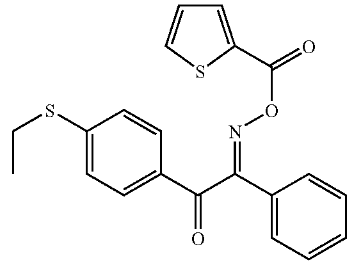
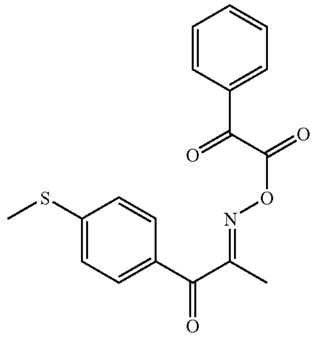
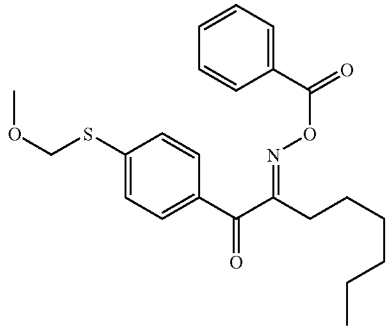
-continued
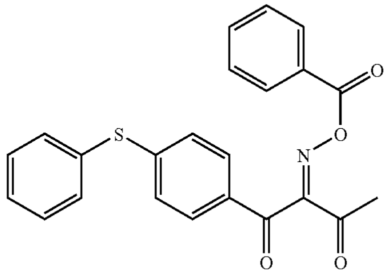
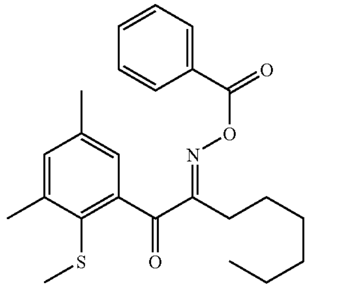
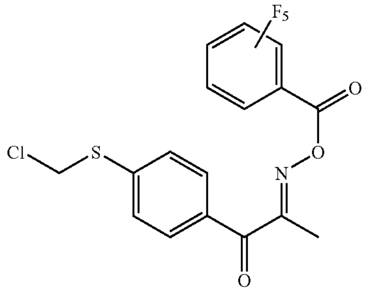
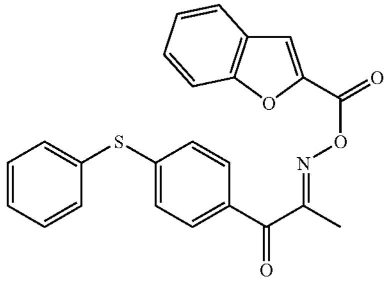
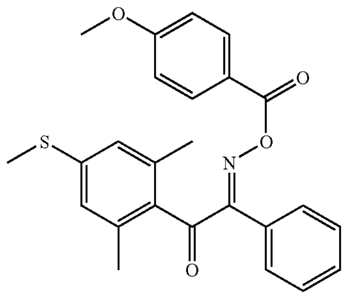

-continued
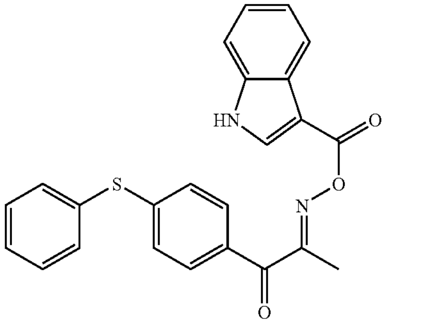
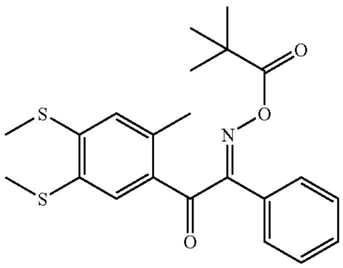
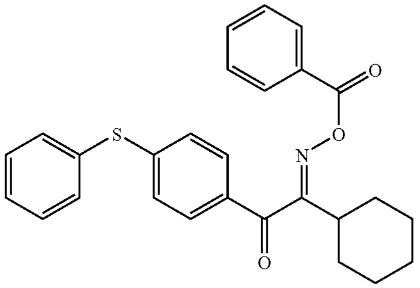
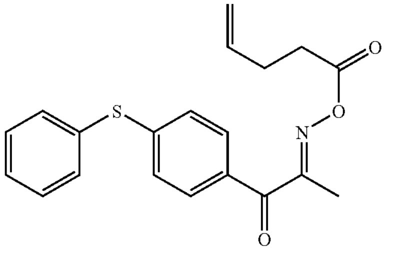
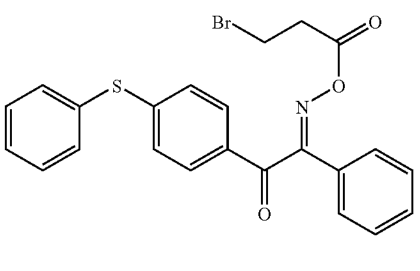
-continued
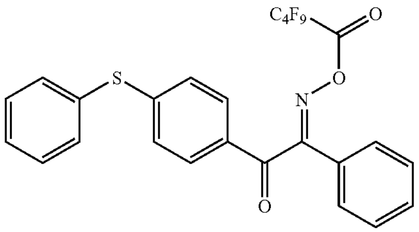
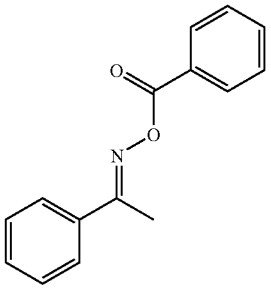
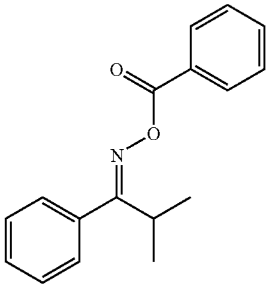
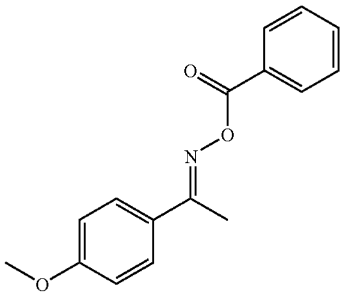
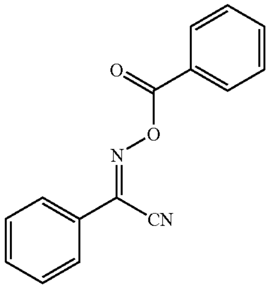
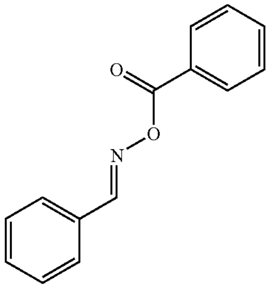

-continued
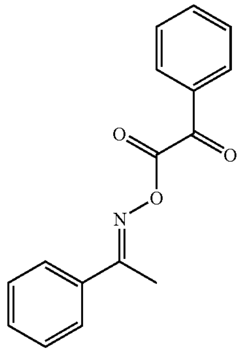
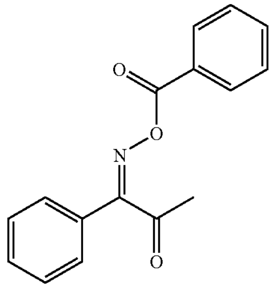
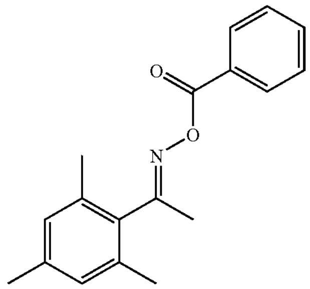
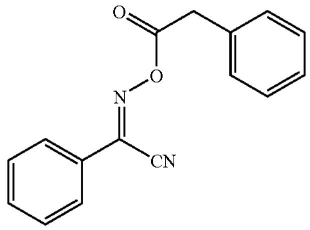
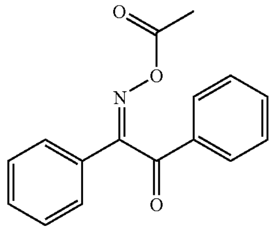
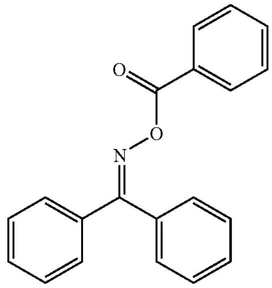
-continued
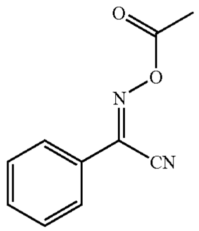
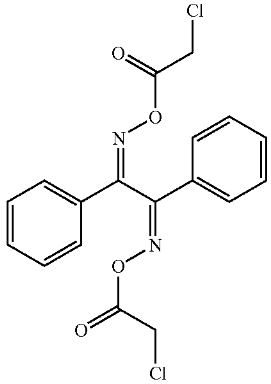
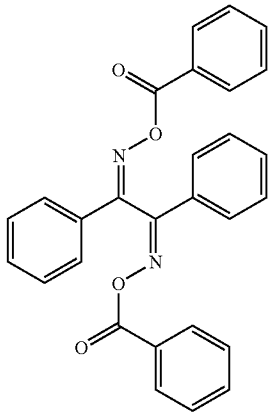
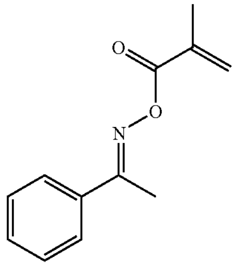
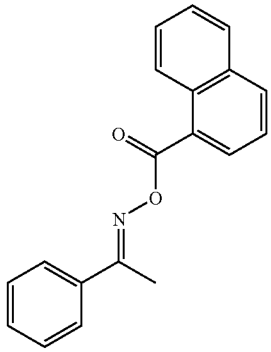

-continued
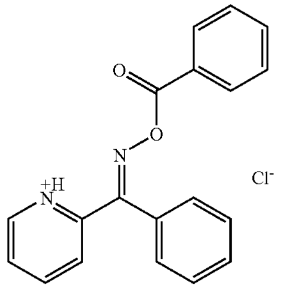
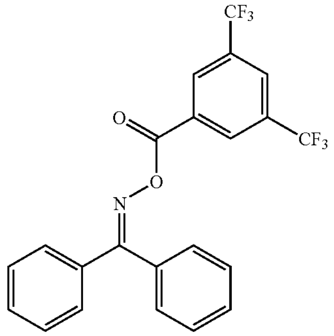
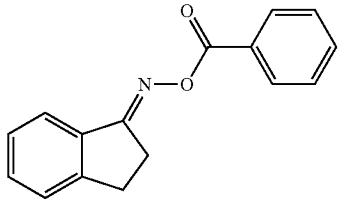
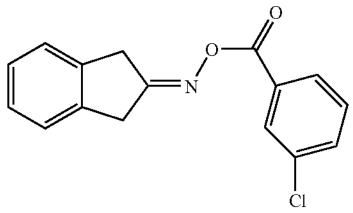
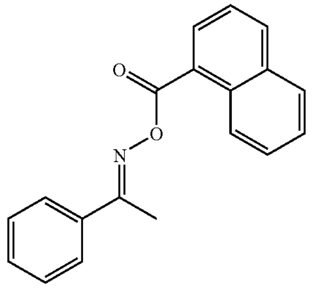
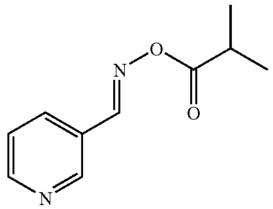
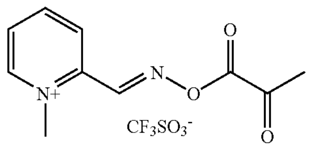
-continued
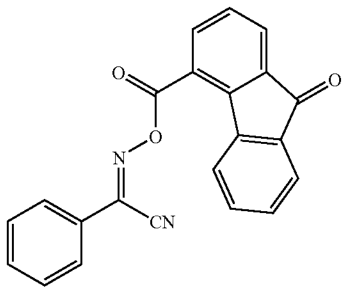
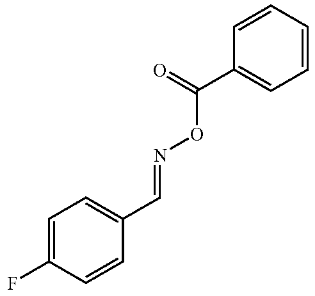
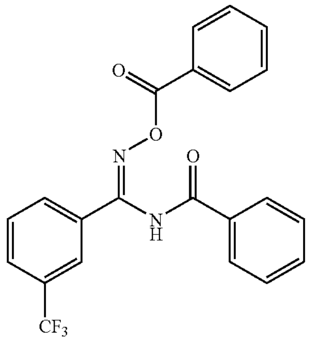
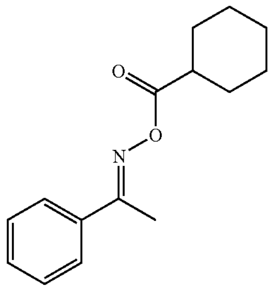
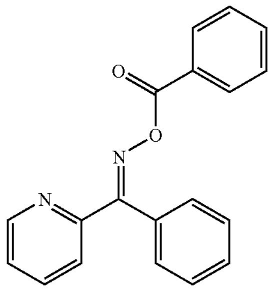

-continued
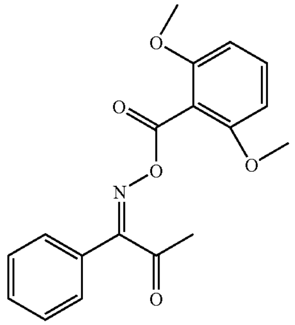
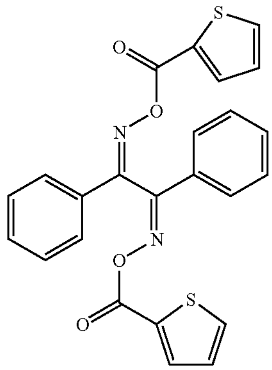
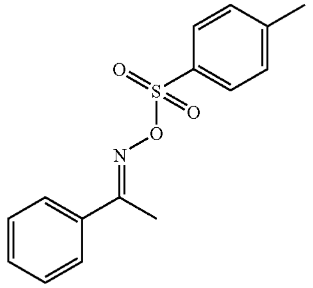
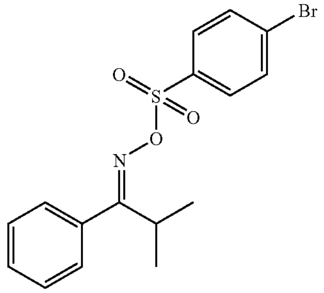
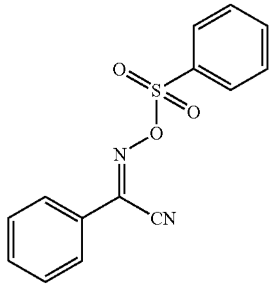
-continued
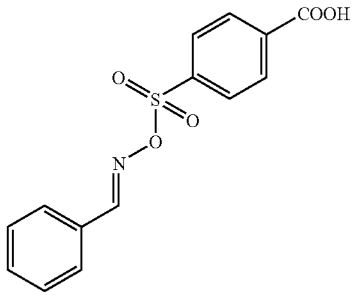
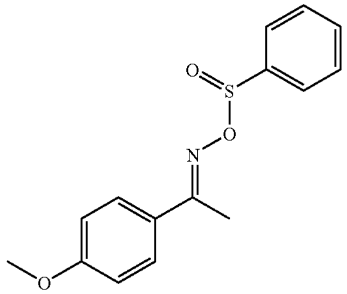
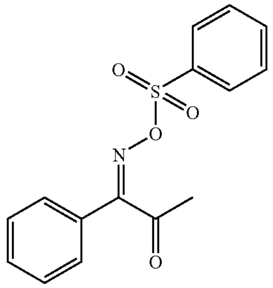
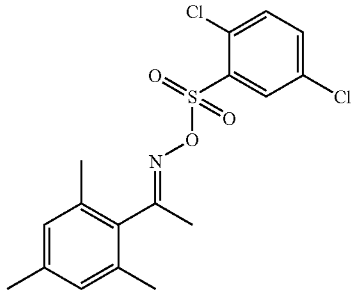
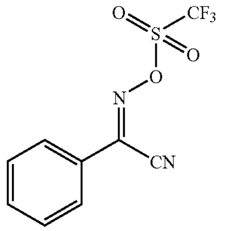
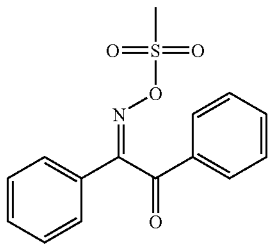

-continued
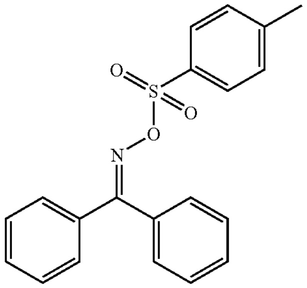
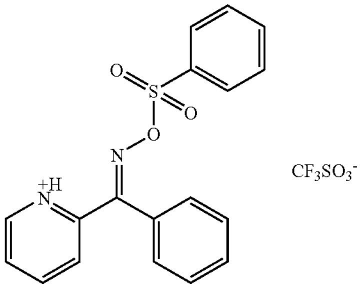
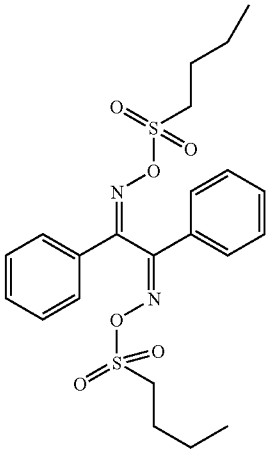
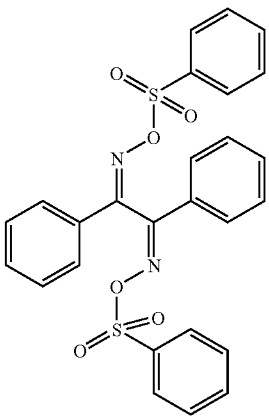
-continued
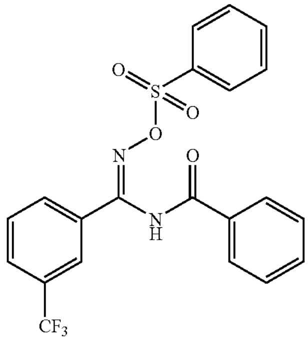
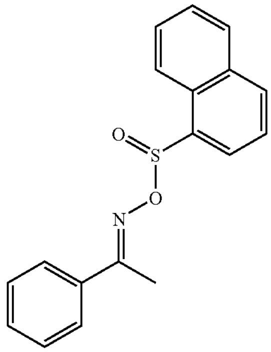
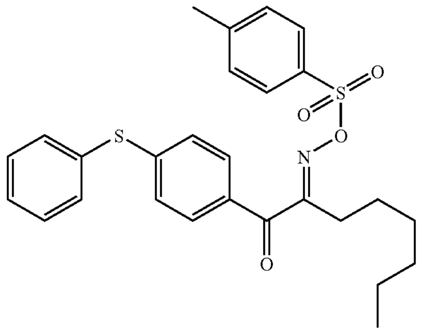
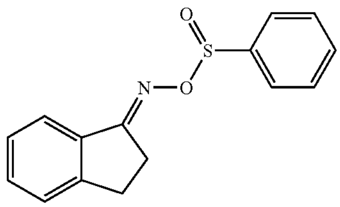
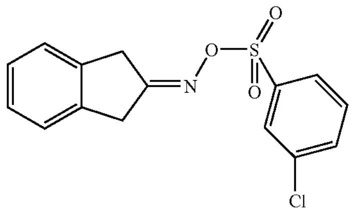

-continued
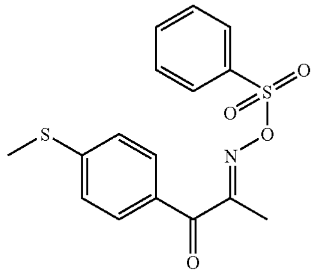
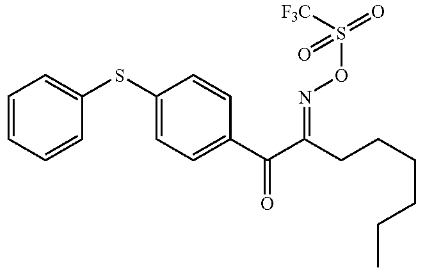
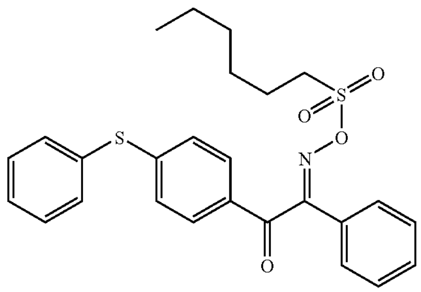
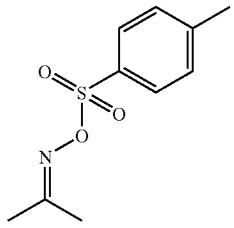
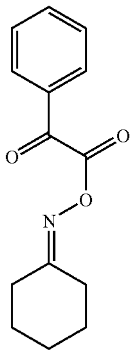
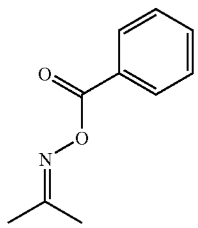
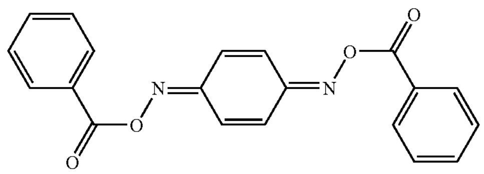
-continued
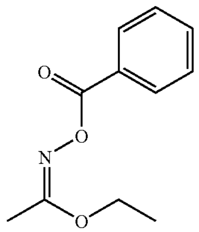
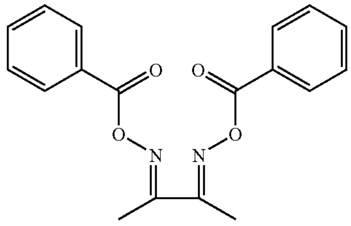
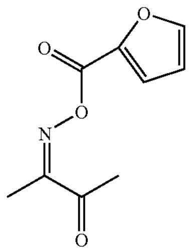
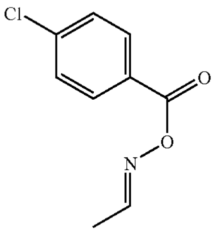
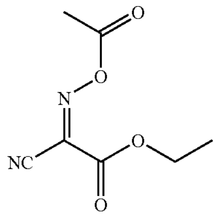
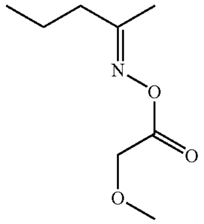
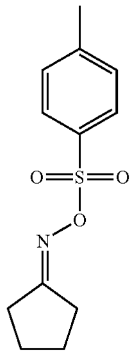
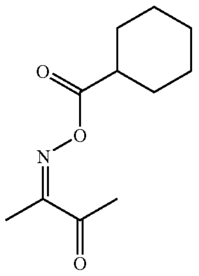
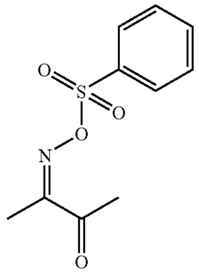
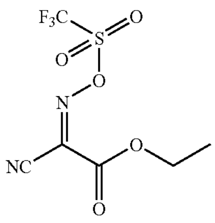

-continued

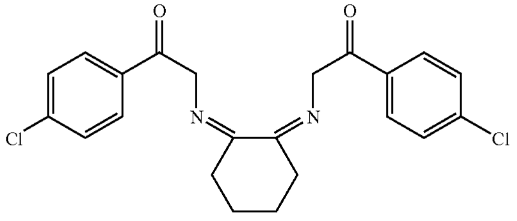

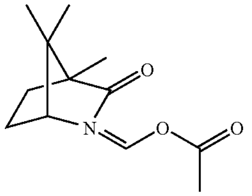

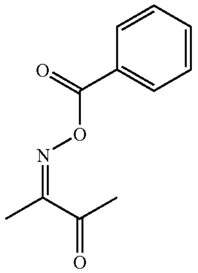

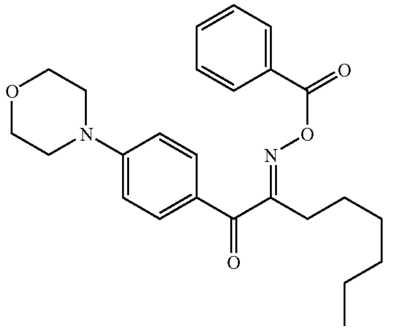

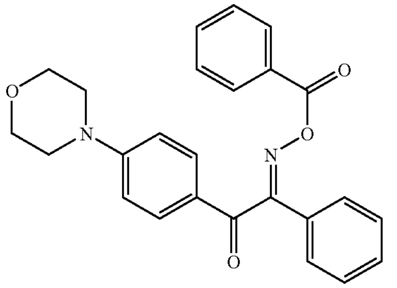

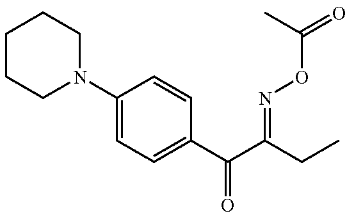

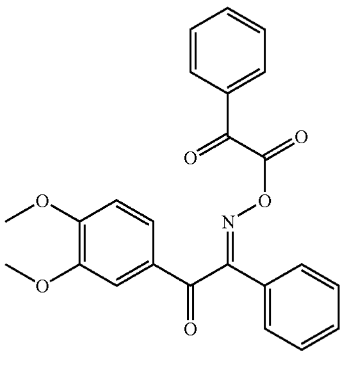

The amount of the polymerization initiator to be in the printing plate precursor of the invention may be from 0.1 to 50% by weight, preferably from 0.5 to 30% by weight, more preferably from 1 to 20% by weight relative to the total solid content of the photosensitive layer from the viewpoint of the sensitivity of the layer and of the staining resistance thereof in the non-image area in prints. Either singly or as combined, one or more different types of these polymerization initiators may be used. The polymerization initiator may be combined with the other components to be in one layer, or may be added to an additional layer that differ from the layer that contains the other components.

(Sensitizing Dye)

A sensitizing dye may be added to the polymerizable composition of the invention. Preferably, the sensitizing dye to be in the composition has an absorption peak within a range of from 350 nm to 850 nm. The sensitizing dye of the type includes spectral-sensitizing dyes, and dyes or pigments that absorb light from light sources to interact with photopolymerization initiator.

Preferred examples of the spectral-sensitizing dye or dyestuff include multi-nuclear aromatic compounds (for example, pyrene, perylene, triphenylene), xanthenes (for example, Fluoresceine, Eosine, Erythrosine, Rhodamine B, Rose Bengale), cyanines (for example, thiacarbocyanine, oxacarbocyanine), merocyanines (for example, merocyanine, carbomerocyanine), thiazines (for example, Thionine, Methylene Blue, Toluidine Blue), acridines (for example, Acridine Orange, chloroflavine, acriflavine), phthalocyanines (for example, phthalocyanine, metallo-phthalocyanine), porphyrins (for example, tetraphenyl porphyrin, center metal-substituted porphyrin), chlorophylls (for example, chlorophyll, chlorophyllin, center metal-substituted chlorophyll), metal complexes, anthraquinones (for example, anthraquinone), and stariums (for example, starium).

More preferred examples of the spectral sensitizing dye or dyestuff for use herein are mentioned below. Styryl dyes as in JP-B 37-13034; cation dyes as in JP-A 62-143044; quinoxalinium salts as in JP-B 59-24147; new methylene blue compounds as in JP-A 64-33104; anthraquinones as in JP-A 64-56767; benzoxanthene dyes as in JP-A 2-1714; acridines as in JP-A 2-226148, 2-226149; pyrylium salts as in JP-B 40-28499; cyanines as in JP-B 46-42363; benzofuran dyes as in JP-A 2-63053; conjugated ketone dyes as in JP-A 2-85858, 2-216154; dyes as in JP-A 57-10605; azocinnamylidene derivatives as in JP-B 2-30321; cyanine dyes as in JP-A 1-287105; xanthene dyes as in JP-A 62-31844, 62-31848, 62-143043; aminostyryl ketones as in JP-B 59-28325; merocyanine dyes as in JP-B 61-9621; dyes as in JP-A 2-179643; merocyanine dyes as in JP-A 2-244050; merocyanine dyes as in JP-B 59-28326; merocyanine dyes as in JP-A 59-89303; merocyanine dyes as in JP-A 8-129257; and benzopyran dyes as in JP-A 8-334897.

[Polymerizable Compound]

The polymerizable compound is an addition-polymerizable compound having at least one ethylenically unsaturated double bond and is selected from the group consisting of compounds having at least one, preferably two or more ethylene-terminated unsaturated bonds. Such a group of compounds are widely known in the art and can be used in the invention without any particular limitation. These compounds have a chemical morphology such as monomer, prepolymer, e.g., dimer, trimer, oligomer, mixture and copolymer thereof. Examples of the monomer and copolymer thereof include unsaturated carboxylic acids (e.g., acrylic acid, methacrylic acid, itaconic acid, crotonic acid, isocrotonic acid, maleic acid), and esters and amides thereof. Esters of unsaturated carboxylic acid with aliphatic polyvalent alcohol compound and amides of unsaturated carboxylic acid with aliphatic polyvalent amine compound are preferably used other preferred examples of copolymers employable herein include product of addition reaction of unsaturated carboxylic acid ester or amide having a nucleophilic substituent such as hydroxyl group, amino group and mercapto group with monofunctional or polyfunctional isocyanate or epoxy and product of dehydrocondensation reaction of such an unsaturated carboxylic acid ester or amide with monofunctional or polyfunctional carboxylic acid. Further examples of copolymers employable herein include product of addition reaction of unsaturated carboxylic acid ester or amide having an electrophilic substituent such as isocyanate group and epoxy group with monofunctional or polyfunctional alcohol, amine or thiol and product of substitution reaction of unsaturated carboxylic acid ester or amide having a separatable substituent such as halogen group and tosyloxy group with monofunctional or polyfunctional alcohol, amine or thiol. Still further examples of copolymers employable herein include compounds produced in the same manner as described above except that the aforementioned unsaturated carboxylic acid is replaced by unsaturated phosphonic acid, styrene, vinylether or the like.

Specific examples of the monomer of ester of aliphatic polyvalent alcohol compound with unsaturated carboxylic acid include acrylic acid esters such as ethylene glycol diacrylate, triethylene glycol diacrylate, 1,3-butanediol diacrylate, tetramethyelne glycol diacrylate, propylene glycol diacrylate, neopentyl glycol diacrylate, trimethylolpropane triacrylate, trimethylolpropane tri(acryloyloxy propyl)ether, trimethylolethane triacrylate, hexanediol diacrylate, 1,4-cyclohexanediol diacylate, tetraethylene glycol diacrylate, pentaerythritol diacrylate, pentaerythritol triacrylate, pentaerythritol tetraacrylate, dipentaerythritol diacrylate, dipentaeruthritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer, and EO-modified triacrylate isocyanurate.

Example of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethyl methane and bis-[p-(methacryloxyethoxy)phenyl]dimethylmethane, itaconic acid esters such as ethylene glycol diitaconate, propylene glycol diitaconate, 1,3-butanedioldiitaconate, 1,4-butanediol diitaconate, tetramethylene glycol diitaconate, pentaerythritol diitaconate and sorbitol tetraitaconate, crotonic acid esters such as ethylene glycol dicrotonate, tetramethylene glycol dicrotonate, pentaerythritol dicrotonate and sorbitol tetradicrotonate, isocrotonic acid esters such as ethylene glycol diisocrotonate, pentaerythritol diisocrotonate and sorbitol tetraisocrotonate, and maleic acid esters such as ethylene glycol dimalate, triethylene glycol dimalate, pentaerythritol dimalate and sorbitol tetramalate.

Other preferred examples of esters employable herein include aliphatic alcohol-based esters as disclosed in JP-B-46-27926, JP-B-51-47334and JP-A-57-196231, esters having an aromatic skeleton as disclosed in JP-A-59-5240, JP-A-59-5241 and JP-A-2-226149, and esters having an amino group as disclosed in JP-A-1-165613. Further, the aforementioned ester monomers may be used in admixture.

Specific examples of monomer of amide of aliphatic polyvalent amine compound with unsaturated carboxylic acid include methylenebis-acrylamide, methylenebis-methacrylamide, 1,6-hexamethylenebis-acrylamide, 1,6-hexamethylenbis-methacrylanide, diethylene triamine trisacrylamide, xylylene bisacrylamnide, and xylylene bismethacrylamide. Other preferred examples of amide-based monomers include those having a cyclohexylene structure as disclosed in JP-B-54-21726.

Urethane-based addition-polymerizable compounds produced by the addition reaction of isocyanate with hydroxyl group can be used as well. Specific examples of the urethane-based addition-polymerizable compounds employable herein include vinyl urethane compound containing two or more polymerizable vinyl groups per molecule obtained by adding a vinyl monomer having a hydroxyl group represented by the following formula (II) to a polyisocyanate compound having two or more isocyanate groups per molecule as disclosed in TP-B-48-4170.

$$CH_2{=}C(R^4)COOCH_2CH(CHR^5)OH \qquad (II)$$

wherein $R^4$ and $R^5$ each represents H or $CH_3$.

Further, urethane acrylates as disclosed in JP-A-51-37193, JP-B-2-32293 and JP-B-2-16765 and urethane compounds having an ethylene oxide-based skeleton as disclosed in JP-B-58-49860, JP-B-56-17654, JP-B-62-39417and JP-B-62-39418 are desirable. Moreover, the use of addition-polymerizable compounds having an amino structure or sulfide structure in its molecule as disclosed in JP-A-63-277653, JP-A-63-260909 and JP-A-1-105238 makes it possible to obtain a photopolymerizable composition having an extremely high photosensitizing speed.

Other examples of esters employable herein include polyfunctional acrylates or methacrylates such as polyester acrylates as disclosed in JP-A-48-64183, JP -B-49-43191 and JP-B-52-30490 and epoxy acrylates obtained by the reaction of epoxy resin with (meth)arylic acid. Further examples of esters employable herein include unsaturated compounds as disclosed in JP-B-46-43946, JP-B-1-40337 and JP-B-1-40336, and vinylphosphonic acid-based compounds as disclosed in JP-A-2-25493. In some cases, a structure containing a perfluoroalkyl group as disclosed in JP-A-61-22048can be used. Moreover, those referred to as "photo-setting monomer" or "photo-setting oligomer" in Journal of Japan Adhesive Industry Association, vol. 20, No. 7, pp. 300–308, 1984 can be used as well.

Referring to these addition-polymerizable compounds, their structure and details of direction such as which they are used singly or in combination and added amount can be arbitrarily predetermined according to the required performance of the final lithographic printing plate precursor. For example, these factors may be predetermined from the following standpoints of view.

In respect of sensitivity, a structure having a great content of unsaturated groups per molecule is desirable. In many cases, bifunctional or higher structure is desirable. In order to enhance the strength of the image area, i.e., hardened layer, a trifunctional or higher structure is preferably used. Further, a method which comprises the combined use of structures having different functionalities and polymerizable groups (e.g., acrylic acid ester, methacrylic acid ester, styrene-based compound, vinylether-based compound) to adjust both sensitivity and strength is useful.

Also for the compatibility and dispersibility with other components (e.g., binder polymer, initiator, colorant) in the image-forming layer, the selection of and how to use addition-polymerizable compounds are important factors. For example, the use of a low purity compound or the combined use of two or more addition-polymerizable compounds can enhance the compatibility with other components. Moreover, a specific structure can be selected for the purpose of enhancing the adhesion of the substrate, overcoat layer described later, etc.

The addition-polymerizable compounds are preferably used in an amount of from 5 to 80% by weight, more preferably from 25 to 75% by weight based on the nonvolatile content in the image-forming layer. These addition-polymerizable compounds may be used singly or in combination of two or more thereof. In addition, referring to how to use the addition-polymerizable compounds, a proper structure and blended or added amount can be arbitrarily predetermined from the standpoint of magnitude of inhibition of polymerization with respect to oxygen, resolution, foggability, change of refractivity, surface adhesivity, etc. In some cases, a layer structure/coating method such as undercoating and overcoating can be executed.

In an embodiment of implementation of the invention, in the case where the hydrophilic support is a silicate-treated aluminum support, the polymerizable compound contained in the image-forming layer may contain a compound (specific functional group-containing compound) containing at least one functional group (specific functional group) which interacts with the surface of the silicate-treated aluminum support. Examples of such a specific functional group include groups capable of undergoing interaction such as covalent bonding, ionic bonding, hydrogen bonding, polar interaction and van der Waals interaction with Si—OH, Si—$O^-$, $Al^{3+}$, etc. on the surface of the silicate-treated aluminum support.

Specific examples of these functional groups will be given below.

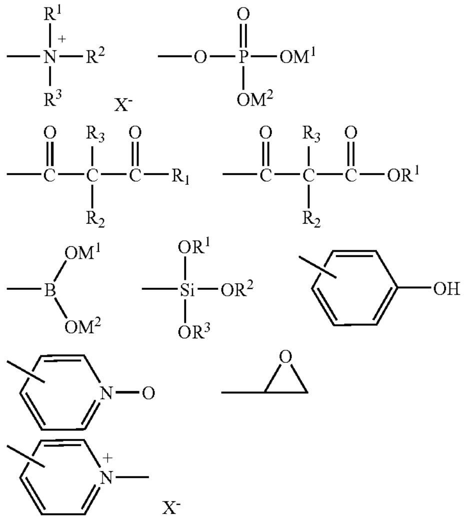

wherein $R^1$ to $R^3$ each independently represent a hydrogen atom, alkyl group, aryl group, alkinyl group or alkenyl group; $M^1$ and $M^2$ each independently represent a hydrogen atom, metal atom or connecting group; and $X^-$ represents a counter anion.

Preferred among these functional groups are onium salt groups such as ammonium group and pyridinium group, and β-diketone groups such as phosphoric acid ester group, boric acid group and acetylacetone group.

The aforementioned specific functional group-containing compound is preferably an addition-polymerizable compound further having at least one ethylenically unsaturated double bond as a polymerizable group. Specific examples of such an addition-polymerizable compound will be given below, but the invention is not limited thereto.

(1)

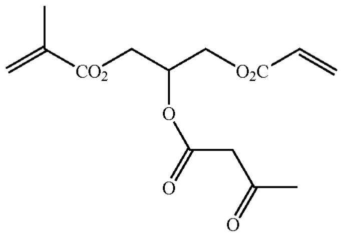

(2)

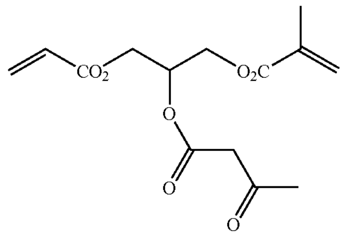

(3)

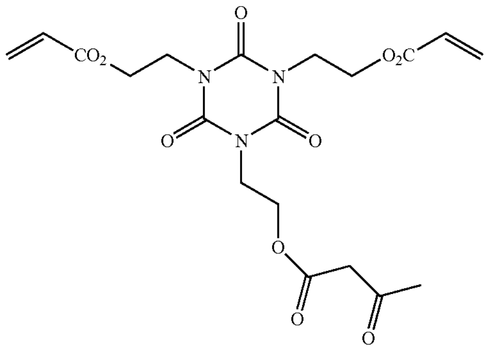

(4)

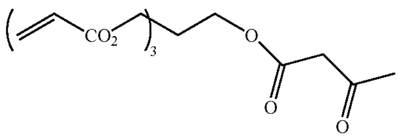

-continued
(5)
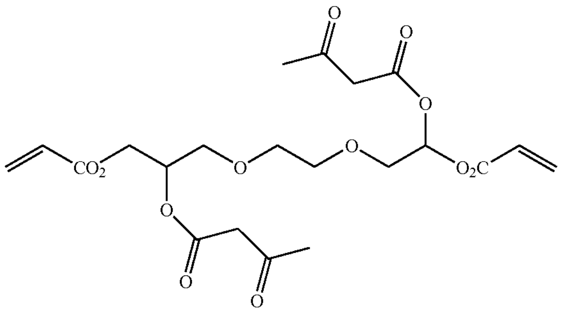
(6)
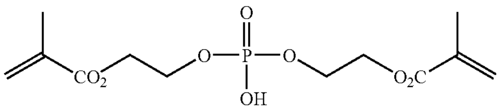
(7)
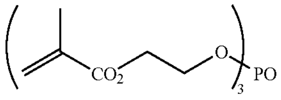
(8)
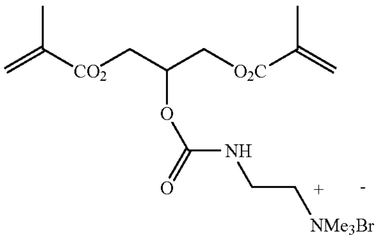
(9)
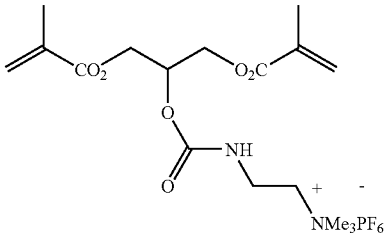
(10)
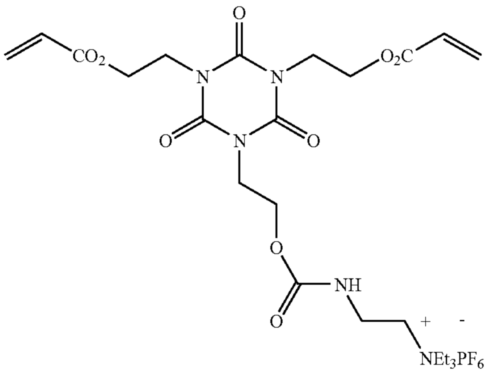
(11)
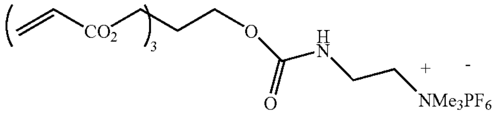
(12)
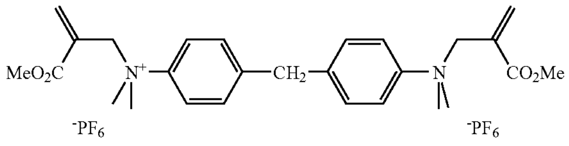
(13)
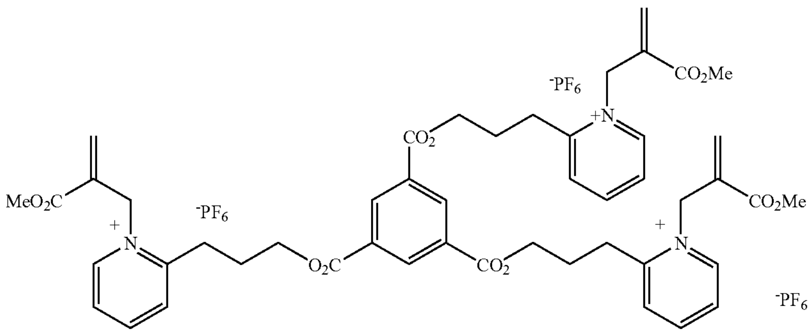

-continued (14)

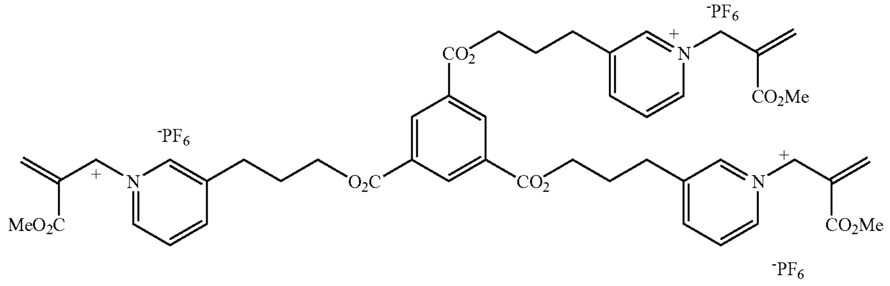

(15)

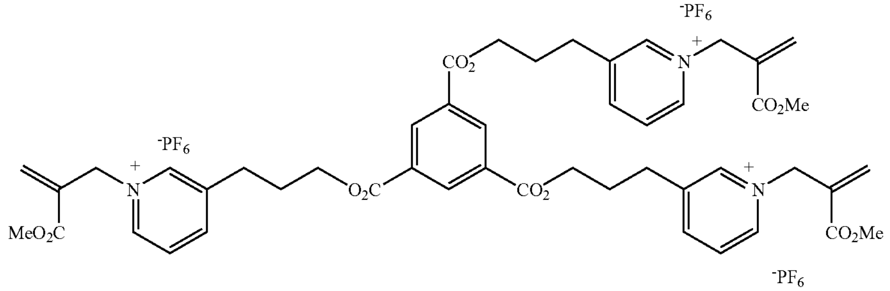

(16)

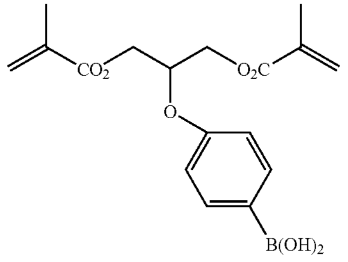

(17)

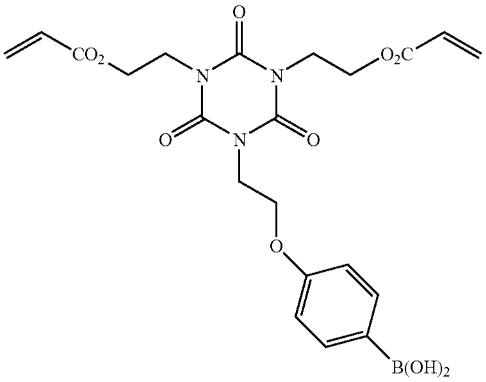

In the aforementioned embodiment that as the hydrophilic support there is used a silicate-treated aluminum support, the aforementioned specific functional group-containing compound is preferably incorporated in the image-forming layer in an amount of from 5 to 80% by weight, more preferably from 25 to 75% by weight. These specific functional group-containing compounds may be used singly or in combination of two or more thereof.

In the aforementioned embodiment that as the hydrophilic support there is used a silicate-treated aluminum support, the image-forming layer of the invention may comprise the aforementioned polymerizable compound free of specific functional group incorporated therein in combination with the aforementioned specific functional group-containing compounds. In this case, the content of the polymerizable compound tree of specific functional group is preferably 50% or less of the total weight of the polymerizable compounds to assure interaction with the surface of the support.

[Binder Polymer]

In the invention, a binder polymer may be used to enhance the film properties and on-the-machine developability of the image-forming layer.

As the binder polymer to be used in the invention there may be used any of compounds known as such in the art without any limitation, preferably a linear organic polymer having film-forming properties. Examples of such a binder polymer include acrylic resins, polyvinyl acetal resins, polyurethane resins, polyurea resins, polyimide resins, polyamide resins, epoxy resins, methacrylic resins, polystyrene-based resins, novolak type phenolic resins, polyester resins, synthetic rubbers, and natural rubbers.

The binder polymer preferably is crosslinkable to enhance the film strength of the image area. In order to render the binder polymer crosslinkable, a crosslinkable functional group such as ethylenically unsaturated bond may be introduced into the main chain or side chains of the polymer. The introduction of the crosslinkable functional group may be carried out by copolymerization.

Examples of the polymer having an ethylenically unsaturated bond in the main chain of the molecule include poly-1,4-butadiene, and poly-1,4-isoprene.

Examples of the polymer having an ethylenically unsaturated bond in the side chains of the molecule include polymers of acrylic or methacrylic acid ester or amide wherein the ester or amide residue (R in —COOR or —CONHR) has an ethylenically unsaturated bond.

Examples of the residue (R as described above) having an ethylenically unsaturated bond include $—(CH_2)_n CR^1═CR^2R^3$, $—(CH_2)_nCH_2CR^1═CR^2R^3$, $—(CH_2CH_2O)_n CH_2CR^1═CR^2R^3$, $—(CH_2)_nNH—CO—O—CH_2CR^1═CR^2CR^3$, $—(CH_2)_n—O—CO—CR═CR^2R^3$, and $—(CH_2CH_2O)_2—X$ (in which $R^1$ to $R^3$ each represent a hydrogen atom, halogen atom or $C_1$–$C_{20}$ alkyl, aryl, alkoxy or aryloxy group; $R^1$ may be connected to $R^2$ or $R^3$ to form a ring; n represents an integer of from 1 to 10; an dX represents a dicyclopentadienyl residue).

Specific examples of the ester residue include $—CH_2CH═CH_2$ (as disclosed in JP-B-7-21633), $—CH_2CH_2O—CH_2CH═CH_2$, $—CH_2C(CH_3)═CH_2$, $—CH_2CH═CH—C_6H_5$, $—CH_2CH_2OCOCH═CH—C_6H_5$, $—CH_2CH_2—NHCOO—CH_2CH═CH_2$, and $—CH_2CH_2O—X$ (in which X represents a dicyclopentadienyl residue).

Specific examples of the amide residue include $—CH_2CH═CH_2$, $—CH_2CH_2—Y$ (in which Y represents a cyclohexene residue), and $—CH_2CH_2—OCO—CH═CH_2$.

The crosslinkable binder polymer undergoes addition of a free radical (polymerization-initiating radical or radical growing during the polymerization of polymerizable compound) to its crosslinkable functional group, causing addition polymerization of polymers directly or via polymerization chain of polymerizable compound leading to the formation of crosslinking between polymer molecules. Thus, the crosslinkable binder polymer hardens. Otherwise, atoms (e.g., hydrogen atom on the carbon atom adjacent to the functional crosslinkable group) are extracted from the polymer by free radicals to produce polymer radicals which are then bonded to each other to form crosslinking between polymer molecules, causing the binder polymer to harden.

The content of the crosslinkable groups in the binder polymer (content of radical-polymerizable unsaturated double bonds as determined by iodometry) is preferably from 0.1 to 10.0 mmol, more preferably from 1.0 to 7.0 mmol, most preferably from 2.0 to 5.5 mmol per g of binder polymer. When the content of the crosslikable groups in the binder polymer falls within this range, a good sensitivity and a good storage stability can be obtained.

Further, from the standpoint of on-the-machine developability of unexposed area of image-forming layer, the binder polymer preferably has a high solubility or dispersibility in the ink and/or fountain solution.

In order to enhance the solubility or dispersibility of the binder polymer in the ink, the binder polymer is preferably oleophilic. On the contrary, in order to enhance the solubility or dispersibility of the binder polymer in the fountain solution, the binder polymer is preferably hydrophilic. Therefore, it is also effective in the invention to use an oleophilic binder polymer and a hydrophilic binder polymer in combination.

Preferred examples of the hydrophilic binder polymer employable herein include those having a hydrophilic group such as hydroxyl group, carboxyl group, carboxylate group, hydroxyethyl group, polyxoyethyl group, hydroxypropyl group, polyoxypropyl group, amino group, aminoethyl group, aminopropyl group, ammonium group, amide group, carboxymethyl group, sulfonate group and phosphate group.

Specific examples of these binder polymers include gum Arabic, casein, gelatin, starch derivatives, carboxymethyl cellulose, sodium salts thereof, cellulose acetate, sodium alginate, vinyl acetate- maleic acid copolymers, styrene-maleic acid copolymers, polyacrylic acids, salts thereof, polymethacrylic acids, salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzable polyvinyl acetates having a hydrolyzability of 60% by weight or more, preferably 80% by weight or more, polyvinyl formal, polyvinyl butyral, polyvinyl pyrrolidone, homopolymers and copolymers of acrylamide, homopolymers and polymers of methacrylamide, homopolymers and copolymers of N-methylolacrylamide, polyvinylpyrrolidone, alcohol-soluble nylon, and polyether of 2,2-bis-(4-hydroxyphenyl)-propane with epichlorohydrin.

The binder polymer preferably has a weight-average molecular weight of 5,000 or more, more preferably from 10,000 to 300,000, or preferably has a number-average molecular weight of 1,000 or more, more preferably from 2,000 to 250,000. The binder polymer preferably has a polydispersibility (weight-average molecular weight/number-average molecular weight) of from 1.1 to 10.

The binder polymer may be in any form such as random polymer, block polymer and graft polymer, preferably random polymer.

The binder polymer can be synthesized by any known method. Examples of the solvent to be used in the synthesis of the binder polymer include tetrahydrofurane, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propylacetate, N,N-dimethylformamide, N,N-dimethyl acetamide, toluene, ethyl acetate, methyl lactate, ethyl lactate, dimethyl sulfoxide, and water. These solvents may be used singly or in admixture of two or more thereof.

As the radical polymerization initiator to be used in the binder polymer there may be used any known compound such as azo-based initiator and peroxide initiator.

These binder polymers may be used singly or in combination of two or more thereof.

The content of the binder polymers is preferably from 5 to 90% by weight, more preferably from 10 to 80% by weight, even more preferably from 30 to 70% by weight based on the total solid content in the image-forming layer. When the content of the binder polymers falls within this range, the resulting image area can be provided with a high strength and good image-forming properties.

Further, the polymerizable compounds and the binder polymers are preferably used at a weight ratio of from 1/9 to 7/3.

In the invention, some embodiments of the method of incorporating the aforementioned image-forming layer constituents and the other constituents described later in the image-forming layer may be employed. One of these embodiments is a molecule-dispersed image-forming layer obtained by spreading these constituents in the form of a solution in a proper solvent as described in JP-A-2002-287334. Another embodiment is a microcapsuled image-forming layer obtained by incorporating part or whole of the constituents in the image-forming layer in microcapsuled form as described in JP-A-2001-277740 and JP-A-2001-277742. Further, in the microcapsuled image-forming layer, the constituents may be incorporated outside the microcapsules. In order to obtain a better on-the-machine developability, the image-forming layer is preferably a microcapsuled image-forming layer.

In order to microcapsule the aforementioned image-forming layer constituents, any known method may be employed. Examples of method of producing microcapsule include a method utilizing coacervation as disclosed in U.S. Pat. Nos. 2,800,457 and 2,800,458, a method involving interfacial polymerization as disclosed in U.S. Pat. No. 3,287,154, JP-B-38-19574 and JP-B-42-446, a method involving the precipitation of polymer as disclosed in U.S. Pat. Nos. 3,418,250and 3,660,304, a method involving the use of isocyanate polyol wall material as disclosed in the U.S. Pat. No. 3,796,669, a method involving the use of isocyanate wall material as disclosed in U.S. Pat. No. 3,914,511, a method involving the use of urea-formaldehyde-based or urea-formaldehyde-resorcinol-based wall-forming material as disclosed in U.S. Pat. Nos. 4,001,140, 4,087,376, and 4,089,802, a method involving the use of wall material such as melamine-formaldehyde resin and hydroxyl cellulose as disclosed in U.S. Pat. No. 4,025,445, in situ method involving monomer polymerization as disclosed in JP-B-36-9163 and JP-B-51-9079, a spray drying method as disclosed in British Patent 930,422 and U.S. Pat. No. 3,111,407, and an electrolytic dispersion cooling method as disclosed in British Patents 952,807 and 967,074. However, the method is not limited to the above.

A preferred microcapsule wall to be used in the invention has a three-dimensional crosslinking and swells with a solvent. From this standpoint of view, the microcapsule wall-forming material is preferably a polyurea, polyurethane, polyester, polycarbonate, polyamide or mixture thereof, particularly polyurea or polyurethane. The microcapsule wall may have a compound having a cross linkable functional group such as binder polymer-introducible ethylenically unsaturated bond incorporated therein.

The average particle diameter of the aforementioned microcapsules is preferably from 0.01 to 3.0 μm, more preferably from 0.05 to 2.0 μm particularly from 0.10 to 1.0 μm. When the average particle diameter of the aforementioned microcapsules falls within this range, a good resolution and a good age stability can be obtained.

[Other Additives]

The image-forming layer of the invention may comprise additives other than the aforementioned components such as surface active agent, colorant, printing agent, polymerization inhibitor, higher aliphatic acid derivative, plasticizer, inorganic particulate material and low molecular hydrophilic compound incorporated therein. These additives may be incorporated in the image-forming layer in the form of molecular dispersion. If necessary, these additives maybe encapsulated in microcapsules together with the aforementioned polymerizable compounds.

[Surface Active Agent]

In the invention, the image-forming layer preferably comprises a surface active agent incorporated therein to enhance the on-the-machine developability thereof during the starting of printing and the surface properties of the coat. Examples of the surface active agent employable herein include nonionic surface active agents, anionic surface active agents, cationic surface active agents, amphoteric surface active agents, and fluorine-based surface active agents. These surface active agents may be used singly or in combination of two or more thereof.

As the nonionic surface active agent there may be used any known nonionic surface active agent without any particular limitation. Examples of the nonionic surface active agent employable herein include polyoxyethylene alkyl ethers, polyoxyethylene alkyl phenyl ethers, polyoxyethylene polystyryl phenyl ethers, polyoxyethylene polyoxypropylene alkyl ethers, partial esters of glycerin aliphatic acid, partial esters of sorbitan aliphatic acid, partial esters of pentaerythritol aliphatic acid, propylene glycol monoaliphatic acid esters, partial esters of sucrose aliphatic acid, partial esters of polyoxyethylene sorbitan aliphatic acid, partial esters of polyoxyethylene sorbitol aliphatic acid, polyethylene glycol aliphatic acid ester, partial esters of polyglycerin aliphatic acid polyoxyethylenated castor oils, partial esters of polyoxyethylene glycerin aliphatic acid, aliphatic acid diethanolamides, N,N-bis-2-hydroxyalkylamines, polyoxyethylene alkylamine, triethanolamine aliphatic acid ester, trialkylamine oxide, polyethylene glycol, and copolymer of polyethylene glycol with polypropylene glycol.

The anionic surface active agent to be used in the invention is not specifically limited. Any known anionic surface active agent maybe used. Examples of the anionic surface active agent employable herein include aliphatic acid salts, abietates, hydroxyalkanesulfonates, alkanesulfonates, dialkylsulfosuccinic acid esters, straight-chain alkylbenzenesulfonates, branched alkylbenzenesulfonates, alkylnaphthalenesulfonates, alkylphenoxypolyoxyethylenepropylsulfonates, polyoxyethylenealkylsulphenylethers, N-methyl-N-oleyltaurine sodium salts, N-alkylsulfosuccinic acid monoamide disodium salts, petroleum sulfonates, sulfated tallow oil, sulfuric acid esters of aliphatic acid alkylester, alkylsulfuric acid esters, polyoxyethylenealkylethersulfuric acid esters, aliphatic monoglyceride sulfuric acid esters, polyoxyethylenealkylphenylether sulfuric acid esters, polyoxyethylnestyril phelether sulfuric acid ester, alkylphosphoric acid esters, polyoxyethylenestyrylphenyletherphosphoric acid esters, polyoxyethylenealkylphenyletherphosphoric acid esters, partially saponified styrene/maleic anhydride copolymers, partially saponified olefin/maleic anhydride copolymers, and napthalenesulfonate-formalin condensates.

The cationic surface active agent to be used in the invention is not specifically limited. Any known cationic surface active agent may be used. Examples of the cationic surface active agent employable herein include alkylamine salts, quaternary ammonium salts, polyoxyethylenealkylamine salts, and polyethylene polyamine derivatives.

The amphoteric surface active agent to be used in the invention is not specifically limited. Any known amphoteric surface active agent may be used. Examples of the amphoteric surface active agent employable herein include carboxybetaines, aminocarboxylic acids, sulfobtaines, aminosulfuric acid esters, and imidazolines.

In the aforementioned surface active agents, the term "polyoxyethylene" maybe replaced by the term "polyoxyalkyelne" such as polyoxymethylene, polyoxypropylene and polyoxybutyrene. In the invention, these surface active agents may be used as well.

Even more desirable examples of the surface active agent include fluorine-based surface active agents having a perfluoroalkyl group in its molecule. Preferred examples of such a fluorine-based surface active agent employable herein include anionic surface active agents such as perfluoroalkylcarboxylate, perfluoroalkylsullonate and perfluoroalkylphophoric acid ester, amphoteric surface active agents such as perfluoroalkylbetaine, cationic surface active agents such as perfluooalkyl trimethyl ammonium salt such as perfluoroalkylamine oxide, and nonionic surface active agents such as perfluoroalkylamine oxide, perfluoroalkyl ethylene oxide adduct, oligomer having perfluoroalkyl group and hydroxyl group, oligomer having perfluoroalkyl group and oleophilic group, oligomer having perfluoroalkyl group, hydrophilic group and oleophilic group and urethane having perfloro-alkyl group and oleophilic group. Further, fluorine-based surface active agents as disclosed in JP-A-62-170950, JP-A-62-226143 and JP-A-60-168144 are preferably used.

These surface active agents may be used singly or in combination of two or more thereof.

The content of the surface active agents is preferably from 0.001 to 10% by weight, more preferably from 0.01 to 5% by weight based on the total solid content in the image-forming layer.

[Colorant]

In the invention, the image-forming layer may further comprise various compounds incorporated therein other than these additive as necessary. For example, dyes having a great absorption invisible light range may be used as image colorants. Specific examples of these dyes employable herein include Oil Yellow #101, Oil Yellow #103, Oil Pink #312, Oil Green BG, Oil Blue BOS, Oil Blue #603, Oil Black BY, Oil Black BS, Oil Black T-505 (produced by Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes disclosed in JP-A-62-293247. Further, dyes such as phthalocyanine-based dye, azo-based dye, carbon black and titanium oxide are preferably used.

The amount of these colorants to be incorporated in the image-forming layer is preferably from 0.01 to 10% by weight based on the total content in the image-recording material.

[Printing Agent]

In order to form a printed-out image, the image-forming layer of the invention may comprise a compound incorporated therein which changes its color when acted upon by an acid or radical. Examples of such a compound which can be used to advantage include various dyes such as diphenyl-methane-based dye, triphenylmethane-based dye, thiazine-based dye, oxazine-based dye, xanthene-based dye, anthraquinone-based dye, iminoquinone-based dye, azo-based dye and azomethine-based dye.

Specific examples of these dyes employable herein include dyes such as Brilliant Green, Ethyl Violet, Methyl Green, Crystal Violet, Basic Fuchsine, Methyl Violet 2B, Quinacridone Red, Rose Bengal, Metanil Yellow, Thymol Sulfophthalein, Xylenol Blue, Methyl Orange, Paramethyl Red, Congo Red, Benzopurpurine 4B, α-Naphthyl Red, Nile Blue 2B, Nile blue A, Methyl Violet, Malachite Green, Parafuchsine, Victoria Pure Blue BOH [produced by HODOGAYA CHEMICAL CO., LTD.], Oil Blue #603 [produced by Orient Chemical Industries, Ltd.], Oil Pink #312 [produced by Orient Chemical Industries, Ltd.], Oil Red 5B [produced by Orient Chemical Industries, Ltd.], Oil Scarlet #308 [produced by Orient Chemical Industries, Ltd.], Oil Red OG [produced by Orient Chemical Industries, Ltd.], Oil Red RR [produced by Orient Chemical Industries, Ltd.], Oil Green #502 [produced by Orient Chemical Industries, Ltd.], Spiron Red BEH Special [produced by HODOGAYA CHEMICAL CO., LTD.], m-Cresol Purple, Cresol Red, Rhodamine B, Rhodamine 6G, Sulfo Rhodamine B, Auramine, 4-p-diethylaminophenyliminon-aphthoquinone, 2-carboxyanilino-4-p-diethylaminophe-nylimino naphthoquinone, 2-carboxystearylamino-4-p-N,N-bis(hydroxyethyl)amino-phenyliminonaphthoquinone, 1-phenyl-3-methyl-4-p-diethylaminophenylimino-5-pyra-zolones and 1-β-naphthyl-4-p-diethylaminophenyl imino-5-pyrazolone, and leuco dyes such as p,p',p"-hexamethyltria-miotriphenylmethane (leucocrystal violet) and Pergascript Blue SRB (produced by Ciba Geigy Inc.).

Other examples of dyes employable herein include leuco dyes known as material of heat-sensitive paper and. pressure-sensitive paper. Specific examples of these leuco dyes employable herein include Crystal Violet Lactone, Malachite Green Lactone, Benzoyl Leuco Methylene Blue, 2-(N-phenyl-N-methylamino)-6-(N-p-tollyl-N-ethyl)amino-fluorane, 2-anilino-3-methyl-6-(N-ethyl-p-toluidino)fluorine, 3,6-dimethoxyfluorane, 3-(N,N-diethylamino)-5-methyl-7-(N,N-dibenzylamino)-fluorine, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorine, 3-(N,N-diethylamino)-7-chlorofluorane, 3-(N,N-diethylamino)-7-benzyl aminofluorane, 3-(N,N-diethylamino)-7,8-benzofluorane, 3-(N,N-dibutylanino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilinofluorane, 3,3-bis(1-ethyl-2-methyindole-3-il)phthalide, 3,3-bis(1-n-butyl-2-methylindole-3-il)phthalide, 3,3-bis(p-dimethylaminophenyl)-6-dimethyl aminophthalide, 3-(4-diethylamino-2-ethoxyphenyl)-3-(1-ethyl-2-methylindole-3-il)-4-xaphthalide, and 3-(4-diethylaminophenyl)-3-(1-ethyl-2-methylindole-3-il)phthalide.

The added amount of the dyes which changes its color when acted upon by an acid or radical are each from 0.01 to 10% by weight based on the solid content in the image-forming layer.

[Polymerization Inhibitor]

The image-forming layer of the invention preferably comprises a small amount of a heat polymerization inhibitor incorporated therein to inhibit unnecessary heat polymerization of radical-polymerizable compounds during the production or storage thereof.

Preferred examples of the heat polymerization inhibitor employable herein include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), and N-nitroso-N-phenylhydroxylamine aluminum salt.

The amount of the heat polymerization inhibitor to be incorporated is preferably from about 0.01 to 5% by weight based on the total solid content in the image-forming layer.

[Higher Aliphatic Acid Derivative]

The image-forming material of the invention may comprise a high aliphatic acid derivative such as behenic acid and behenic acid amide or the like incorporated therein so that it is mal-distributed on the surface of the image-forming layer during drying after spreading to prevent the inhibition of polymerization by oxygen. The amount of the higher aliphatic acid derivative to be incorporated is preferably from about 0.1 to 10% by weight based on the total solid content in the image-forming layer.

[Plasticizer]

The image-forming layer of the invention may comprise a plasticizer incorporated therein to enhance its on-the-machine developability.

Preferred examples of the plasticizer employable herein include phthalic acid esters such as dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate and diallyl phthalate, glycol esters such as dimethyl glycol phthalate, ethylphthalyl glycolate, methylphthalylethyl glycolate, butylphthalylbutyl glycolate and triethyleneglycol dicaprylic acid ester, phosphoric acid esters such as tricresyl phosphate and triphenyl phosphate, aliphatic dibasic acid esters such as diisobutyl adipate, dioctyl adipate, dimethyl sebacate, dibutyl sebacate, dioctyl azelate and dibutyl maleate, polyglycidyl methacrylate, trimethyl citrate, glycerintriacetyl ester and butyl laurate.

The content of the plasticizer is preferably about 30% by weight or less based on the total solid content in the image-forming layer.

[Inorganic Particulate Material]

The image-forming layer of the invention may comprise an inorganic particulate material incorporated therein to enhance the strength of hardened film on the image area and the on-the-machine developability of the non-image area.

Preferred examples of the inorganic particulate material employable herein include particulate silica, particulate alumina, particulate magnesium oxide, particulate titanium oxide, particulate magnesium carbonate, particulate calcium alginate, and mixture thereof. These inorganic particulate materials may be used to reinforce the film and roughen the surface of the image-forming layer and hence enhance the interfacial adhesivity even if they are not capable of converting light to heat.

The inorganic particulate material preferably has an average particle diameter of from 5 nm to 10 μm, more preferably from 0.5 μm to 3 μm. When the average particle diameter of the inorganic particulate material falls within the above defined range, the inorganic particulate material can be dispersed in the image-forming layer in a stable manner to keep the strength of the image-forming layer sufficiently high, making it possible to form a non-image area having an excellent hydrophilicity which is little subject to stain during printing.

The aforementioned inorganic particulate material can be easily available as a commercial product such as colloidal silica dispersion.

The content of the inorganic particulate material is preferably 20% by weight or less, more preferably 10% by weight or less based on the total solid content in the image-forming layer.

[Low Molecular Hydrophilic Compound]

The image-forming layer of the invention may comprise a hydrophilic low molecular compound incorporated therein to enhance the on-the-machine developability thereof. Examples of the hydrophilic low molecular compound employable herein include water-soluble organic compounds such as glycol (e.g., ethylene glycol, diethylene glycol, triethylene glycol, propylene glycol, dipropylene glycol, tripropylene glycol) and ether or ester derivatives thereof, polyhydroxys (e.g., glycerin, pentaerythritol), organic amines (e.g., triethanolamine, diethanolamine, monoethanolamine) and salts thereof, organic sulfonic acids (e.g., toluenesulfonic acid, benzenesulfonic acid) and salts thereof, organic phosphonic acids (e.g., phenylphosphonic acid) and salts thereof, and organic carboxylic acids (e.g., tartaric acid, oxalic acid, citric acid, malic acid, lactic acid, gluconic acid, amino acid) and salts thereof.

[Formation of Image-Forming Layer]

The image-forming layer of the invention is formed by coating a coating solution obtained by dispersing or dissolving the aforementioned necessary components in a solvent. Examples of the solvent employable herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyl lactone, toluene, and water. However, the invention is not limited to these solvents. These solvents may be used singly or in admixture. The solid concentration of the coating solution is preferably from 1 to 50% by weight.

The image-forming layer of the invention may be formed also by preparing a coating solution having the same or different ones of the aforementioned components dispersed or dissolved in the same or different solvents in a plurality of portions, and then repeatedly spreading the coating solution over a support and drying the coat.

The spread of the image-forming layer (solid content) on the support obtained after spreading and drying depends on the purpose but is preferably from 0.3 to 3.0 $g/m^2$. When the spread of the image-forming layer falls within this range, the resulting lithographic printing plate precursor can be provided with a good sensitivity and good film properties of image-forming layer.

The spreading of the image-forming layer coating solution can be carried out by any of various methods. Examples of the spreading method employable herein include bar coating method, rotary coating method, spray coating method, curtain coating method, dip coating method, air knife coating method, blade coating method, and roll coating method.

[Support]

The support to be used for the lithographic printing plate precursor of the invention is not specifically limited as long as hydrophilic but is a dimensionally stable sheet-like material. Examples of such a sheet-like material include paper, paper laminated with a plastic (e.g., polyethylene, polypropylene, polystyrene), metal sheet (e.g., aluminum, zinc, copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), and paper or plastic film having the aforementioned metal laminated or vacuum-deposited thereon. The support of the invention is preferably a polyester film or aluminum sheet. Particularly preferred among these support materials is aluminum sheet, which has a good dimensional stability and is relatively inexpensive. Even more desirable is an aluminum support treated with, e.g., an alkaline metal silicate.

The aluminum sheet to be used in the invention is a pure aluminum sheet, an alloy sheet comprising aluminum as a main component and a slight amount of foreign elements or a thin aluminum or aluminum alloy sheet laminated with a plastic. Examples of the foreign elements to be incorporated in the aluminum alloy include silicon, iron, manganese, copper, magnesium, chromium, zinc, bismuth, nickel, and titanium. The content of foreign elements in the alloy is preferably 10% by weight or less. In the invention, a pure aluminum sheet is preferred. However, since completely pure aluminum can be difficultly produced from the standpoint of refining technique, the aluminum sheet may contain a slight amount of foreign elements. Thus, the aluminum sheet to be used in the invention is not specifically limited in its composition. An aluminum sheet made of material which has heretofore been known can be properly used.

The thickness of the support to be used herein is from about 0.1 mm to 0.6 mm, preferably from about 0.15 mm to 0.4 mm, even more preferably from about 0.2 mm to 0.3 mm.

Prior to use, the aluminum sheet is preferably subjected to surface treatment such as roughening and anodization. When subjected to surface treatment, the aluminum sheet can be easily provided with an enhanced hydrophilicity and a good adhesion to the image-forming layer and the support. Prior to roughening, the aluminum sheet is optionally subjected to degreasing with a surface active agent, an organic solvent, an alkaline aqueous solution or the like for the purpose of removing a rolling oil from the surface thereof.

The surface treatment of the surface of the aluminum sheet may be carried out by various methods. Examples of these surface treatment methods employable herein include mechanical roughening, electrochemical roughening (roughening involving electrochemical dissolution of surface), and chemical roughening (roughening involving chemical selective dissolution of surface).

As the mechanical roughening method there may be used any known method such as ball polishing, brush polishing, blast polishing and buff polishing.

As the electrochemical roughening method there may be used, e.g., ac or dc electrochemical roughening in an electrolyte containing an acid such as hydrochloric acid and nitric acid. Alternatively, a method involving the use of a mixed acid as disclosed in JP-A-54-63902 may be employed.

The aluminum sheet thus roughened is subjected to alkaline etching with an aqueous solution of potassium hydroxide, sodium hydroxide or the like as necessary, neutralized, and then optionally subjected to anodization to enhance the abrasion resistance thereof.

As the electrolyte to be used in the anodization of the aluminum sheet there may be used any of various electrolytes capable of forming a porous oxide film. Sulfuric acid, hydrochloric acid, oxalic acid, chromic acid or mixture thereof is normally used. The concentration of these electrolytes may be properly determined by their kind.

The anodization conditions vary with the kind of the electrolyte used and thus cannot be unequivocally predetermined. In general, the electrolyte concentration, electrolyte temperature, current density, voltage and electrolysis time are preferably from 1 to 80% by weight, from 5° C. to 70° C., from 5 to 60 $A/dm^2$, from 1 to 100 V and from 10 seconds to 5 minutes, respectively. The amount of the anodized film thus formed is preferably from 1.0 to 5.0 $g/m^2$, more preferably from 1.5 to 4.0 $g/m^2$. When the amount of the anodized film falls within this range, the resulting aluminum sheet can be provided with a good scratch resistance, making it possible to provide the non-image area on the lithographic printing plate with a good scratch resistance.

The hydrophilic treatment of the aluminum support with a silicate, if conducted, is conducted after the aforementioned anodization. This hydrophilic treatment method involves dipping or electrolysis of the support in an aqueous solution of sodium silicate. For the details of this hydrophilic treatment method, reference can be made to U.S. Pat. Nos. 2,714,066, 3,181,461, 3,280,734 and 3,902,734. When subjected to this hydrophilic treatment, the aluminum support can be provided with an enhanced surface hydrophilicity, resulting in the production of a lithographic printing plate precursor having an enhanced stain resistance during printing, e.g., no background stain on the non-image area, expansion of water allowance. At the same time, the resulting image-forming layer can be more easily removed, making it possible to rapidly obtain a good printed matter particularly by the on-the-machine development method.

The amount of the silicate to be attached to the surface of the aluminum sheet is preferably 1 $mg/m^2$ or more, more preferably 2 $mg/m^2$ or more, most preferably from 3 $mg/m^2$ to less than 10 $mg/m^2$ as calculated in terms of Si element. The upper limit of the amount of the silicate is 30 $mg/m^2$, more preferably less than 20 $mg/m^2$. When the amount of the silicate falls within this range, sufficient interaction can occur, making it possible to obtain a good adhesion.

As the support to be used in the invention there may be used the aforementioned surface-treated anodized support as it is or after subjected to silicate treatment. However, in order to further improve the adhesion with upper layer, hydrophilicity, stain resistance, heat insulation, etc., the support may be subjected to treatment properly selected from the group consisting of treatment for expansion of micropores in anodized film, treatment for closure of micropores and surface hyrophilicization treatment involving dipping in an aqueous solution containing a hydrophilic compound as disclosed in JP-A-2001-253181 and JP-A-2001-322365 as necessary.

As the hydrophilicization treatment there may be used an alkaline metal silicate method as disclosed in U.S. Pat. Nos. 2,714,066, 3,181,461, 3,280,734 and 3,902,734. This method involves dipping or electrolysis of the support in an aqueous solution of sodium silicate or the like. Other examples of the hydrophilicization treatment employable herein include a method involving the treatment with potassium zirconate fluoride as disclosed in JP-B-36-22063, and a method involving the treatment with a polyvinylphosphonic acid as disclosed in U.S. Pat. Nos. 3,276,868, 4,153,461 and 4,689,272.

In the case where as the support of the invention there is used a support having an insufficient hydrophilicity such as polyester film, the support is preferably coated with a hydrophilic layer to render the surface thereof hydrophilic. Preferred examples of the hydrophilic layer employable herein include a hydrophilic layer obtained by spreading a coating solution containing a colloid of an oxide or hydroxide of at least one element selected from the group consisting of beryllium, magnesium, aluminum, silicon, titanium, boron, germanium, tin, zirconium, iron, vanadium, antimony and transition metals as disclosed in JP-A-2001-199175, a hydrophilic layer having an organic hydrophilic matrix obtained by crosslinking or pseudo-crosslinking an organic hydrophilic polymer as disclosed in JP-A-2002-79772, a hydrophilic layer having an inorganic hydrophilic matrix obtained by sol-gel conversion involving the hydrolysis and condensation reaction of a polyalkoxysilane, titanate, zirconate or aluminate, and a hydrophilic layer made of a thin inorganic layer having a surface containing a metal oxide. Preferred among these hydrophilic layers is the hydrophilic layer obtained by spreading a coating solution containing a colloid of silicon oxide or hydroxide.

In the case where as the support of the invention there is used a polyester film or the like, the support preferably comprises an antistatic layer provided either or both on the hydrophilic layer side thereof and on the side thereof opposite the hydrophilic layer. In the case where the antistatic layer is provided interposed between the support and the hydrophilic layer, it also contributes to the enhancement of the adhesion to the hydrophilic layer. As the antistatic layer there may be used a polymer layer having a particulate metal oxide or matting agent dispersed therein as disclosed in JP-A-2002-79772.

The support to be used in the invention preferably has a central line-average roughness of from 0.10 to 1.2 μm. When the central line-average roughness of the support falls within this range, the resulting support can be provided with a good adhesion to the image-forming layer, a prolonged press life and a good stain resistance.

The color density of the support is preferably from 0.15 to 0.65 as calculated in terms of reflection density. When the color density of the support falls within this range, the resulting anti-halation effect makes it possible to provide good image-forming properties during imagewise exposure and good inspectability after development.

[Backcoat Layer]

The support which has thus been subjected to surface treatment or has thus a subbing layer formed thereon may then have a backcoat layer provided on the back side thereof as necessary.

Preferred examples of the backcoat layer employable herein include a layer made of an organic polymer compound as disclosed in JP-A-5-45885, and a layer made of a metal oxide obtained by the hydrolysis or polycondensation of an organic metal compound or inorganic metal compound as disclosed in JP-A-6-35174. In particular, silicon alkoxy compounds such as $Si(OCH_3)_4$, $Si(OC_2H_5)_4$, $Si(OC_3H_7)_4$ and $Si(OC_4H_9)_4$ are used to advantage because they are inexpensive and easily available.

[Subbing Layer]

In the lithographic printing plate precursor of the invention to be used in the lithographic printing method of the invention, if needed a subbing layer may be provided interposed between the image-forming layer and the support. It is advantageous in that the subbing layer acts as a heat insulating barrier that prevents heat generated by exposure by infrared laser beam from being diffused into the support and allows the efficient use of the heat, making it possible to provide a higher sensitivity. Further, the subbing layer makes it easy for the image-forming layer to be peeled off the support on the unexposed area, enhancing the on-the-machine developability of the lithographic printing plate precursor.

Preferred examples of the subbing layer employable herein include silane coupling agents having an addition-polymerizable ethylenically double bond reactive group as disclosed in JP-A-10-282679, and phosphorus compounds having an ethylenically double bond reactive group.

The spread (solid content) of the subbing layer is preferably from 0.1 to 100 $mg/m^2$, more preferably from 3 to 30 $mg/m^2$.

[Protective Layer]

In the lithographic printing plate precursor of the invention to be used in the lithographic printing method of the invention, the image-forming layer may have a protective layer provided thereon as necessary to prevent the occurrence of scratch, etc. on the image-forming layer and ablation during high luminance laser exposure and block oxygen.

In the invention, exposure is normally conducted in the atmosphere. The protective layer acts to prevent low molecular compounds such as oxygen and basic material present in the atmosphere that inhibit the image forming reaction caused by exposure in the image-forming layer from entering in the image-forming layer and hence prevent the inhibition of the image forming reaction by exposure in the atmosphere. Accordingly, the protective layer is required to have a low permeability to low molecular compounds such as oxygen. More preferably, the protective layer has a good transmission of light used in exposure and an excellent adhesion to the image-forming layer and can be easily removed at the on-the-machine development step after exposure. Various studies have long been made of protective layer having these properties. For the details of these studies, reference can be made to U.S. Pat. No. 3,458,311 and JP-A-55-49729.

As the material of the protective layer there may be used a water-soluble polymer compound having a relatively excellent crystallinity. Specific examples of the water-soluble polymer compound employable herein include water-soluble polymers such as polyvinyl alcohol, polyvinylpyrrolidone, acidic cellulose, gelatin, gum Arabic and polyacrylic acid. In particular, the use of polyvinyl alcohol (PVA) as a main component makes it possible to give the best results with respect to basic properties such as oxygen barrier properties and development removability. The polyvinyl alcohol may be partly substituted by ester, ether or acetal and may partly have other copolymerizable components so far as it has unsubstituted vinyl alcohol units for rendering the protective layer with necessary oxygen barrier properties and water solubility.

Examples of the polyvinyl alcohol employable herein include those having a polymerization degree of from 300 to 2,400 which have been hydrolyzed in a proportion of from 71 to 100%. Specific examples of these polyvinyl alcohols include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 made by KURARAY CO., LTD.

The constituents (e.g., selection of PVA, use of additives) of the protective layer, the spread of the protective layer coating solution, etc. are properly predetermined taking into account foggability, adhesion, scratch resistance, etc., besides oxygen barrier properties and development removability. In general, the higher the percent hydrolysis of PVA is (i.e., the higher the content of unsubstituted vinyl alcohol units in the protective layer is) or the greater the thickness of the protective layer is, the better are the oxygen barrier properties to advantage from the standpoint of sensitivity. In order to prevent the occurrence of unnecessary polymerization reaction during production or storage or unnecessary fogging and thickening of line image during imagewise exposure, the oxygen permeability is preferably not too high. Accordingly, the oxygen permeability A at 25° C. and 1 atm is preferably from not smaller than 0.2 to not greater than 20 ($cc/m^2$.day).

Glycerin, dipropylene glycol or the like may be incorporated as other constituents of the protective layer in an amount of few percents by weight based on the weight of the (co)polymer to render the protective layer flexible. Further, an anionic surface active agent such as sodium alkylsulfate and sodium alkylsulfonate, an amphoteric surface active agent such as alkylaminocarboxylate and alkylaminodicarboxylate and a nonionic surface active agent such as polyoxyethylene alkyl phenyl ether may be incorporated in the protective layer in an amount of few percents by weight based on the weight of the (co)copolymer.

The thickness of the protective layer is preferably from 0.05 μm to 5 μm, particularly from 0.1 μm to 2 μm.

The adhesion to the image area, scratch resistance, etc. are extremely important from the standpoint of handleability of lithographic printing plate precursor. In other words, when the protective layer, which comprises a water-soluble polymerizable compound and thus is hydrophilic, is laminated on the image-forming layer, which is oleophilic, the lack of adhesion causes the protective layer to be easily peeled, occasionally resulting in the occurrence of detectives such as malhardening due to inhibition of polymerization by oxygen at the peeled area.

In order to improve the adhesion between the image-forming layer and the protective layer, various proposals have been made. For example, JP-A-49-70702 and British Patent Application No. 1,303,578 disclose that the lamination of a hydrophilic polymer mainly composed of a polyvinyl alcohol mixed with from 20 to 60% by weight of an acrylic emulsion, a water-insoluble vinyl pyrrolidone-vinyl acetate copolymer, etc. on the image-forming layer makes it possible to obtain sufficient adhesion. In the invention, all these known techniques may be employed. For the details of the method of spreading the protective layer coating solution, reference can be made to U.S. Pat. No. 3,458,311 and JP-A-55-49729.

Further, the protective layer maybe provided with other functions. For example, the addition of a colorant (e.g., water-soluble dye) which fairly transmits infrared rays used in exposure but absorbs light having other wavelength ranges efficiently makes it possible to enhance safelight adaptability without causing sensitivity drop.

[Exposure]

As the light source used for exposing the lithographic printing plate precursor of the present invention, any publicly known one can be adopted without specific restriction. A preferable light source emits light with a wavelength of from 300 to 1200 nm; specifically, various lasers are preferably used as the light source, and, in particular, an infrared laser emitting light with a wavelength of from 760 to 1200 nm is preferably used.

As the exposure mechanism, any of the internal drum-type, external drum-type and flat bed-type ones may be used. Other light sources for exposing the lithographic printing plate precursor of the invention include ultra-high pressure, high pressure, medium pressure and low pressure mercury lamps, a chemical lamp, a carbon arc lamp, a xenon lamp, a metal halide lamp, a fluorescent lamp, a tungsten lamp and sunlight.

[Printing]

The lithographic printing method used the lithographic printing plate precursor of the present invention aren't specifically limited. For example, the lithographic printing plate precursor is performed the imagewise exposure with laser, e.g. infrared laser beam, as mentioned above, and then supplied with an oil-based ink and an aqueous ink for printing without passing through any development step.

Specific examples of the lithographic printing method employable herein include a method which comprises performing the exposure on the lithographic printing plate precursor with laser, and then mounting the lithographic printing plate precursor on the printing machine for printing without passing through any development step, and a method which comprises mounting the lithographic printing plate precursor on the printing machine, performing the exposure on the lithographic printing plate precursor with laser on the printing machine, and then effecting printing using the light-transmitting without passing any development step.

When the lithographic printing plate precursor which has been imagewise exposed to laser is supplied with an aqueous ink and an oil-based ink for printing without passing any development step such as a wet developing method, the image-forming layer which has been hardened by exposure forms an oil-based ink-receiving area having a oleophilic surface on the exposed area thereof. On the other hand, on the unexposed area, the aqueous component and/or oil-based ink thus supplied causes the unhardened image-forming layer to be dissolved or dispersed away so that a hydrophilic surface is exposed.

As a result, the aqueous component is attached to the hydrophilic surface thus exposed while the oil-based ink is attached to the image-forming layer on the exposed area. Printing is then started. At this first stage, either the aqueous component or the oil-based ink may be supplied onto the surface of the printing plate. As the aqueous component and the oil-based ink there may be used fountain solution and printing ink for ordinary lithographic printing, respectively.

Thus, the lithographic printing plate precursor of the invention is subjected to development on the offset printing machine, and then used as it is to print on a large number of sheets of paper.

EXAMPLES

The invention will be further described in the following examples, but the invention should not be construed as being limited thereto.

Example 1

(1) Preparation of Support

<Aluminum Sheet>

An aluminum sheet (material: 1050) having a thickness of 0.3 mm was subjected to degreasing with a 10 wt-% aqueous solution of sodium aluminate at 50° C. for 30 seconds, grained on the surface thereof with an aqueous suspension of pumice having a median diameter of 25 μm (specific gravity: 1.1 g/cm$^3$) using three bundle-planted nylon brushes having a hair diameter of 0.3 mm, and then thoroughly washed with water to remove a rolling oil from the surface thereof. The aluminum sheet thus treated was dipped in a 25% aqueous solution of sodium hydroxide having a temperature of 45° C. for 9 seconds to undergo etching, washed with water, dipped in a 20% sulfuric acid having a temperature of 60° C. for 20 seconds, and then washed with water. The etched amount of the grained surface of the aluminum sheet was about 3 g/m$^2$.

Subsequently, the aluminum sheet was continuously subjected to electrochemical roughening with 60 Hz ac voltage. The electrolyte used in the electrochemical roughening was a 1 wt-% aqueous solution of nitric acid (containing 0.5% by weight of aluminum ion). The temperature of the electrolyte was 50° C. The waveform of the ac voltage was trapezoid wherein the time TP required until the current reaches from zero to peak is 0.8 msec and the duty ratio is 1:1. With this rectangular ac voltage, the electrochemical roughening was effected using a carbon electrode as a counter electrode. As an auxiliary anode there was used ferrite. The current density was 30 $A/dm^2$ when the current was at peak. 5% of the current from the electric supply was branched to the auxiliary anode. The amount of electricity used in electrolysis with nitric acid was 175 $C/dm^2$, which was consumed during the anodization of the aluminum sheet.

Subsequently, the aluminum sheet was subjected to electrochemical roughening with a 0.5 wt-% aqueous solution of hydrochloric acid (containing 0.5% by weight of aluminum ion) having a temperature of 50° C. in the same manner as in electrolysis with nitric acid under the conditions such that the amount of electricity consumed during anodization of aluminum sheet is 50 $C./dm^2$, and then spray-washed with water. The aluminum sheet thus treated was subjected to dc anodization with a 15% sulfuric acid (containing 0.5% by weight of aluminum ion) as an electrolyte at a current density of 15 $A/dm^2$ to form an anodized layer in an amount of 2.5 $g/m^2$, washed with water, dried, and then treated with a 2.5 wt-% aqueous solution of sodium silicate at 30° C. for 10 seconds. The support thus prepared was then measured for central line-average roughness (Ra) using a needle having a diameter of 2 μm. The result was 0.51 μm.

(2) Formation of Image-Forming Layer

An image-forming layer coating solution (1) having the following formulation was spread over the aforementioned support using a bar coater, and then dried at 70° C. in an oven for 60 seconds to form an image-forming layer thereon in a dried spread of 0.8 $g/m^2$. Thus, a lithographic printing plate precursor was obtained.

| Image-forming layer coating solution (1) | |
|---|---|
| Water | 100 g |
| Microcapsule (1) having the following formula (as calculated in terms of solid content) | 5 g |
| Polymerization initiator (1) having the following general formula | 0.5 g |
| Fluorine-based surface active agent (1) having the following formula | 0.2 g |
| Example (7) of phosphonic acid compound | 0.2 g |

Polymerization initiator (1)

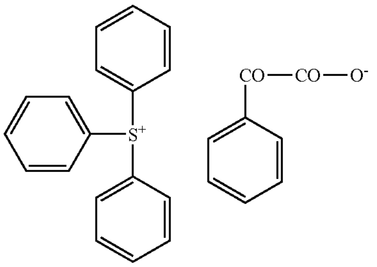

Fluorine-based surface active agent (1)

$-(CH_2CH)_{30}-$ $COOC_2H_4C_6F_{13}$

-continued

| Image-forming layer coating solution (1) |
| --- |

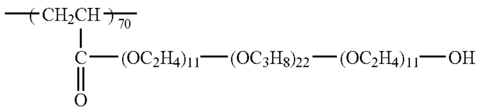

(Synthesis of Microcapsule (1))

In order to prepare an oil phase component, 10 g of an adduct of trimethylolpropane and xylylene diisocyanate (Takenate D-110N, produced by MITSUI TAKEDA CHEMICALS, INC.), 3.15 g of pentaerythritol triacrylate (SR444, produced by NIPPON KAYAKU CO., LTD.), 0.35 g of the following infrared absorbent (1), 1 g of 3-(N,N-diethylamino)-6-methyl-7-anilinofluorane (ODB, produced by YAMAMOTO KASEI) 0.1 g of Pionin A-41C (produced by Takemoto oil & Fat.) were dissolved in 17 g of ethyl acetate. As an aqueous phase component, 40 g of a 4 wt-% aqueous solution of FVA-205 was prepared. The oil phase component and the aqueous phase component were mixed, and then subjected to emulsification at 2,000 rpm using a homogenizer for 10 minutes. The emulsified material thus obtained was added to 25 g of distilled water, stirred at room temperature for 30 minutes, and then stirred at 40° C. for 3 hours. The microcapsule solution thus obtained was diluted with distilled water in such an amount that the solid concentration thereof reached 20% by weight. All these samples exhibited an average particle diameter of 0.3 μm.

Infrared Absorbent (1)

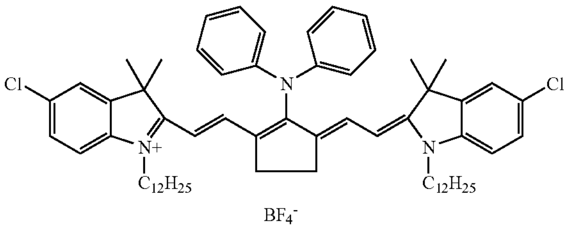

Examples 2 to 5

A lithographic printing plate precursor was obtained in the same manner as in Example 1 except that the phosphonic acid compound example 7 was replaced by the phosphonic acid compound examples 3 and 6, the phosphonic acid amide compound example 15 and the phosphonic acid compound example 33, respectively.

Example 6

An image-forming layer coating solution (2) having the following formulation was spread over the support prepared in Example 1 using a bar coater, and then dried at 100° C. in an oven for 60 seconds to form an image-forming layer thereon in a dried spread of 1.0 g/m$^2$. Thus, a lithographic printing plate precursor was obtained.

| Image-forming layer coating solution (2) | |
| --- | --- |
| Water | 100 g |
| Infrared absorbent (2) having the following formula | 0.05 g |
| Polymerization initiator (1) having the following general formula | 0.2 g |
| Binder polymer (1) having the following formula (average molecular weight: 80,000) | 0.5 g |
| Phosphonic acid compound example (7) | 0.05 g |
| Isocyanuric acid ethylene oxide-modified triacrylate (polymerizable compound; NK ester M-315, produced by Shin-nakamura Chemical Corporation) | 1.0 g |
| Fluorine-based surface active agent (1) described above | 0.1 g |
| Methyl ethyl ketone | 18.0 g |

Infrared absorbent (2)

-continued

| Image-forming layer coating solution (2) |
|---|

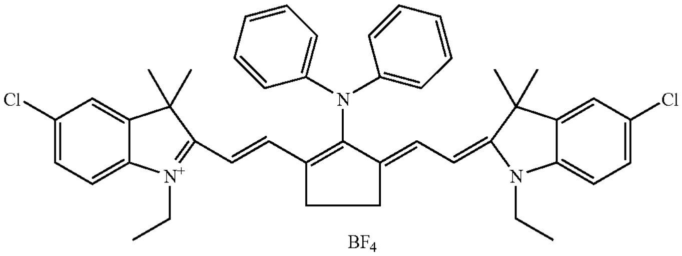

Polymerization initiator (1)

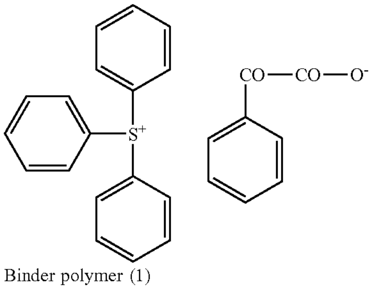

Binder polymer (1)

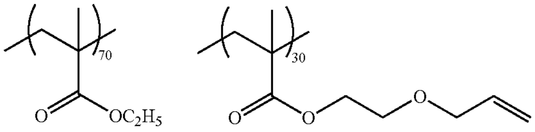

Examples 7 to 10

A lithographic printing plate precursor was obtained in the same manner as in Example 6 except that the phosphonic acid compound example 7 was replaced by the phosphonic acid compound examples 4 and 8, the phosphonic acid amide compound example 14 and the phosphonic acid compound example 33, respectively.

Example 11

A subbing layer coating solution (1) having the following formulation was spread over the support prepared in Example 1 using a bar coater that supplies the coating solution at a rate of 7.5 ml/$^2$, and then dried at 80° C. in an oven for 10 seconds.

| Subbing layer coating solution (1) | |
|---|---|
| Water | 15 g |
| Methanol | 135 g |
| Phosphonic acid compound example (7) | 0.72 g |

A lithographic printing plate precursor was obtained in the same manner as in Example 1 except that an image-forming layer coating solution (3) having the same formulation as the image-forming layer coating solution (1) except that it was free of the phosphonic acid compound example 7 was used.

Examples 12 to 15

The procedure of Example 11 was followed except that the phosphonic acid compound example 7 was replaced by the phosphonic acid compound examples 1, 4, 9 and 33, respectively.

Examples 16 to 19

A lithographic printing plate precursor was obtained in the same manner as in Example 11 except that the phosphonic acid compound example 7 of Example 11 was replaced by the compound examples 4 and 6, the phosphoric acid amide compound example 15 and the phosphonic acid compound example 33, respectively,

Comparative Example 1

A lithographic printing plate precursor was obtained in the same manner as in Example 1 except that an image-forming layer coating solution (3) having the same formulation as in Example 1 except that it was free of the phosphonic acid compound example 7 was used.

Comparative Example 2

A lithographic printing plate precursor was obtained in the same manner as in Example 6 except that an image-forming layer coating solution (4) having the same formulation as in Example 6 except that it was free of the phosphonic acid compound example 7 was used.

5. Evaluation of Lithographic Printing Plate Precursor

The lithographic printing plate precursors thus obtained were each subjected to exposure using Luxel T9000CTP comprising an infrared semiconductor laser mounted thereon (produced by Fuji Photo Film Co., Ltd.). The exposed lithographic printing plate precursors thus obtained were each then mounted on the cylinder of a Type SOR-M printing machine (produced by Heidelberg Inc.) without being subjected to development. For printing, a Type IF102 fountain solution (etching solution produced by Fuji Photo Film Co., Ltd.)/water=4/96 (by volume) and a varius (N) black ink (produced by DAINIPPON INK AND CHEMICALS, INCORPORATED) were used. After the supply of the fountain solution, printing was effected at a rate of 6,000 sheets per hour, (1) Sensitivity During the exposure, the rotary speed of the external drum was varied to vary the energy on the surface of the plate. After printing, the sensitivity was evaluated by the lowest exposure at which an image can be formed. The results are set forth in Table 1.

(2) Removability (On-the-Machine Developability)

The removability (on-the-machine developability) was evaluated by the number of sheets of paper required until the removal of the unexposed area of the image-forming layer on the printing machine was completed, causing the ink to be no longer transferred to the printing paper after the starting of printing. The results are set forth in Table 1.

(3) Press Life

Printing was continued after the completion of development on the printing machine. As the printed number of sheets of paper increased, the image-forming layer was gradually worn away and became less ink-receptive, causing the drop of ink density on the printing paper. The press life was evaluated by the printed number of sheets of paper required until the ink density (reflection density) was 0.1 lower than that at the starting of printing. The results are set forth in Table 1.

(4) Stain Resistance

After the evaluation of removability (2), the samples were each then allowed to stand for 1 hour. Printing was again effected. The stain resistance was then evaluated by the printed number of sheets of paper required until a normal printed matter having an ink attached to the area corresponding to the exposed area and no ink attached to the area corresponding to the unexposed area was obtained. The results are set forth in Table 1.

As can be seen in Table 1, the inventive lithographic printing plate precursors (Examples 1 to 19) are excellent in removability (on-the-machine developability) and press life. The inventive lithographic printing plate precursors are excellent also in sensitivity, stain resistance and chemical resistance.

On the contrary, the lithographic printing plate precursors of Comparative Examples 1 and 2 are inferior to the inventive lithographic printing plate precursors in all the properties such as sensitivity and press life.

TABLE 1

| Lithographic printing | Sensitivity (lowest) | Removability | Press life | Stain resistance |
|---|---|---|---|---|
| Example 1 | 70 mJ/cm$^2$ | 35 sheets | 60,000 sheets | 35 sheets |
| Example 2 | 70 mJ/cm$^2$ | 40 sheets | 55,000 sheets | 40 sheets |
| Example 3 | 70 mJ/cm$^2$ | 40 sheets | 55,000 sheets | 35 sheets |
| Example 4 | 70 mJ/cm$^2$ | 35 sheets | 60,000 sheets | 40 sheets |
| Example 5 | 70 mJ/cm$^2$ | 40 sheets | 50,000 sheets | 35 sheets |
| Example 6 | 60 mJ/cm$^2$ | 45 sheets | 55,000 sheets | 40 sheets |
| Example 7 | 60 mJ/cm$^2$ | 40 sheets | 60,000 sheets | 35 sheets |
| Example 8 | 70 mJ/cm$^2$ | 45 sheets | 55,000 sheets | 35 sheets |
| Example 9 | 70 mJ/cm$^2$ | 35 sheets | 70,000 sheets | 35 sheets |
| Example 10 | 60 mJ/cm$^2$ | 30 sheets | 65,000 sheets | 40 sheets |
| Example 11 | 60 mJ/cm$^2$ | 25 sheets | 55,000 sheets | 25 sheets |
| Example 12 | 60 mJ/cm$^2$ | 30 sheets | 50,000 sheets | 25 sheets |
| Example 13 | 70 mJ/cm$^2$ | 25 sheets | 55,000 sheets | 25 sheets |
| Example 14 | 60 mJ/cm$^2$ | 30 sheets | 65,000 sheets | 25 sheets |
| Example 15 | 70 mJ/cm$^2$ | 30 sheets | 60,000 sheets | 30 sheets |
| Example 16 | 70 mJ/cm$^2$ | 40 sheets | 50,000 sheets | 30 sheets |
| Example 17 | 80 mJ/cm$^2$ | 35 sheets | 45,000 sheets | 25 sheets |
| Example 18 | 70 mJ/cm$^2$ | 30 sheets | 50,000 sheets | 35 sheets |
| Example 19 | 70 mJ/cm$^2$ | 40 sheets | 45,000 sheets | 40 sheets |
| Comparative Exam. 1 | 200 mJ/cm$^2$ | 50 sheets | 5,000 sheets | 50 sheets |
| Comparative Exam. 2 | 200 mJ/cm$^2$ | 50 sheets | 6,000 sheets | 50 sheets |

Example 20

A methanol solution of the phosphonic acid compound 7 was spread over the support prepared in Example 1, and then dried at 70° C. in an oven for 30 seconds to form a subbing layer thereon in a dried spread of 10 mg/m$^2$.

Subsequently, an image-forming layer coating solution (5) having the following formulation was spread over the subbing layer using a bar coater, and then dried at 70° C. in an oven for 60 seconds to form an image-forming layer in a dried spread of 0.8 g/m$^2$. Thus, a lithographic printing plate precursor was obtained.

| Image-forming layer coating solution (5) | |
|---|---|
| Water | 40 g |
| Propylene glycol monomethyl ether | 50 g |
| Methyl ethyl ketone | 10 g |
| Infrared absorbent (3) having the following formula | 0.15 g |
| Binder polymer (2) having the following formula (average molecular weight: 80,000) | 0.5 g |
| Microcapsule (2) having the following formula (as calculated in terms of solid content) | 5 g |

-continued

| Image-forming layer coating solution (5) | |
|---|---|
| polimalization initiator (1) described above | 0.5 g |
| Fluorine-based surface active agent (1) described above | 0.1 g |

Infrared absorbent (3)

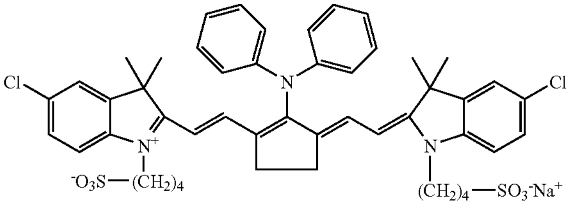

Oleophilic binder polymer (2)

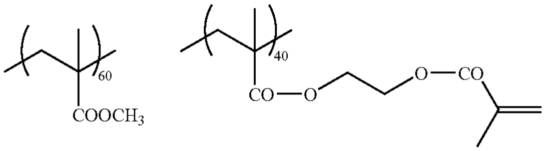

(Synthesis of Microcapsule (2))

In order to prepare an oil phase component, 10 g of an adduct of trimethylolpropane and xylylene diisocyanate (Takenate D-110N, produced by MITSUI TAKEDA CHEMICALS, INC.), 3.5 g of pentaerythritol triacrylate (SR444, produced by NIPPON KAYAKU CO., LTD.), 1 g of 3-(N,N-diethylamino)-6-methyl-7-anilinofluorane (ODB, produced by YAMAMOTO KASEI), 0.1 g of Pionin A-41C (produced by Takemoto oil & Fat., sodium dodecybenzen-sulfonate) were dissolved in 17 g of ethyl acetate. As an aqueous phase component, 40 g of a 4 wt-% aqueous solution of PVA-205 was prepared. The oil phase component and the aqueous phase component were mixed, and then subjected to emulsification at 12,000 rpm using a homogenizer for 10 minutes. The emulsified material thus obtained was added to 25 g of distilled water, stirred at room temperature for 30 minutes, and then stirred at 40° C. for 3 hours. The microcapsule solution thus obtained was diluted with distilled water in such an amount that the solid concentration thereof reached 20% by weight. All these samples exhibited an average particle diameter of 0.3 μm.

The lithographic printing plate precursor thus obtained was then evaluated in the same manner as in Example 1. As a result, the sensitivity (lowest allowable exposure) was 70 mJ/cm$^2$, the removability was 30 sheets, the line image reproducibility was 16, the press life was 60,000 sheets, and the stain resistance was 35 sheets.

Example 21

An image-forming layer coating solution (6) having the following formulation was spread over the support prepared in Example 1 using a bar coater, and then dried at 70° C. in an oven for 60 seconds to form an image-forming layer thereon in a dried spread of 0.8 g/m$^2$. Thus, a lithographic printing plate precursor was obtained.

| Image-forming layer coating solution (6) | |
|---|---|
| Water | 40 g |
| Propylene glycol monomethyl ether | 50 g |
| Methyl ethyl ketone | 10 g |
| Phosphonic acid compound example 7 | 0.2 g |
| Infrared absorbent (3) described above | 0.15 g |
| Binder polymer (2) described above (average molecular weight: 80,000) | 0.5 g |
| Microcapsule (2) described above (as calculated in terms of solid content) | 5 g |
| Polymerization initiator (1) | 0.5 g |
| Fluorine-based surface active agent (1) described above | 0.1 g |

The lithographic printing plate precursor thus obtained was then evaluated in the same manner as in Example 1. As a result, the sensitivity (lowest allowable exposure) was 70 mJ/cm$^2$, the removability was 25 sheets, the press life was 65,000 sheets, and the stain resistance was 40 sheets.

Example 22

The procedure of Example 1 was followed except that the phosphonic acid compound example (7) to be incorporated in the image-forming layer coating solution (1) was replaced by the compound example (3) of the formula (III).

Examples 23 to 26

The procedure of Example 1 was followed except that the phosphonic acid compound example (7) to be incorporated in the image-forming layer coating solution (1) was replaced by the compound examples (4), (8), (16) and (19) of the formula (III), respectively.

Example 27

The procedure of Example 6 was followed except that the phosphonic acid compound example (7) to be incorporated in the image-forming layer coating solution (2) was replaced by the compound example (3) of the formula (III).

Examples 28 to 31

The procedure of Example 6 was followed except that the phosphonic acid compound example (7) to be incorporated in the image-forming layer coating solution (2) was replaced by the compound examples (2), (7), (10) and (20) of the formula (III), respectively.

Example 32

The procedure of Example 11 was followed except that the phosphonic acid compound example (7) to be incorporated in the subbing layer coating solution (1) was replaced by the compound example (3) of the formula (III).

Examples 33 to 36

The procedure of Example 11 was followed except that the phosphonic acid compound example (7) to be incorporated in the subbing layer coating solution (1) was replaced by the compound examples (6), (7), (15) and (17) of the formula (III), respectively.

Example 37

The procedure of Example 11 was followed except that the phosphonic acid compound example (7) to be incorporated in the subbing layer coating solution (1) was replaced by the compound example (3) of the formula (III).

Examples 38 to 41

The procedure of Example 11 was followed except that the phosphonic acid compound example (7) to be incorporated in the subbing layer coating solution (1) was replaced by the compound examples (2), (8), (16) and (20) of the formula (III), respectively.

The lithographic printing plate precursors thus prepared were each then evaluated in the same manner as mentioned above. The results are set forth in Table 2.

As can be seen in Table 2, the inventive lithographic printing plate precursors (Examples 22 to 41) are excellent in removability (on-the-machine developability) and press life. The inventive lithographic printing plate precursors are excellent also in sensitivity, stain resistance and chemical resistance.

TABLE 2

| Lithographic printing | Sensitivity (lowest) | Removability | Press life | Stain resistance |
|---|---|---|---|---|
| Example 22 | 60 mJ/cm$^2$ | 30 sheets | 55,000 sheets | 25 sheets |
| Example 23 | 70 mJ/cm$^2$ | 30 sheets | 50,000 sheets | 40 sheets |
| Example 24 | 70 mJ/cm$^2$ | 30 sheets | 60,000 sheets | 25 sheets |
| Example 25 | 70 mJ/cm$^2$ | 40 sheets | 60,000 sheets | 30 sheets |
| Example 26 | 70 mJ/cm$^2$ | 40 sheets | 55,000 sheets | 35 sheets |
| Example 27 | 60 mJ/cm$^2$ | 40 sheets | 45,000 sheets | 30 sheets |
| Example 28 | 60 mJ/cm$^2$ | 35 sheets | 50,000 sheets | 35 sheets |
| Example 29 | 60 mJ/cm$^2$ | 40 sheets | 45,000 sheets | 35 sheets |
| Example 30 | 70 mJ/cm$^2$ | 35 sheets | 65,000 sheets | 35 sheets |
| Example 31 | 60 mJ/cm$^2$ | 35 sheets | 60,000 sheets | 35 sheets |
| Example 32 | 60 mJ/cm$^2$ | 30 sheets | 60,000 sheets | 25 sheets |
| Example 33 | 60 mJ/cm$^2$ | 35 sheets | 55,000 sheets | 40 sheets |
| Example 34 | 70 mJ/cm$^2$ | 30 sheets | 50,000 sheets | 35 sheets |
| Example 35 | 60 mJ/cm$^2$ | 30 sheets | 55,000 sheets | 40 sheets |
| Example 36 | 70 mJ/cm$^2$ | 35 sheets | 50,000 sheets | 35 sheets |

TABLE 2-continued

| Lithographic printing | Sensitivity (lowest) | Removability | Press life | Stain resistance |
|---|---|---|---|---|
| Example 37 | 60 mJ/cm$^2$ | 30 sheets | 50,000 sheets | 25 sheets |
| Example 38 | 70 mJ/cm$^2$ | 30 sheets | 55,000 sheets | 35 sheets |
| Example 39 | 80 mJ/cm$^2$ | 30 sheets | 55,000 sheets | 25 sheets |
| Example 40 | 70 mJ/cm$^2$ | 35 sheets | 55,000 sheets | 30 sheets |
| Example 41 | 70 mJ/cm$^2$ | 35 sheets | 50,000 sheets | 30 sheets |

Example 42

The procedure of Example 20 was followed except that the methanol solution of the phosphonic acid compound example (7) was replaced by a methanol solution of the compound example (3) of the formula (III).

The lithographic printing plate precursor thus obtained was then evaluated in the same manner as in Example 20. As a result, the sensitivity (lowest allowable exposure) was 70 mJ/cm$^2$, the removability was 30 sheets, the fine line reproducibility was 16, the press life was 60,000 sheets, and the stain resistance was 35 sheets.

Example 43

The procedure of Example 21 was followed except that the methanol solution of the phosphonic acid compound example (7) in the image-forming layer coating solution (6) was replaced by a methanol solution of the compound example (3) of the formula (III).

The lithographic printing plate precursor thus obtained was then evaluated in the same manner as in Example 21. As a result, the sensitivity (lowest allowable exposure) was 70 mJ/cm$^2$, the removability was 25 sheets, the press life was 65,000 sheets, and the stain resistance was 40 sheets.

Example 44

Preparation of Support

A molten aluminum alloy according to JIS A1050 comprising 99.5% by weight or more of Al, 0.30% by weight of Fe, 0.10% by weight of Si, 0.02% by weight of Ti and 0.013% by weight of Cu was subjected to purification and casting. The purification involved degassing for the removal of unnecessary gases from the molten metal and ceramic tube filtration. Casting was carried out by DC casting method. The ingot aluminum having a thickness of 500 nm thus obtained by solidification was planed to a depth of 10 mm from the surface thereof. The sheet thus obtained was then subjected to homogenization at 550° C. for 10 hours in such a manner that the intermetallic compound didn't become coarse. Subsequently, the sheet was hot-rolled at 400° C., intermediately annealed at 500° C. in a continuous annealing furnace for 60 seconds, and then cold-rolled to obtain a rolled aluminum sheet having a thickness of 0.30 mm. By controlling the surface roughness of the pressure roll, the central line-average surface roughness $R_a$ of the cold-rolled sheet was controlled to 0.2 μm. The rolled aluminum sheet was then subjected to tension leveling to enhance its flatness.

Subsequently, the aluminum sheet was subjected to surface treatment to form a support for lithographic printing plate.

Firstly, the aluminum sheet was subjected to degreasing with a 10 wt-% aqueous solution of sodium aluminate at 50°

C. for 30 seconds to remove a rolling oil from the surface thereof. The aluminum sheet thus degreased was then subjected to neutralization and desmutting with a 30 wt-% aqueous solution of nitric acid at 50° C. for 30 seconds.

Subsequently, the aluminum sheet was subjected to surface roughening, i.e., so-called graining to enhance the adhesion between the support and the image-forming layer and render the non-image area water-retaining. An anodization electricity of 240 C./$dm^2$ was then given to the aluminum web through an indirect electricity-feeding cell at a current density of 20 A/$dm^2$ in an alternating form having a duty ratio of 1:1 while the aluminum web was being passed through an aqueous solution containing 1 wt-% nitric acid and 0.5 wt-% aluminum nitrate which had been kept at 45° C. In this manner, the aluminum sheet was electrolytically grained. The aluminum sheet thus grained was subjected to etching with a 10 wt-% aqueous solution of sodium hydroxide at 35° C. for 30 seconds, and then subjected to neutralization and desmutting with a 30 wt-% aqueous solution of sulfuric acid at 50° C.

In order to enhance the abrasion resistance, chemical resistance and water retention of the aluminum support, the aluminum sheet was then subjected to anodization to form an oxide layer thereon. The aluminum web was subjected to electrolysis with an electric current having a density of 14 A/$dm^2$ supplied from an indirect electricity-feeding cell while being passed through a 20 wt-% aqueous solution of sulfuric acid as an electrolyte at 35° C. Thus, an anodized layer was produced in an amount of 2.5 g/$m^2$.

Thereafter, the aluminum support was subjected to silicate treatment to provide the non-image area of the printing plate with hydrophilicity. In some detail, the aluminum web was passed through a 1.5 wt-% aqueous solution of No. 3 sodium silicate which had been kept at 70° C. in such a manner that it was brought into contact with the electrolyte for 15 seconds, and then washed with water. The attached amount of Si was 10 mg/$m^2$. The support thus prepared had a central line-average surface roughness Ra of 0.25 μm.

(Preparation of Lithographic Printing Plate Precursor)

An image-forming layer coating solution (7) having the following formulation was spread over the aforementioned support using a bar coater, and then dried at 70° C. in an oven for 60 seconds to form an image-forming layer in a dried spread of 0.8 g/$m^2$. Thus, a lithographic printing plate precursor (1) was obtained.

Image-forming Layer Coating Solution (7)

| | |
|---|---|
| Water | 100 g |
| Microcapsule (3) having the following formula (as calculated in terms of solid content) | 5 g |
| Polymerization initiator (compound example OS-7 exemplified herein) | 0.5 g |
| Fluorine-based surface active agent (1) mentioned above | 0.2 g |

(Synthesis of Microcapsule (3))

In order to prepare an oil phase component, 10 g of an adduct of trimethylolpropane and xylylene diisocyanate (Takenate D-110N, produced by MITSUI TAKEDA CHEMICALS, INC.), 3.15 g of the following polymerizable compound (specific functional group-containing compound exemplified herein) 0.35 g of the aforementioned infrared absorbent (1), 1 g of 3-(N,N-diethylamino)-6-methyl-7-anilinofluorane (ODB, produced by YAMAMOTO KASEI), 0.1 g of Pionin A-41C (produced by Takemoto oil & Fat.) were dissolved in 17 g of ethyl acetate. As an aqueous phase component, 40 g of a 4 wt-% aqueous solution of PVA-205 was prepared. The oil phase component and the aqueous phase component were mixed, and then subjected to emulsification at 12,000 rpm using a homogenizer for 10 minutes. The emulsified material thus obtained was added to 25 g of distilled water, stirred at room temperature for 30 minutes, and then stirred at 40° C. for 3 hours. The microcapsule solution (3) thus obtained was diluted with distilled water in such an amount that the solid concentration thereof reached 20% by weight. All these samples exhibited an average particle diameter of 0.3 μm.

(Exposure and Printing Evaluation of Lithographic Printing Plate Precursor)

The lithographic printing plate precursors thus obtained were each subjected to exposure at an output of 17 W, an external drum rotary speed of 133 rpm and a resolution of 2,400 dpi using a Type 3244 VX Trendsetter comprising a water-cooled 40 W infrared semiconductor laser mounted thereon (produced by Creo Inc.). The exposure image contained a fine line chart. The lithographic printing plate precursors thus exposed were each then mounted on the cylinder of a Type SOR-M printing machine (produced by Heidelberg Inc.) without being developed. A fountain solution (EU-3 (etching solution produced by Fuji Photo Film Co., Ltd.)/water/isopropyl alcohol=1/89/10 (by volume)) and TRANS-G (N) black ink (produced by DAINIPPON INK AND CHEMICALS, INCORPORATED) were used. With the fountain solution and the ink supplied, printing was made on 100 sheets of paper at a rate of 6,000 sheets per hour.

The lithographic printing plate precursors were each evaluated for on-the-machine developability, fine line reproducibility and press life in the following manner. The results are set forth in Table 3.

(1) On-the-Machine Developability

The on-the-machine developability was evaluated by the number of sheets of printing paper (on-the-machine developable number of sheets) required until the development of the unexposed area on the image-forming layer on the printing machine was completed, causing the ink to be no longer transferred to the printing paper as observed on 100 sheets of printed matter obtained as mentioned above.

(2) Fine Line Reproducibility

After confirming that printed matters having no ink stain on the non-image area of 100 sheets, printing on 500 sheets followed. A fine chart (chart of fine lines having a width of 10 μm, 12 μm, 14 μm, 16 μm, 18 μm, 20 μm, 25 μm, 30 μm, 35 μm, 40 μm, 60 μm, 80 μm, 100 μm and 200 μm) on the 600th sheet of printed matter was observed under a 25× magnifier. The fine line reproducibility was then evaluated by the width of the finest line which had been reproduced without cut.

(3) Press Life

After printing for the evaluation of fine line reproducibility, printing further followed. As the printed number of sheets of paper increased, the image-forming layer was gradually worn away and became less ink-receptive, causing the drop of ink density on the printing paper. The press life was evaluated by the printed number of sheets of paper required until the ink density (reflection density) was 0.1 lower than that at the starting of printing.

Examples 45 to 48

Microcapsules (4) to (7) were synthesized and image-forming layer coating solutions (8) to (11) were prepared therefrom in the same manner as in Example 44 except that the specific functional group-containing compound (4) to be incorporated in the microcapsule (3) of Example 44 was replaced by the specific functional group-containing compounds set forth in Table 3. Thus, lithographic printing plate precursors (2) to (5) were obtained.

The lithographic printing plate precursors (2) to (5) were each then evaluated in the same manner as in Example 45. The results are set forth in Table 3.

Comparative Example 3

A microcapsule (3') was synthesized and an image-forming layer coating solution (3') was prepared therefrom in the same manner as in Example 45 except that the specific functional group-containing compound (4) to be incorporated in the microcapsule (3) of Example 44 was replaced by pentaerythritol triacrylate (SR444, produced by NIPPON KAYAKU CO., LTD.). Thus, a lithographic printing plate precursor (3') was obtained.

The lithographic printing plate precursor (3') was evaluated in the same manner as in Example 44. The results are set forth in Table 3.

TABLE 3

| | Specific functional group-containing compound | On-the-machine devel-opable number of sheets | Fine line repro-duc-ibility (μm) | Press life (number of sheets) |
|---|---|---|---|---|
| Example 44 | Specific functional group-containing compound (4) | 20 | 18 | 5,000 |
| Example 45 | Specific functional group-containing compound (3) | 20 | 18 | 4,000 |
| Example 46 | Specific functional group-containing compound (10) | 25 | 16 | 6,000 |
| Example 47 | Specific functional group-containing compound (13) | 20 | 18 | 5,000 |
| Example 48 | Specific functional group-containing compound (16) | 25 | 16 | 6,000 |
| Comparative Example 3 | Pentaerythritol triacrylate | 20 | 20 | 3,000 |

As can be seen in Table 3, Examples 44 to 48, which follow the lithographic printing method of the invention using the lithographic printing plate precursor of the invention, were extremely excellent in fine line reproducibility and press life and thus exhibited an on-the-machine developability kept at an excellent level as compared with Comparative Example 3, which didn't use any specific functional group-containing compound.

Example 49

An image-forming layer coating solution (12) having the following formulation was spread over the aforementioned support using a bar coater, and then dried at 100° C. in an oven for 60 seconds to form an image-forming layer in a dried spread of 1.0 g/m$^2$. Thus, a lithographic printing plate precursor (6) was obtained.

Image-Forming Layer Coating Solution (12)

| | |
|---|---|
| Infrared absorbent (2) as mentioned above | 0.05 g |
| Polymerization initiator (Compound example OS-7 exemplified herein) | 0.2 g |
| Binder polymer (1) as mentioned above (average molecular weight: 80,000) | 0.5 g |
| Specific functional group-containing compound (4) as mentioned above | 1.0 g |
| Naphthalenesulfonate of Victoria Pure Blue | 0.02 g |
| Fluorine-based surface active agent (1) as mentioned above | 0.1 g |
| Methyl ethyl ketone | 18.0 g |

The lithographic printing plate precursor (6) thus obtained was then evaluated for on-the-machine developability, fine line reproducibility and press life in the same manner as in Example 1 except that the output and the external drum rotary speed of Type 3244VX Trendsetter (produced by Creo Inc.) used in Example 44 were changed to 9 W and 210 rpm, respectively. The results are set forth in Table 4.

Examples 50 to 53

Image-forming layer coating solutions (13) to (16) were prepared and lithographic printing plate precursors (7) to (10) were then obtained therefrom in the same manner as in Example 49 except that the specific functional group-containing compound (4) of Example 49 was replaced by the polymerizable compounds set forth in Table 4, respectively.

The lithographic printing plate precursors (7) to (10) were each then evaluated in the same manner as in Example 49. The results are set forth in Table 4.

Comparative Example 4

An image-forming layer coating solution (3") was prepared and a lithographic printing plate precursor (3") was then obtained therefrom in the same manner as in Example 6 except that the specific functional group-containing compound (4) of Example 49 was replaced by isocyanuric acid EO-modified triacrylate (NK ester M-315, produced by Shin-nakamura Chemical Corporation).

The lithographic printing plate precursor (3") was then evaluated in the same manner as in Example 49. The results are set forth in Table 4.

TABLE 4

| | Specific functional group-containing compound | On-the-machine devel-opable number of sheets | Fine line repro-duc-ibility (μm) | Press life (number of sheets) |
|---|---|---|---|---|
| Example 49 | Specific functional group-containing compound (4) | 40 | 25 | 8,000 |
| Example 50 | Specific functional group-containing compound (5) | 40 | 25 | 6,000 |

TABLE 4-continued

| | Specific functional group-containing compound | On-the-machine devel-opable number of sheets | Fine line repro-duc-ibility (μm) | Press life (number of sheets) |
|---|---|---|---|---|
| Example 51 | Specific functional group-containing compound (11) | 50 | 20 | 9,000 |
| Example 52 | Specific functional group-containing compound (13) | 40 | 25 | 8,000 |
| Example 53 | Specific functional group-containing compound (16) | 50 | 20 | 9,000 |
| Comparative Example 4 | Isocyanuric acid EO-modified triacrylate | 40 | 30 | 4,000 |

As can be seen in Table 4, Examples 49 to 53, which follow the lithographic printing method of the invention using the lithographic printing plate precursor of the invention, were extremely excellent in fine line reproducibility and press life and thus exhibited an on-the-machine developability kept at an excellent level as compared with Comparative Example 4, which didn't use any specific functional group-containing compound.

A negative-working lithographic printing plate precursor as in the invention normally hardens less in the image-forming layer when exposed less but hardens more in the image-forming layer when exposed more. When the image-forming layer hardens too little, the resulting lithographic printing plate exhibits a reduced press life and a poor small dot and fine line reproducibility. On the contrary, when the image-forming layer hardens sufficiently, the resulting lithographic printing plate exhibits a prolonged press life and a good small dot and fine line reproducibility.

It can thus be said that the greater the printable number of sheets in the evaluation of press life is, or the smaller the width of fine line in the evaluation of fine line reproducibility is, the higher is the sensitivity of the lithographic printing plate precursor when the lithographic printing plate precursor thus obtained is evaluated for press life and fine line reproducibility under the same exposure conditions as mentioned above.

Examples 54 to 58

After the coating mixture for the image-forming layer (13) of the following composition was coated by means of a coating bar on the support used in Example 1, the coated product was dried in an oven at 100° C. for 60 sec to provide an image-recording layer with a coated amount of 1.0 $g/m^2$ on dry base. On the dried coating, the coating mixture for a protective layer (1) of the following composition was coated so as to give a coated amount of 0.5 $g/m^2$ on dry base, followed by drying at 120° C. for 1 min to provide a lithographic printing plate precursor.

Coating Mixture for Image-Forming Layer (13)

| | |
|---|---|
| Polymerization initiator shown below (2) | 0.2 g |
| The aforementioned binder polymer (1) | 3.0 g |
| Example of the phosphonic acid compound set forth in Table 5 | 6.2 g |
| Leuco Crystal Violet | 3.0 g |
| Thermal polymerization initiator, N-nitrosophenylhydroxylamine aluminum salt | 0.1 g |
| Fluorine-containing surfactant (1) | 0.1 g |
| The aforementioned microcapsule (1) (based on solid content) | 10.0 g |
| Methyl ethyl ketone | 35.0 g |
| 1-Methoxy-2-propanol | 35.0 g |
| Water | 10.0 g |

Polymerization initiator (2)

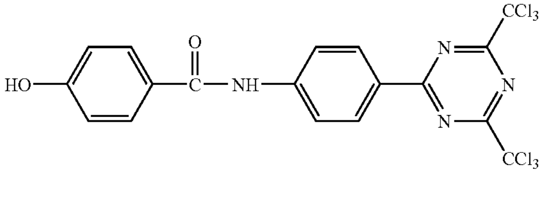

Exposing Method

The lithographic printing plate precursor was exposed with use of a 375 nm semiconductor laser with an output power of 2 mW placed on the external drum with a peripheral length of 900 mm rotating at 800 rpm and with a resolution of 2400 dpi. The writing time for one pixel is shown in Table 5.

Printing Method

The lithographic printing plate precursor after exposure thus prepared was mounted on the cylinder of a press machine, SOR-M manufactured by Heidelberg without development processing, fed with a dampening water (EU-3 (an etching solution made by Fuji Photo Film)/water/isopropyl alcohol=1/89/10 (volume ratio) and a black ink, TRANS-G (N) (a product of Dainippon Ink and Chemicals, Inc.), and thereafter subjected to printing for 100 runs at a printing speed of 6000 sheets per hr. Removal of the unexposed areas of the image-recording layer completed on the press machine, and printed matters without ink smudge in non-image areas were obtained.

Evaluation of the Lithographic Printing Plate Precursor

Relating to the lithographic printing plate precursor thus obtained, the lithographic printing plate precursors were each evaluated for on-the-machine developability, fine line reproducibility and press life in the same manner of Example 44, and further evaluated for sensitivity and Safety to white light. The results are set forth in Table 5.

<Sensitivity>

After the confirmation of printed matters without ink smudge in non-image areas having been obtained in first 100 runs, additional printing was conducted to give 500 prints. By inspecting the 600 prints in total, the exposure amount required to give an image area free of density unevenness was measured as sensitivity.

<Safety to White Light>

An unexposed lithographic printing plate precursor was placed under a white fluorescent lamp in such a manner that the light intensity at the surface of the plate precursor be 400 lux, and subjected to blank exposure. The lithographic printing plate precursor subjected to the blank exposure was mounted on the cylinder of the press machine SOR-M manufactured by Heidelberg, after development processing for those which needed such processing. After printing operation was carried out for 100 runs, the time of blank exposure to the white fluorescent lamp with which no ink smudge occurred was measured. The longer this time is, the better is the safety to white light.

TABLE 5

| | Example of phosphonic acid or phosphorylamide compound | Light source | Pixel dwelling time | Sensitivity ($mJ/cm^2$) | Thin line reproducibility (μm) | On-press develop ability (number of print) | Printing durability (number of print) | Safety to white light (min) |
|---|---|---|---|---|---|---|---|---|
| Example 54 | 7 | 375 nm semi- | 0.9 μsec | 0.05 | 10 | 20 | 50000 | 240 |
| Example 55 | 4 | conductor laser | 0.9 μsec | 0.07 | 10 | 30 | 56000 | 180 |
| Example 56 | 8 | | 100 μsec | 0.07 | 10 | 25 | 53000 | 180 |
| Example 57 | 14 | | 100 μsec | 0.15 | 12 | 30 | 50000 | 180 |
| Example 58 | 33 | | 1 msec | 0.15 | 14 | 30 | 65000 | 180 |

The present invention is not limited to the specific above-described embodiments. It is contemplated that numerous modifications may be made to the present invention without departing from the spirit and scope of the invention as defined in the following claims.

This application is based on Japanese Patent application JP2003-277448 filed Jul. 22, 2003, JP2004-000652 filed Jan. 5, 2004 and JP 2004-017599 filed Jan. 26, 2004, the entire content of which is hereby incorporated by reference.

What is claimed is:

1. A lithographic printing plate precursor comprising an image-forming layer containing a polymerization initiator and a polymerizable compound, and a hydrophilic support, wherein the lithographic printing plate precursor comprises a compound containing at least one functional group having an interaction with a surface of the hydrophilic support, and wherein the compound containing the at least one functional group having an interaction with the surface of the hydrophilic support is one of a phosphonic acid represented by the following formula (I) and a phosphoric acid amide represented by the following formula (II):

(I)

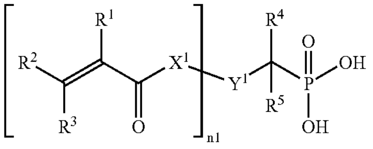

(II)

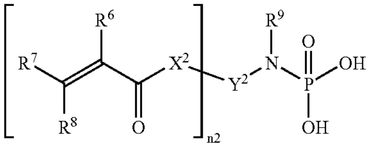

wherein $R^1$, $R^2$, $R^3$, $R^4$, $R^5$, $R^6$, $R^7$, $R^8$ and $R^9$ each independently represents a hydrogen atom, a halogen atom or an alkyl group; $X^1$ and $X^2$ each independently represents an oxygen atom, a sulfur atom or an imino; $Y^1$ represents a connecting group having a valence of (n1+1); $Y^2$ represents a connecting group having a valence of (n2+1); and n1 and n2 each independently represents a number of 1, 2 or 3.

2. The lithographic printing plate precursor according to claim 1, wherein the lithographic printing plate precursor further comprises a subbing layer between the image-forming layer and the hydrophilic support, and the subbing layer comprises the compound containing the at least one functional group having an interaction with the surface of the hydrophilic support.

3. The lithographic printing plate precursor according to claim 1, wherein the image-forming layer further contains an infrared absorbent.

4. The lithographic printing plate precursor according to claim 1, wherein the image-forming layer is capable of being removed with at least one of a printing ink and a fountain solution.

5. The lithographic printing plate precursor according to claim 1, wherein the hydrophilic support is an aluminum support.

6. A printing method which comprises the steps of:

mounting on a printing machine a lithographic printing plate precursor comprising: an image-forming layer containing a polymerization initiator and a polymerizable compound; and a hydrophilic support, the printing plate precursor comprising a compound which contains at least one functional group having an interaction with a surface of the hydrophilic support, and performing an imagewise exposure on the mounted lithographic printing plate precursor with a laser, or performing an imagewise exposure on the lithographic printing plate precursor with a laser, and mounting the exposed lithographic printing plate precursor on the printing machine;

supplying at least one of a printing ink and a fountain solution to the lithographic printing plate precursor;

removing an unexposed area of the image-forming layer with the one of the printing ink and the fountain solution; and printing, wherein the compound containing the at least one functional group having an interaction with the surface of the hydrophilic support is one of a phosphonic acid represented by the following formula (I) and a phosphoric acid amide represented by the following formula (II):

(I)

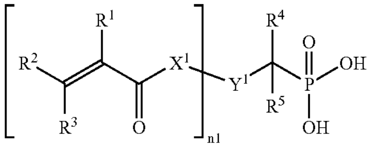

(II)

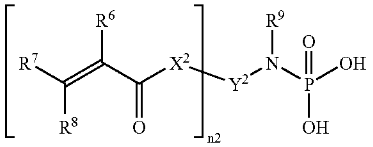

wherein $R^1$, $R^2$, $R^3$, $R^4$, $R^5$, $R^6$, $R^7$, $R^8$ and $R^9$ each independently represents a hydrogen atom, a halogen atom or an alkyl group; $X^1$ and $X^2$ each independently represents an oxygen atom, a sulfur atom or an imino; $Y^1$ represents a connecting group having a valence of (n1+1); $Y^2$ represents a connecting group having a valence of (n2+1); and n1 and n2 each independently represents a number of 1, 2 or 3.

7. The lithographic printing method according to claim 6, wherein the lithographic support further comprises a subbing layer between the image-forming layer and the hydrophilic support, and the subbing layer comprises the compound containing the at least one functional group having an interaction with the surface of the hydrophilic support.

8. A lithographic printing plate precursor comprising an image-forming layer containing a polymerization initiator and a polymerizable compound, and a hydrophilic support, wherein the lithographic printing plate precursor comprises a compound containing at least one functional group having an interaction with a surface of the hydrophilic support, and a subbing layer between the image-forming layer and the hydrophilic support, wherein the subbing layer comprises the compound containing the at least one functional group having an interaction with the surface of the hydrophilic support; and wherein the compound containing the at least one functional group having an interaction with the surface of the hydrophilic support is a compound represented by the following formula (III):

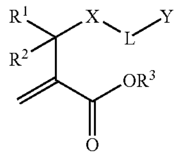

(III)

wherein $R^1$, $R^2$ and $R^3$ each independently represents a hydrogen atom, a halogen atom or an alkyl group; X represents an oxygen atom, a sulfur atom or an imino; L represents a divalent connecting group; and Y represents a support-adsorbing group.

9. A printing method which comprises the steps of:

mounting on a printing machine a lithographic printing plate precursor comprising: an image-forming layer containing a polymerization initiator and a polymerizable compound; and a hydrophilic support, the printing plate precursor comprising a compound which contains at least one functional group having an interaction with a surface of the hydrophilic support, and performing an imagewise exposure on the mounted lithographic printing plate precursor with a laser, or performing an imagewise exposure on the lithographic printing plate precursor with a laser, and mounting the exposed lithographic printing plate precursor on the printing machine;

supplying at least one of a printing ink and a fountain solution to the lithographic printing plate precursor;

removing an unexposed area of the image-forming layer with the one of the printing ink and the fountain solution; and printing, wherein the compound containing the at least one functional group having an interaction with the surface of the hydrophilic support is a compound represented by the following formula (III):

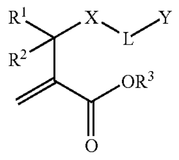

(III)

wherein $R^1$, $R^2$ and $R^3$ each independently represents a hydrogen atom, a halogen atom or an alkyl group; X represents an oxygen atom, a sulfur atom or an imino; L represents a divalent connecting group; and Y represents a support-adsorbing group; and wherein the lithographic printing plate precursor further comprises a subbing layer between the image-forming layer and the hydrophilic support, and the subbing layer comprises the compound containing the at least one functional group having an interaction with the surface of the hydrophilic support.

* * * * *